US012805154B2

(12) United States Patent
Kim et al.

(10) Patent No.: US 12,805,154 B2
(45) Date of Patent: Nov. 17, 2026

(54) ELECTRONIC DEVICE INCLUDING ORGANIC PHOTODIODE AND ORGANIC LIGHT-EMITTING DEVICE

(71) Applicant: Samsung Display Co., Ltd., Yongin-Si (KR)

(72) Inventors: Soungwook Kim, Yongin-si (KR); Seokgyu Yoon, Yongin-si (KR); Jinsoo Jung, Yongin-si (KR); Sanghwan Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 393 days.

(21) Appl. No.: 18/382,552

(22) Filed: Oct. 23, 2023

(65) Prior Publication Data

US 2024/0251637 A1 Jul. 25, 2024

(30) Foreign Application Priority Data

Jan. 16, 2023 (KR) ........................ 10-2023-0006300

(51) Int. Cl.

| | |
|---|---|
| ***H10K 59/80*** | (2023.01) |
| ***H10K 30/82*** | (2023.01) |
| ***H10K 39/34*** | (2026.01) |

(52) U.S. Cl.

CPC ....... *H10K 59/80522* (2023.02); *H10K 30/82* (2023.02); *H10K 39/34* (2023.02); *H10K 59/80524* (2023.02)

(58) Field of Classification Search

CPC .. H10K 39/34; H10K 59/35; H10K 59/80522; H10K 59/80524; H10K 30/82; H10K 59/65; H10K 59/123

See application file for complete search history.

(56) References Cited

U.S. PATENT DOCUMENTS 8,836,839 B2 9/2014 Choo et al.
10,943,954 B2 3/2021 Park et al.
(Continued)

FOREIGN PATENT DOCUMENTS

JP 2021-039342 A 3/2021
KR 10-1774491 B1 9/2017
(Continued)

OTHER PUBLICATIONS

M. Pozov et al., Bottom Contact Metal Oxide Interface Modification Improving the Efficiency of Organic Light Emitting Diodes, Materials, vol. 13, Article 5082, pp. 1-12 (Nov. 11, 2020).

*Primary Examiner* — Changhyun Yi
(74) *Attorney, Agent, or Firm* — Innovation Counsel LLP

(57) ABSTRACT

An electronic device including an organic photodiode and an organic light-emitting device comprising a first subpixel. The device includes a substrate, a first photodiode electrode and a first subpixel electrode on the substrate, a second electrode covering the first subpixel electrode, an emission layer between the first subpixel electrode and the second electrode, a photoactive layer between the first photodiode electrode and the second electrode, a first common layer between the first subpixel electrode and the emission layer and between the first photodiode electrode and the photoactive layer, a second common layer between the emission layer and the second electrode and between the photoactive layer and the second electrode, and a first optical auxiliary electrode between the first photodiode electrode and the first common layer and in the organic photodiode, wherein the first optical auxiliary electrode may include a transparent conductive metal oxide.

20 Claims, 6 Drawing Sheets

(56) References Cited

U.S. PATENT DOCUMENTS

| | | | |
|---|---|---|---|
| 11,121,196 B2 | 9/2021 | Lee et al. | |
| 11,394,014 B2 | 7/2022 | Kubota et al. | |
| 2005/0217722 A1 | 10/2005 | Komatsu et al. | |
| 2022/0037418 A1 | 2/2022 | Han et al. | |
| 2022/0057873 A1 | 2/2022 | Kubota et al. | |
| 2022/0140250 A1 | 5/2022 | Kawano et al. | |
| 2023/0209921 A1* | 6/2023 | Lim | H10K 39/34 257/40 |

FOREIGN PATENT DOCUMENTS

| | | |
|---|---|---|
| KR | 10-2020-0001414 A | 1/2020 |
| KR | 10-2020-0080484 A | 7/2020 |
| KR | 10-2021-0105361 A | 8/2021 |
| KR | 10-2022-0015111 A | 2/2022 |
| KR | 10-2022-0061019 A | 5/2022 |

* cited by examiner

ELECTRONIC DEVICE INCLUDING ORGANIC PHOTODIODE AND ORGANIC LIGHT-EMITTING DEVICE

CROSS-REFERENCE TO RELATED APPLICATION

This application claims priority to and benefit, under 35 U.S.C. § 119, of Korean Patent Application No. 10-2023-0006300 filed on Jan. 16, 2023 in the Korean Intellectual Property Office, the entire content of which is incorporated herein by reference.

BACKGROUND

1. Field

One or more embodiments relate to an electronic device including an organic photodiode and an organic light-emitting device.

2. Description of the Related Art

Organic photodiodes (OPDs) use an organic semiconductor to absorb incident light and convert it into a current. OPDs are advantageous over inorganic photodiodes, such as silicon photodetectors, in terms of ease of processing, cost reduction, application to flexible devices, and mass production, due to the characteristics of organic materials. In addition, by having a high extinction coefficient and being able to selectively absorb light in a specific wavelength according to a molecular structure, organic materials are advantageous in terms of sensitivity improvement, wavelength selectivity, and high integration.

The structures of OPDs are similar to those of organic light-emitting devices (OLEDs). In both devices, a photoactive layer or an emission layer may be included between a hole transport layer and an electron transport layer that are arranged between electrodes. Using such structural similarity, an OPD may be integrated into an OLED and used for fingerprint recognition.

SUMMARY

One or more embodiments include an electronic device including an organic photodiode having improved external quantum efficiency (EQE) and an organic light-emitting device.

Additional aspects will be set forth in part in the description which follows and, in part, will be apparent from the description, or may be learned by practice of the presented embodiments of the disclosure.

in one aspect, the disclosure pertains to an electronic device including, an organic photodiode and an organic light-emitting device, the device including a substrate, a first photodiode electrode on the substrate, a first subpixel electrode on the substrate space apart from the first photodiode electrode, a second electrode covering the first photodiode electrode and the first subpixel electrode, an emission layer between the first subpixel electrode and the second electrode and in the organic light-emitting device, a photoactive layer between the first photodiode electrode and the second electrode and in the organic photodiode, a first common layer between the first subpixel electrode and the emission layer and between the first photodiode electrode and the photoactive layer, a second common layer arranged between the emission layer and the second electrode and between the photoactive layer and the second electrode, and a first optical auxiliary electrode arranged between the first electrode and the first common layer and in the organic photodiode, wherein the first optical auxiliary electrode may include a transparent conductive metal oxide.

According to one or more embodiments, the first subpixel of the organic light-emitting device may further include a first optical auxiliary layer between the first common layer and the emission layer.

The organic photodiode may receive light of the same wavelength as that of light emitted by the first subpixel.

The first subpixel may emit green light, red light, or near-infrared light.

The organic light-emitting device may further include at least one additional subpixel, and the additional subpixel may further include an additional optical auxiliary layer arranged between the first common layer and the emission layer.

Thicknesses of the first optical auxiliary layer and the additional optical auxiliary layer may be proportional to the wavelengths of light emitted by the subpixel including the first optical auxiliary layer and the subpixel including the additional optical auxiliary layer, respectively.

In an embodiment, the first subpixel of the organic light-emitting device may further include a second optical auxiliary layer arranged between the first subpixel electrode and the first common layer.

The organic light-emitting device may further include at least one additional subpixel, and the additional subpixel may further include an additional optical auxiliary electrode arranged between the first common layer and the emission layer.

The additional subpixel may include a second subpixel and a third subpixel, and the second subpixel and the third subpixel may each independently emit green light, red light, or blue light.

The additional subpixel may include a second subpixel, a third subpixel, and a fourth subpixel, and the second subpixel, the third subpixel, and the fourth subpixel may each independently emit green light, red light, or blue light.

The optical auxiliary electrode may include indium tin oxide (ITO), indium zinc oxide (IZO), aluminum zinc oxide (AZO), $In_2O_3$, indium gallium zinc oxide (IGZO), indium tin zinc oxide (ITZO), zinc tin oxide (ZTO), fluorine doped tin oxide (FTO), gallium tin oxide (GTO), gallium doped zinc oxide (GZO), ZnO, TiO, tungsten oxide, molybdenum oxide, or a combination thereof.

The first optical auxiliary electrode may have a thickness in a range of about 250 Å to about 2,000 Å.

The photoactive layer may have a thickness in a range of about 150 Å to about 1,000 Å.

The emission layer may have a thickness in a range of about 300 Å to about 700 Å.

The organic photodiode has a resonance distance identical to that of the first subpixel.

The first optical auxiliary electrode has a thickness identical to that of the second optical auxiliary electrode.

Thicknesses of the second optical auxiliary layer and the additional optical auxiliary electrode may each be proportional to the wavelengths of light emitted by the subpixel including the second optical auxiliary electrode and the subpixel including the additional optical auxiliary electrode.

The first optical auxiliary electrode has a thickness identical to that of the second optical auxiliary electrode.

According to one or more embodiments, an electronic apparatus includes the electronic device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
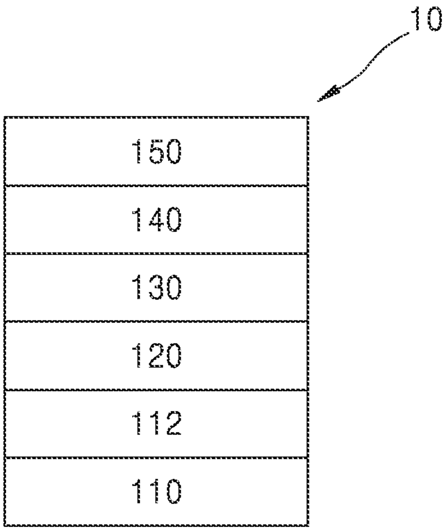
FIG. 1 is a schematic cross-sectional view of an organic photodiode according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It should be understood that embodiments that are illustrated in the drawings and are described in the detailed description are examples of the inventive concept, and various modifications are contemplated. An effect and a characteristic of the disclosure, and a method of accomplishing these will be apparent when referring to embodiments described with reference to the drawings. The disclosure may be embodied in many different forms and should not be construed as limited to the embodiments set forth herein.

It will be understood that although the terms "first," "second," etc. used herein may be used to describe various components, these components should not be limited by these terms. These components are only used to distinguish one component from another.

An expression used in the singular encompasses the expression of the plural, unless it has a clearly different meaning in the context.

In the following embodiments, when various components such as layers, films, regions, plates, etc. are said to be "on" another component, this may include not only a case in which other components are "directly on" the layers, films, regions, or plates, but also a case in which other components may be placed therebetween. Sizes of elements in the drawings may be exaggerated for convenience of explanation. In other words, because sizes and thicknesses of components in the drawings are arbitrarily illustrated for convenience of explanation, the following embodiments are not limited thereto.

It will be further understood that the terms "includes" and/or "comprises" used herein specify the presence of stated features or elements, but do not preclude the presence or addition of one or more other features or elements. Unless defined otherwise, the terms "include" or "have" may refer to both the case of consisting of features or components described in a specification and the case of further including other components.

[Organic Photodiode]

Figure 2:
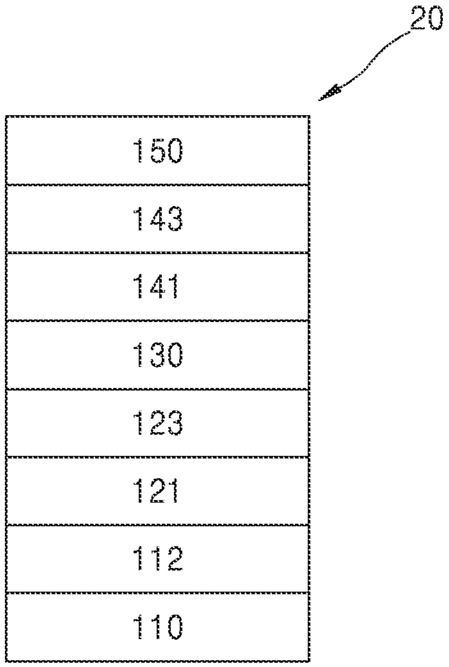
FIG. 2 is a schematic cross-sectional view of an organic photodiode according to another embodiment.

[Description of FIGS. 1 and 2]

An organic photodiode included in an electronic device will be described with reference to FIGS. 1 and 2.

FIG. 1 is a schematic cross-sectional view of an organic photodiode 10 according to an embodiment.

Referring to FIG. 1, the organic photodiode 10 according to an embodiment may sequentially include a first electrode 110, an optical auxiliary electrode 112, a hole transport region 120, a photoactive layer 130, an electron transport region 140, and a second electrode 150.

One of the first electrode 110 and the second electrode 150 may be an anode, and the other may be a cathode. For example, the first electrode 110 may be an anode, and the second electrode 150 may be a cathode.

The optical auxiliary electrode 112 may adjust an optical distance to cause an optical microcavity of the organic photodiode. When the optical distance is optimized, the intensity of light from the second electrode may be increased by the optical microcavity, and thus, light absorption in the photoactive layer may be increased, thereby increasing efficiency of light conversion to a current. The optical auxiliary electrode 112 may include a transparent conductive metal oxide. The optical auxiliary electrode 112 may include, for example, indium tin oxide (ITO), indium zinc dioxide (IZO), aluminum zinc oxide (AZO), $In_2O_3$, indium gallium zinc oxide (IGZO), indium tin zinc oxide (ITZO), zinc tin oxide (ZTO), fluorine doped tin oxide (FTO), gallium tin oxide (GTO), gallium doped zinc oxide (GZO), ZnO, TiO, tungsten oxide, molybdenum oxide, or a combination thereof.

The thickness of the optical auxiliary electrode 112 may be determined according to the wavelength of light to be received.

In the organic photodiode, a distance CD1 between the anode 110 and the photoactive layer 130 may be roughly determined by Equation (1):

$$CD1 = \frac{[(m-1)+0.5]*\lambda}{2n} \quad (1)$$

wherein, in Equation (1), m denotes a resonance order, λ denotes a receiving wavelength, and n denotes a refractive index of a layer corresponding to CD1. For example, when m is 3, λ is 530 nm (green light), and n is 2, CD1 may be a value of about 330 nm. Because the refractive indices of the optical auxiliary electrode 112 and the organic layer are different from each other, and the organic layer has a multi-layer structure, an error occurs between the value calculated in Equation (1) and the actual experimental optimal value, and thus, there is an acceptable range through simulation. In the device according to the present embodiment, a CD1 value may be a sum of the thickness of the hole transport region 120 and the optical auxiliary electrode 112.

The optical auxiliary electrode 112 may have a thickness in a range of about 250 Å to about 2,000 Å. In an embodiment, when the organic photodiode receives green light having a wavelength of about 500 nm to about 550 nm, the optical auxiliary electrode 112 may have a thickness of about 250 Å to about 500 Å. In an embodiment, when the organic photodiode receives red light having a wavelength of about 600 nm to about 650 nm, the optical auxiliary electrode 112 may have a thickness of about 600 Å to about 900 Å. In an embodiment, when the organic photodiode receives near-infrared light having a wavelength of about 800 nm to about 1,000 nm, the optical auxiliary electrode 112 may have a thickness of about 1,300 Å to about 2,000 Å.

The photoactive layer 130 may absorb incident light to form excitons, and charges are separated from the excitons to form electrons and holes.

The holes generated in the photoactive layer 130 may move to the first electrode 110 through the hole transport region 120, and the electrons generated in the photoactive layer 130 may move to the second electrode 150 through the electron transport region 140, thereby generating photocurrent and detecting light.

In an embodiment, the photoactive layer 130 may include a p-type semiconductor layer including a p-type semiconductor and an n-type semiconductor layer including the n-type semiconductor, wherein the p-type semiconductor layer and the n-type semiconductor layer form a PN junction. The PN junction may include, for example, a planar heterojunction or a bulk heterojunction.

Since the p-type organic semiconductor acts as an electron donor, and the n-type organic semiconductor acts as an electron acceptor, excitons can be efficiently divided into holes and electrons by photo-induced charge separation occurring at the interface between the p-type semiconductor layer and the n-type semiconductor layer. Furthermore, as the photoactive layer is separated into the p-type semiconductor layer and the n-type semiconductor layer, the holes and electrons generated at the interface may be easily captured and moved.

In one or more embodiments, the photoactive layer 130 may be a mixed layer in which the p-type semiconductor and the n-type semiconductor are mixed. In this case, the p-type semiconductor and the n-type semiconductor may be co-deposited.

The p-type semiconductor may include a compound serving as an electron donor. The p-type organic semiconductor may be, for example, borone subphthalocyanine chloride (SubPc), boron subnaphthalocyanine chloride (SubNc), copper(II)phthalocyanine (CuPc), tetraphenyldibenzoperiflanthene (DBP), or a combination thereof, but embodiments of the disclosure are not limited thereto.

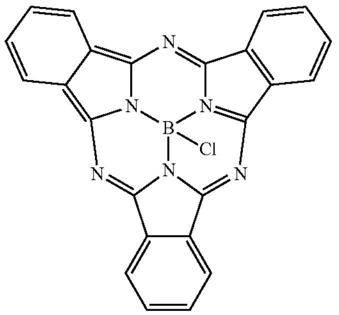

SubPc

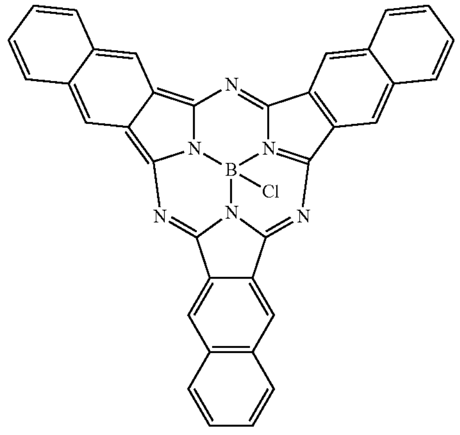

SubNc

The n-type organic semiconductor may include a compound serving as an electron acceptor. For example, the n-type organic semiconductor may include 3,4,9,10-perylenetetracarboxylic dianhydride (PTCDA), N,N'-di(propoxyethyl)perylene-3,4,9,10-tetracarboxylic diimide (PTCDI), naphthalene tetracarboxylic anhydride (NTCDA), naphthalenetetracarboxylic diimide (NTCDI), or a derivative thereof, a fullerene derivative, or a combination thereof. R in the below Equation denotes a substituent such as an aryl group:

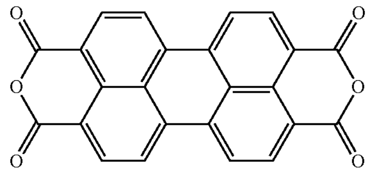

PTCDA

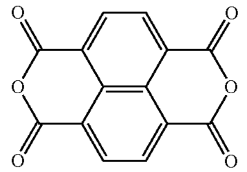

NTCDA

-continued

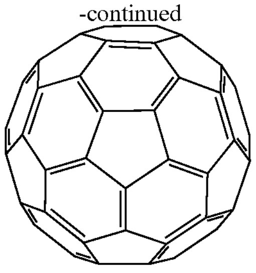

C60

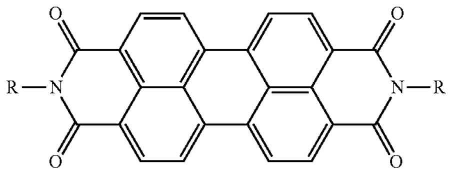

PTCDI

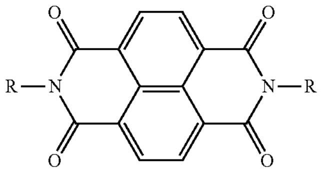

NTCDI

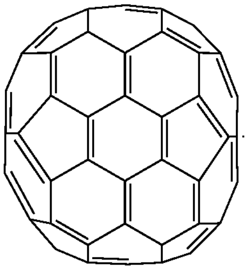

C70

A thickness of the photoactive layer 130 may be in a range of about 50 Å to about 1,000 Å, for example, in a range of about 150 Å to about 1,000 Å, about 150 Å to about 700 Å, or about 200 Å to about 500 Å.

The first electrode 110, the second electrode 150, the hole transport region 120, and the electron transport region 140 of the organic photodiode 10 may each be formed of the same materials as materials for forming an anode, a cathode, a hole transport region, and an electron transport region of an organic light-emitting device, respectively.

FIG. 2 is a schematic cross-sectional view of an organic photodiode 20 according to another embodiment.

Referring to FIG. 2, the optical auxiliary electrode 112, a hole injection layer 121, and a hole transport layer 123 may be arranged between the first electrode 110 and the photoactive layer 130. In an embodiment, an additional layer such as an electron blocking layer (not shown) may be further included between the photoactive layer 130 and the hole transport layer 123.

An electron transport layer 141 and an electron injection layer 143 are arranged between the photoactive layer 130 and the second electrode 150. In an embodiment, an additional layer such as a hole blocking layer (not shown) may be further included between the photoactive layer 130 and the electron transport layer 121.

A description of the photoactive layer 130 of the organic photodiode 20 may be as described for the photoactive layer 130 of the organic photodiode 10 of FIG. 1.

Hereinafter, the layers that are commonly used with the organic light-emitting device among the layers constituting the organic photodiodes 10 and 20 of FIGS. 1 and 2 will be described in more detail.

[First Electrode 110]

In FIGS. 1 and 2, a substrate may be additionally arranged under the first electrode 110 or on the second electrode 150. As the substrate, a glass substrate or a plastic substrate may be used. In one or more embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, the material for forming the first electrode 110 may be a high-work function material.

The first electrode 110 may be a reflective electrode, a semi-transmissive electrode, or a transmissive electrode. When the first electrode 110 is a transmissive electrode, indium tin oxide (ITO), indium zinc oxide (IZO), tin oxide ($SnO_2$), zinc oxide (ZnO), or a combination thereof may be used as a material for forming the first electrode 110. In an embodiment, to form the first electrode 110 as a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or a combination thereof may be used as the material for forming the first electrode 110.

The first electrode 110 may have a single-layered structure consisting of a single layer or a multi-layered structure including a plurality of layers. For example, the first electrode 110 may have a three-layered structure of ITO/Ag/ITO.

[Charge Auxiliary Layer]

The organic photodiode 10 or 20 according to an embodiment may include a charge auxiliary layer that facilitates the transport of holes and electrons separated from the photoactive layer 130. The charge auxiliary layer may include a hole injection layer and a hole transport layer to facilitate the transport of holes, and an electron transport layer and an electron injection layer to facilitate the transport of electrons.

[Hole Transport Region]

The charge auxiliary layer and layers included therein arranged between the first electrode 110 and the photoactive layer 130 may be collectively referred to as the hole transport region 120. The hole transport region 120 may facilitate the transport of holes generated in the photoactive layer 130.

The hole transport region 120 may include a hole transport layer, a hole injection layer, an electron blocking layer, or a combination thereof.

The hole transport region may include a hole transporting material. For example, the hole transporting material may include a compound represented by Formula 201, a compound represented by Formula 202, or a combination thereof:

Formula 201

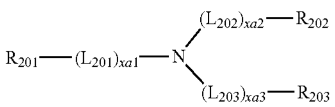

x

Formula 202

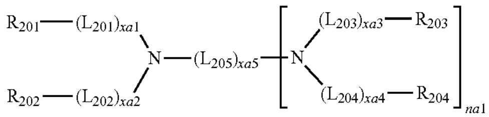

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

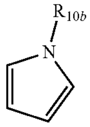

CY202

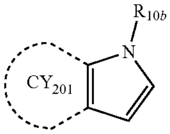

CY203

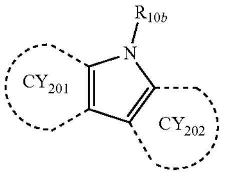

-continued

CY204

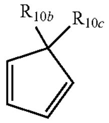

CY205

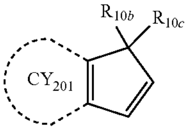

CY206

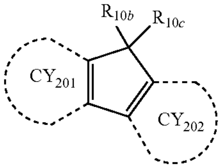

CY207

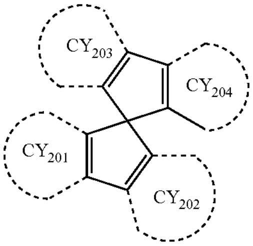

CY208

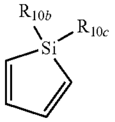

CY209

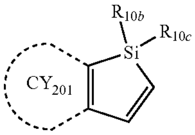

CY210

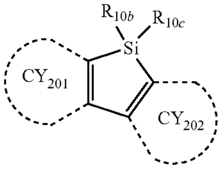

CY211

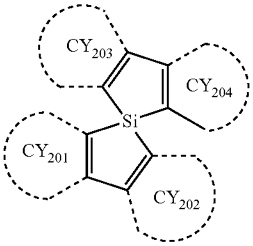

CY212

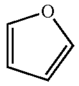

CY213

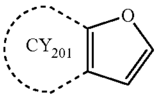

-continued

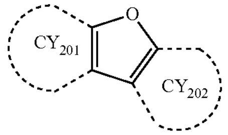

CY214

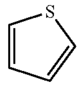

CY215

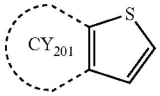

CY216

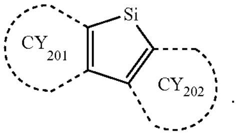

CY217

$R_{10b}$ and $R_{10c}$ in Formulae CY201 to CY217 are as described for $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of the groups represented by Formulae CY204 to CY217.

In one or more embodiments, each of Formulae 201 and 202 may not include a group represented by one of Formulae CY201 to CY217.

For example, the hole transporting material may include one of Compounds HT1 to HT46, m-MTDATA, TDATA, 2-TNATA, NPB(NPD), —NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof:

HT1

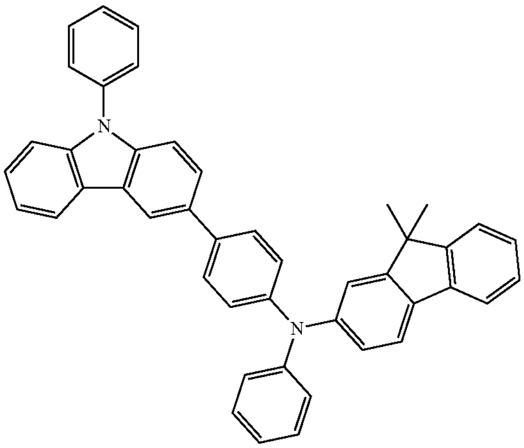

HT2

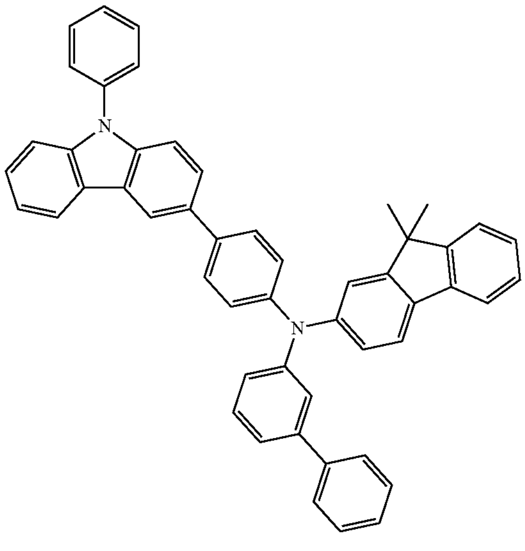

-continued
HT3
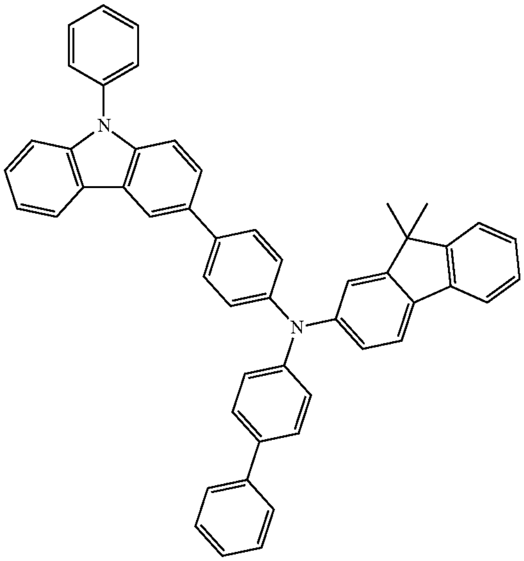
HT4
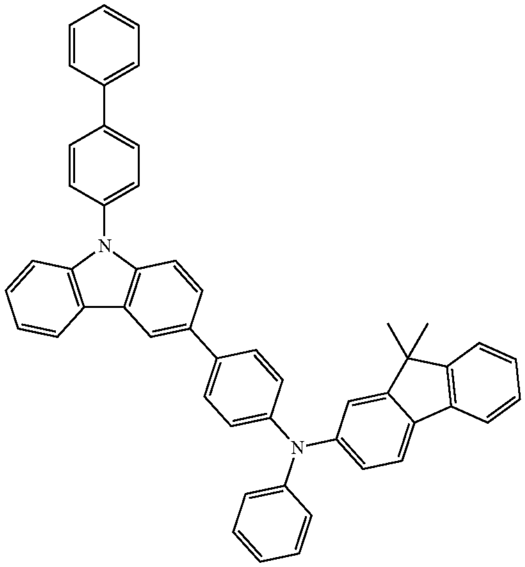
HT5
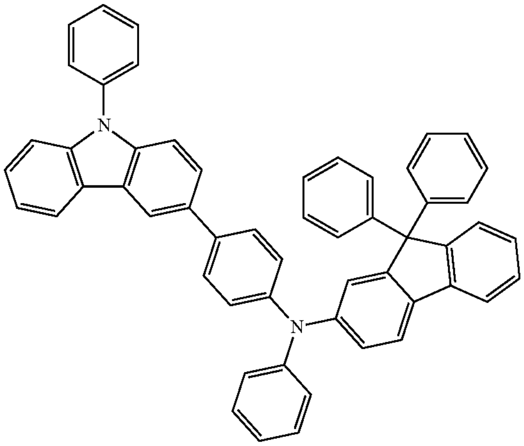
HT6
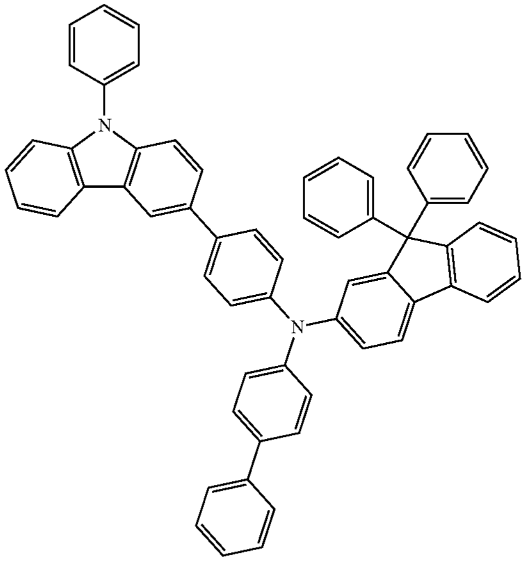

-continued
HT7
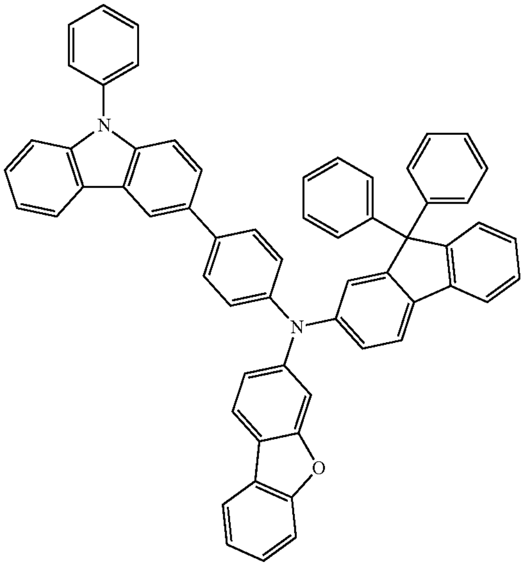
HT8
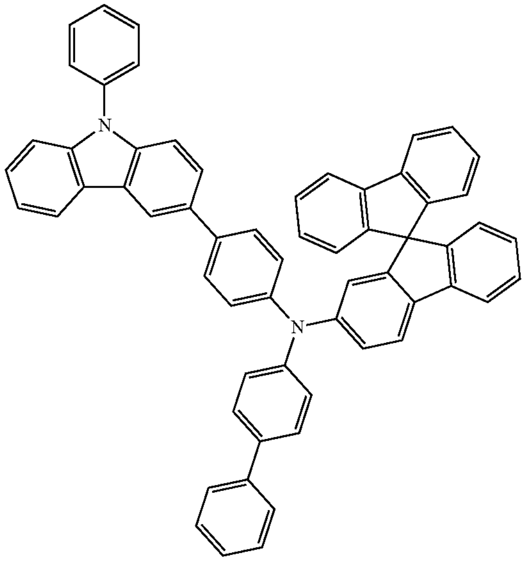
HT9
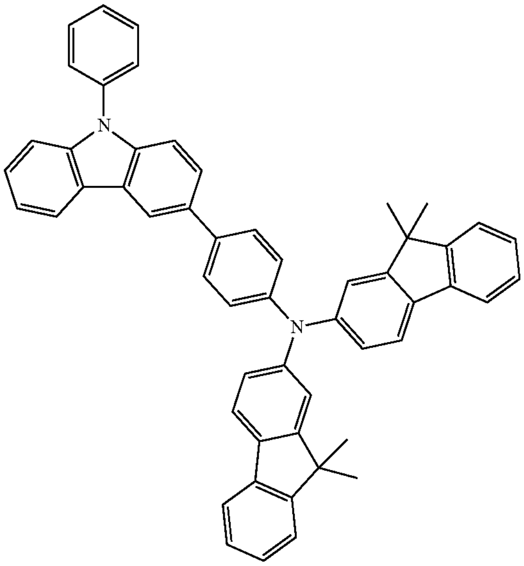
HT10
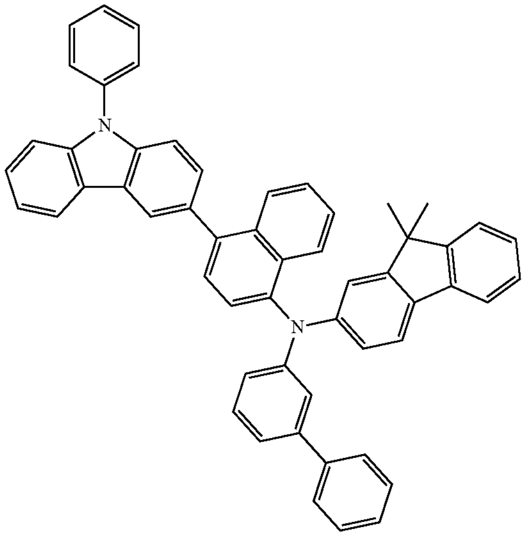
HT11
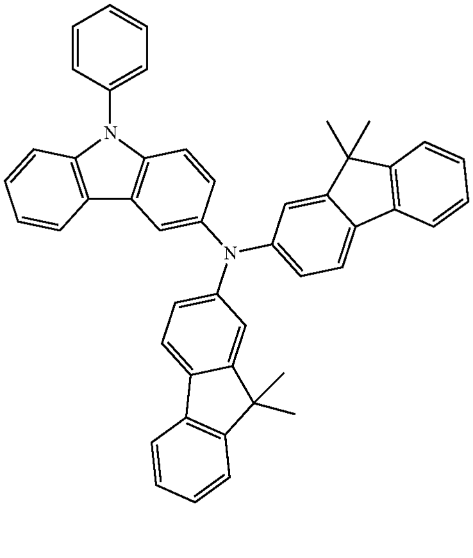
HT12
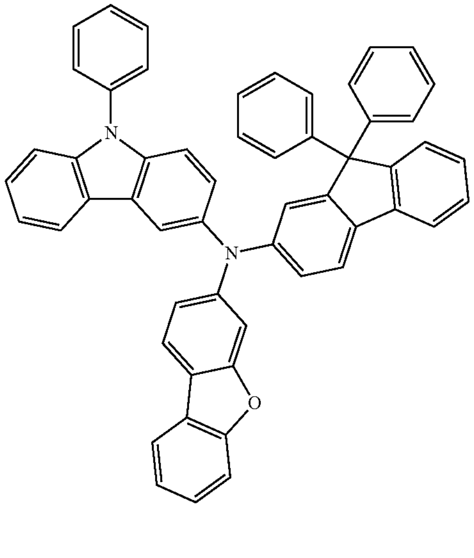

-continued
HT13
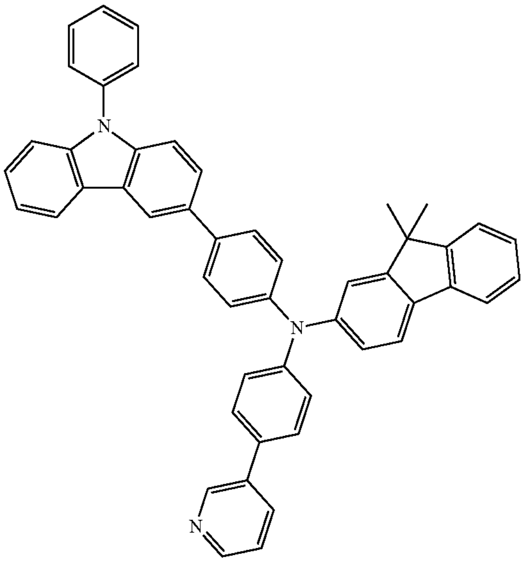
HT14
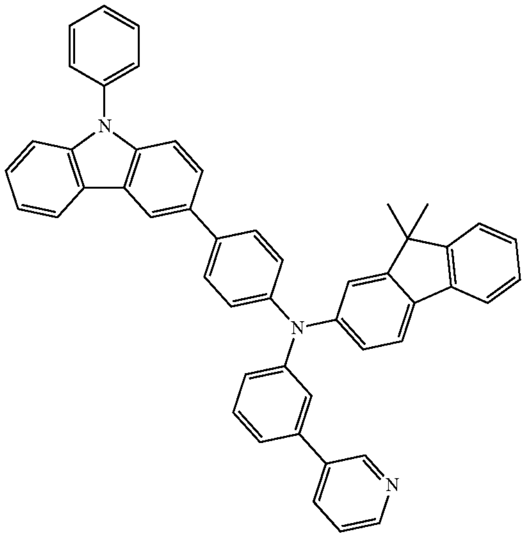
HT15
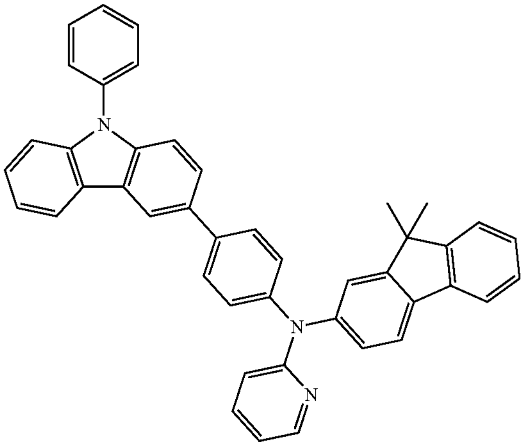
HT16
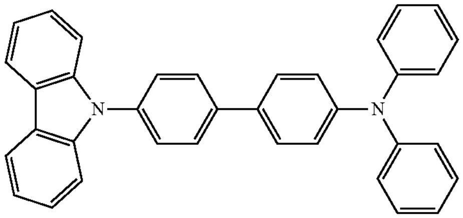
HT17
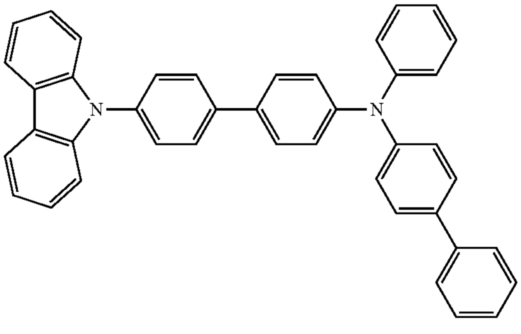
HT18
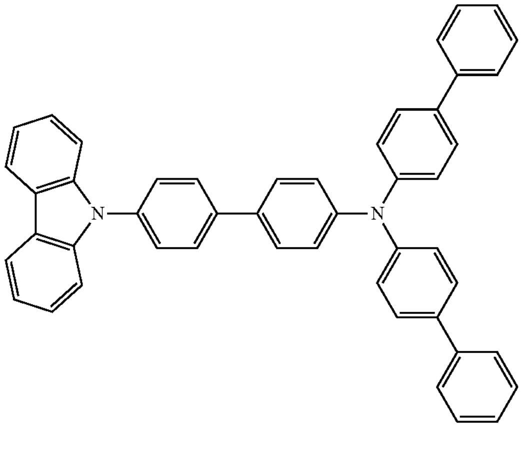

-continued
HT19
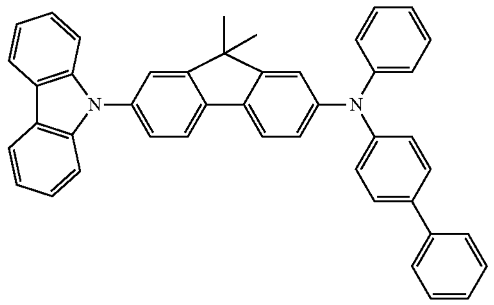
HT20
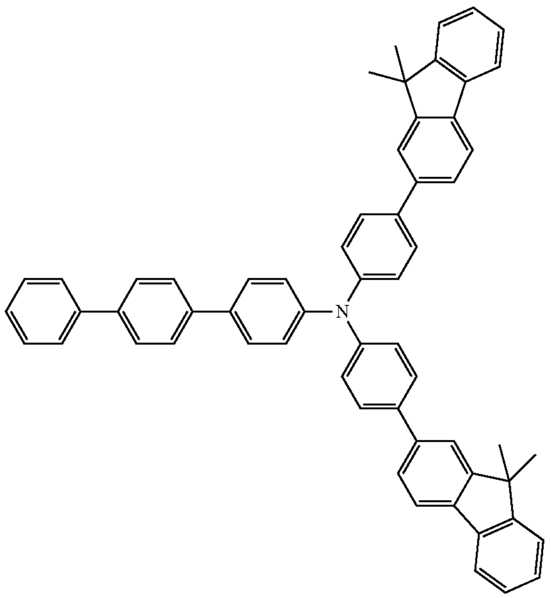
HT21
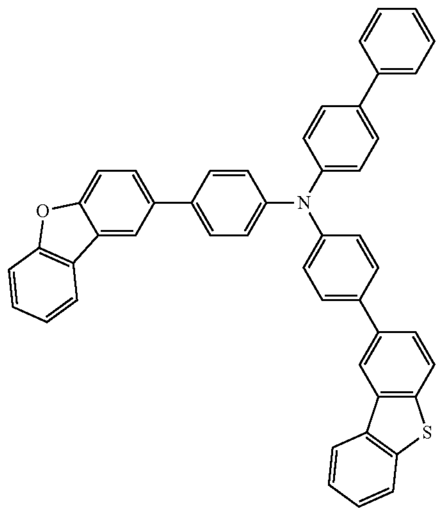
HT22
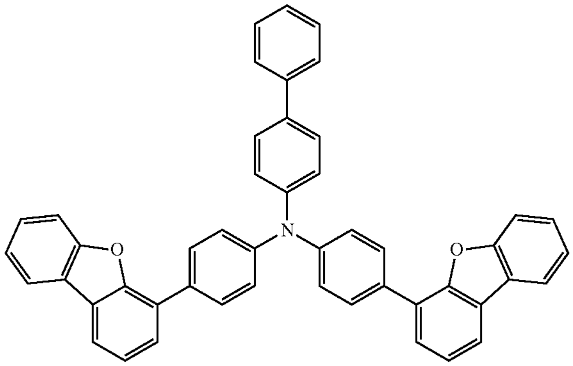
HT23
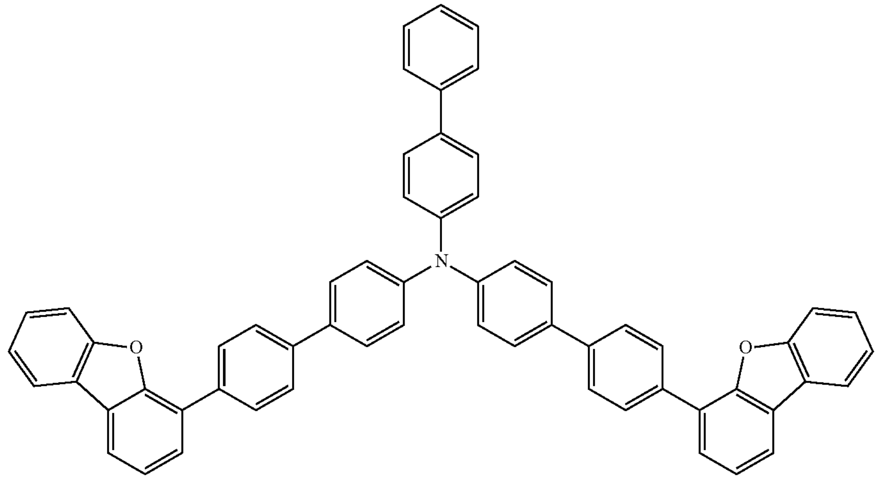

-continued
HT24
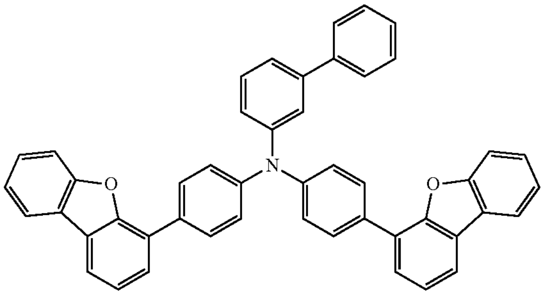
HT25
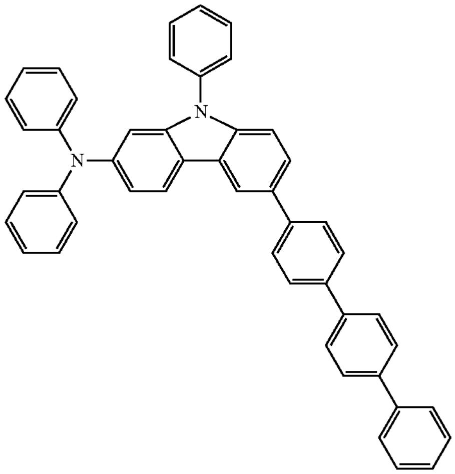
HT26
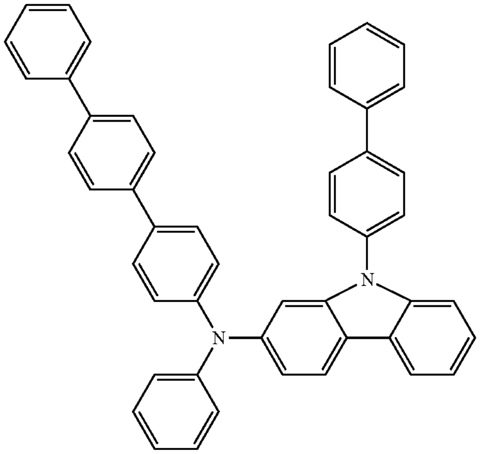
HT27
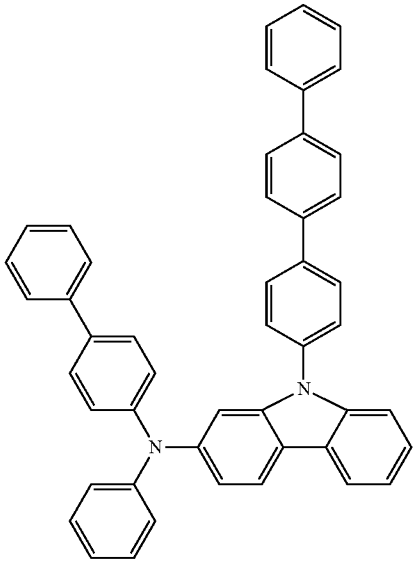
HT28
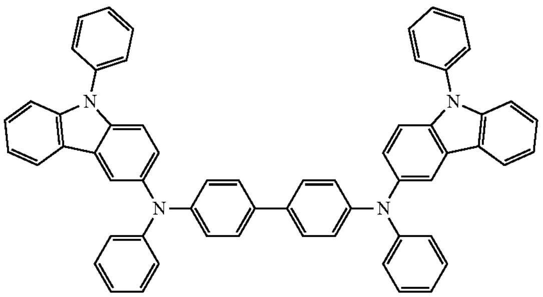
HT29
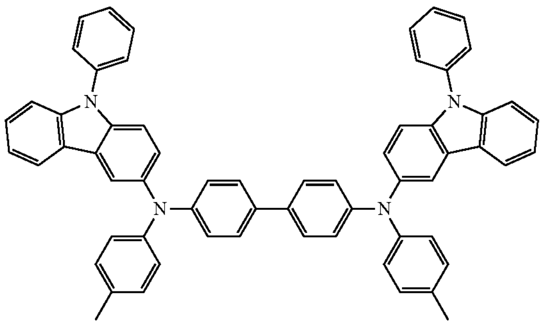

-continued
HT30
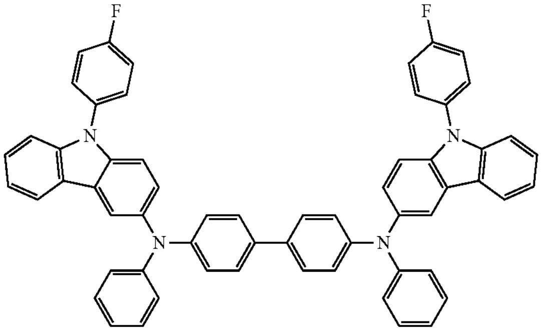
HT31
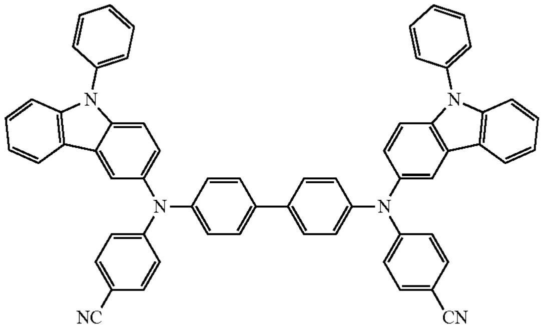
HT32
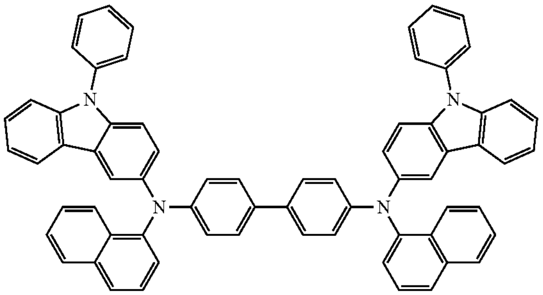
HT33
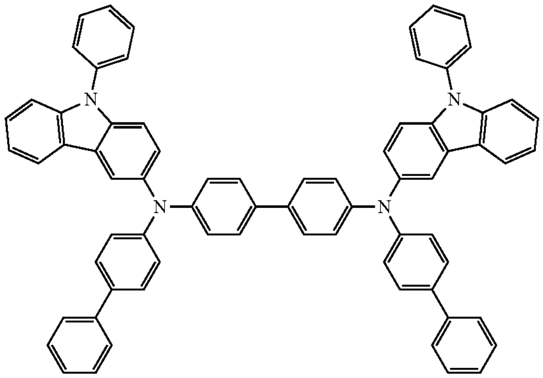
HT34
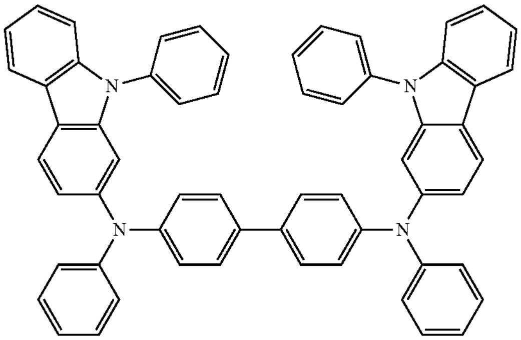
HT35
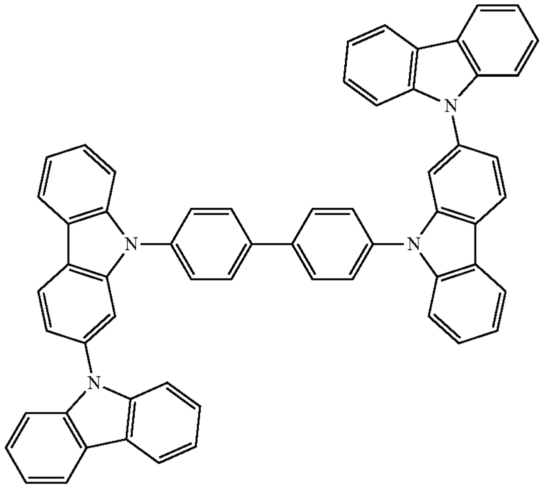

-continued
HT36
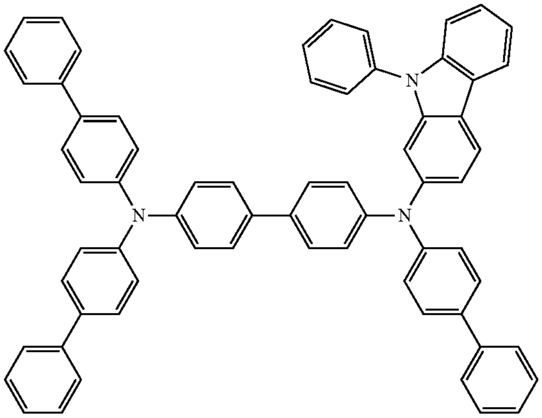
HT37
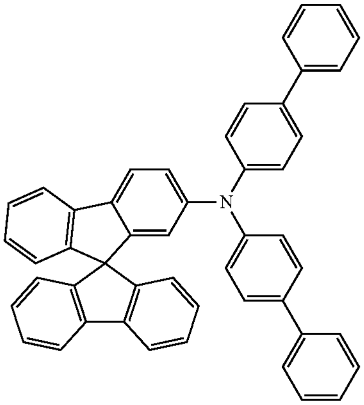
HT38
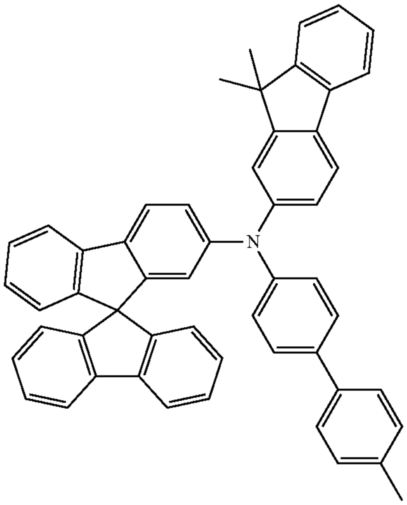
HT39
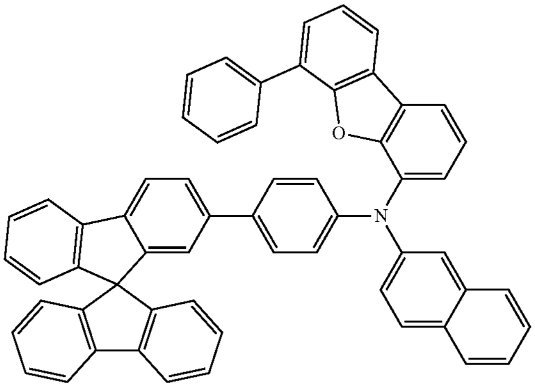
HT40
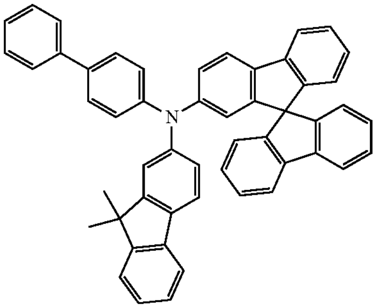
HT41
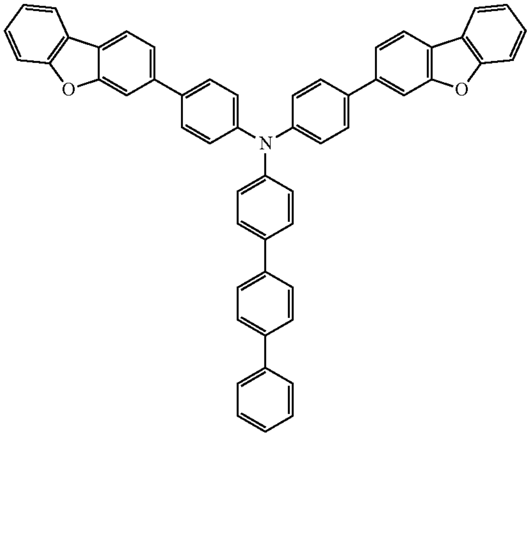

-continued
HT42
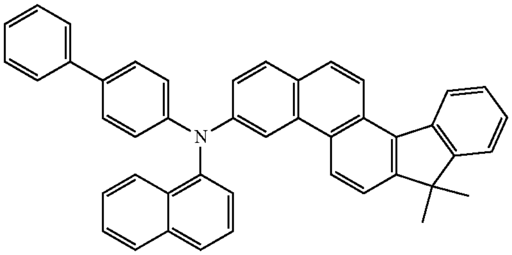
HT43
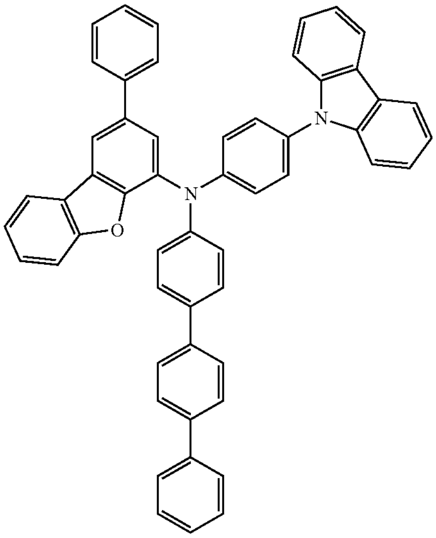
HT44
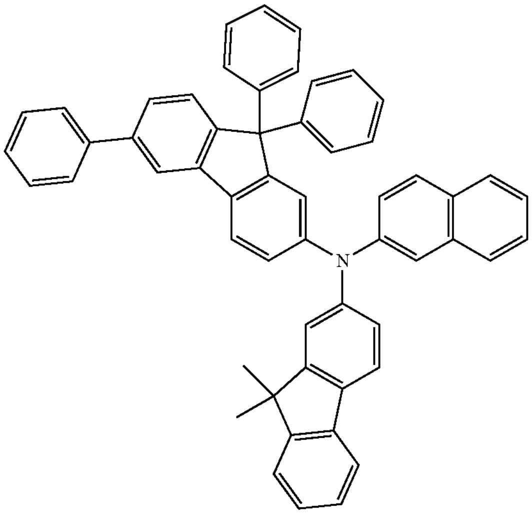
HT45
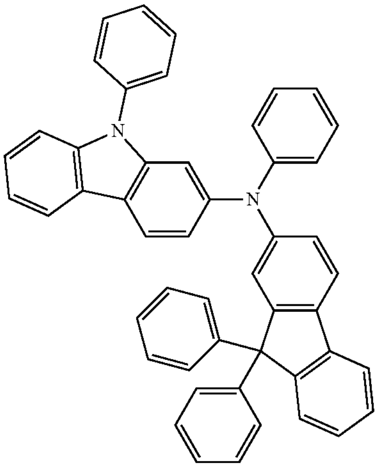
HT46
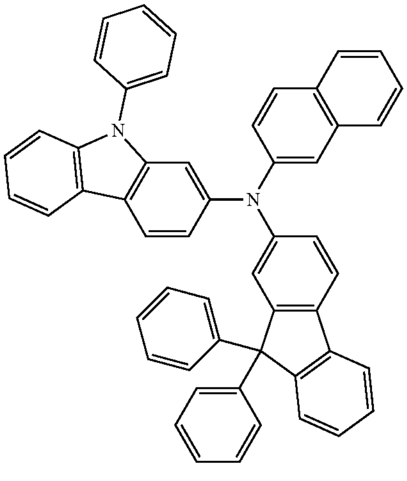

-continued
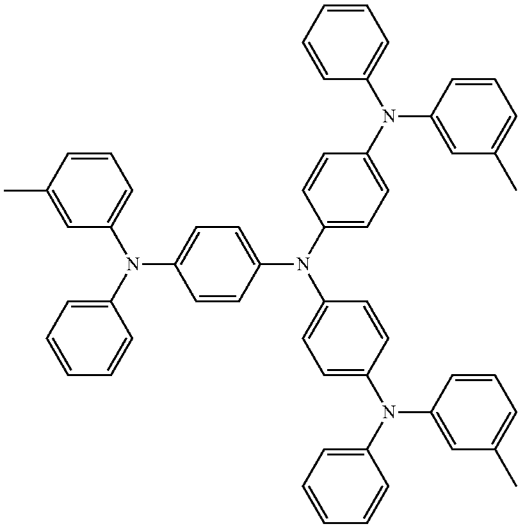
m-MTDATA
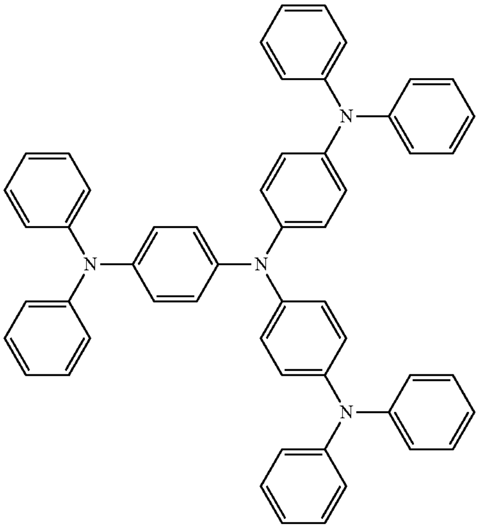
TDATA
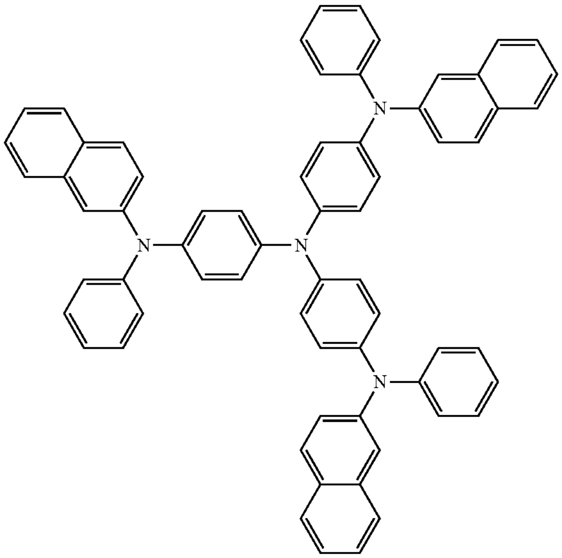
2-TNATA
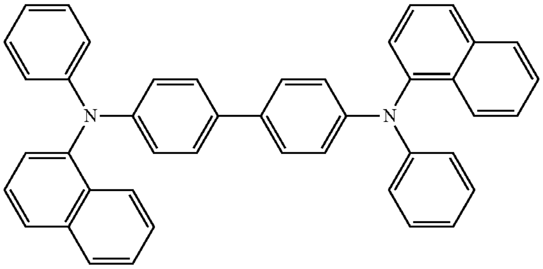
NPB
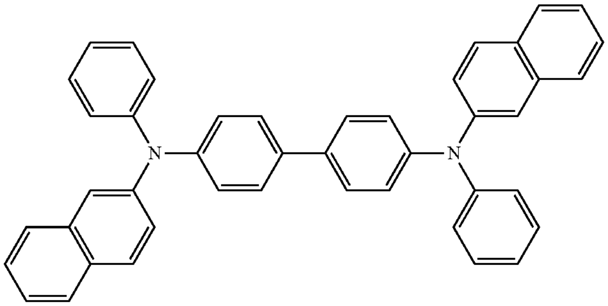
β-NPB -continued

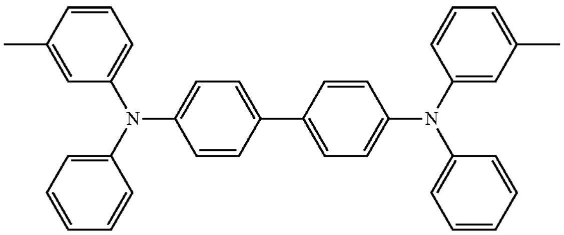

TPD

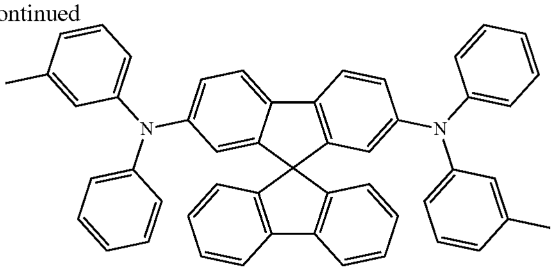

Spiro-TPD

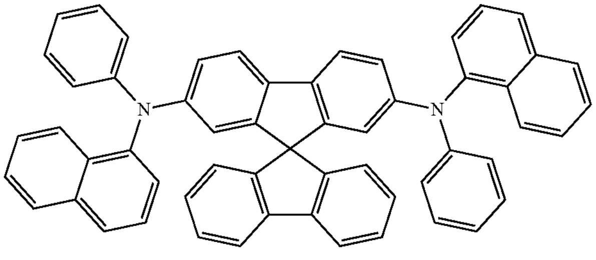

Spiro-NPB

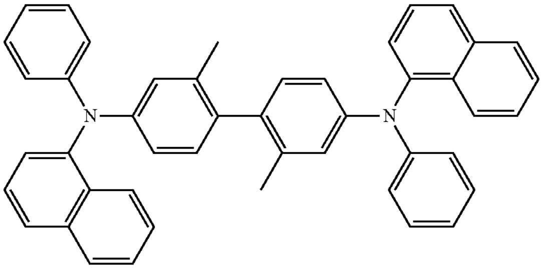

methylated NPB

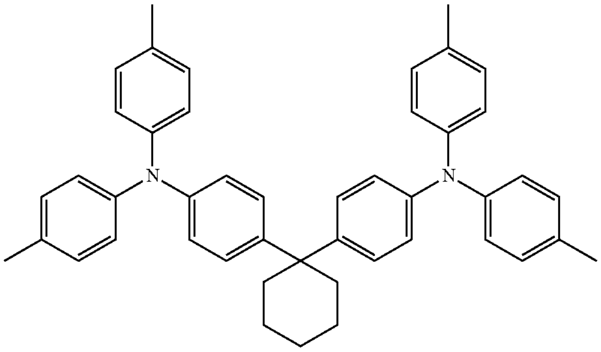

TAPC

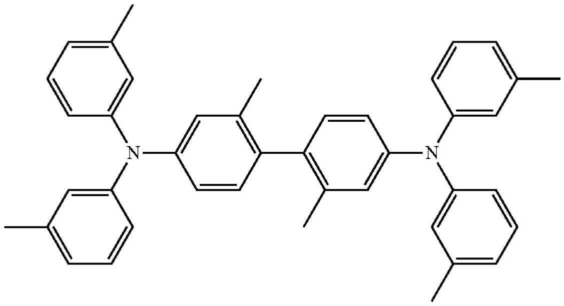

HMTPD

.

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The electron blocking layer may be a layer that prevents electron leakage from the active layer 130 to the hole transport region. The hole transporting material as described above may be included in the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or a combination thereof.

Examples of the quinone derivative are TCNQ, F4-TCNQ, etc.

Examples of the cyano group-containing compound are HAT-CN and a compound represented by Formula 221 below.

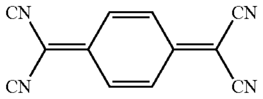

TCNQ

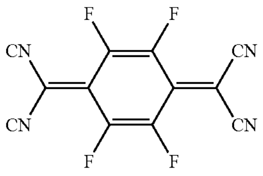

F4-TCNQ

-continued

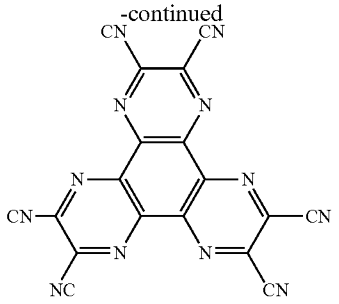

HAT-CN

Formula 221

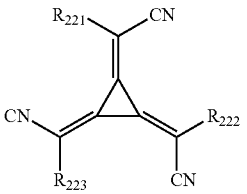

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or a combination thereof; or a combination thereof.

In the compound including element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te).

Examples of the non-metal are oxygen (O) and halogen (for example, F, Cl, Br, I, etc.).

Examples of the compound including element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or a combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halogen may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AUF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Electron Transport Region]

The charge auxiliary layer and layers included therein arranged between the photoactive layer 130 and the second electrode 150 may be collectively referred to as the electron transport region 140. The electron transport region 140 may facilitate the transport of electrons generated in the photoactive layer 130.

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or a combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601 below:

$$[Ar_{601}]_{xe11}-[(L_{601})_{xe1}-R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ may each be as described for $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

Formula 601-1

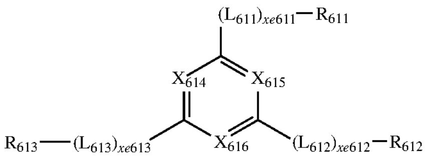

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each be as described for $L_{601}$, xe611 to xe613 may each be as described for xe1, $R_{611}$ to $R_{613}$ may each be as described for $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or a combination thereof:

ET1

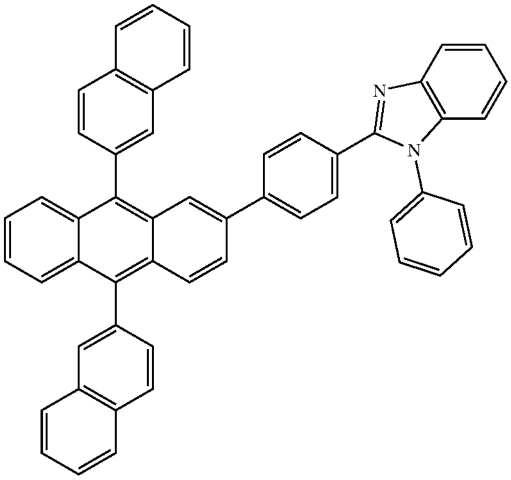

-continued
ET2
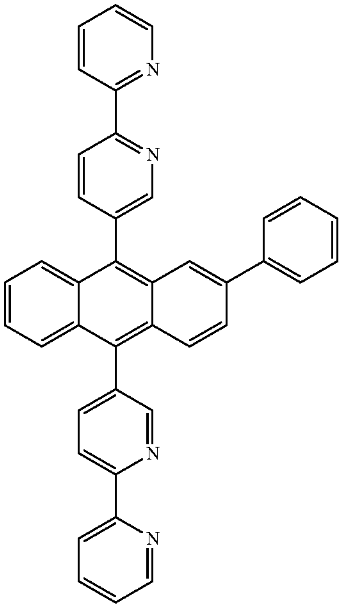
ET3
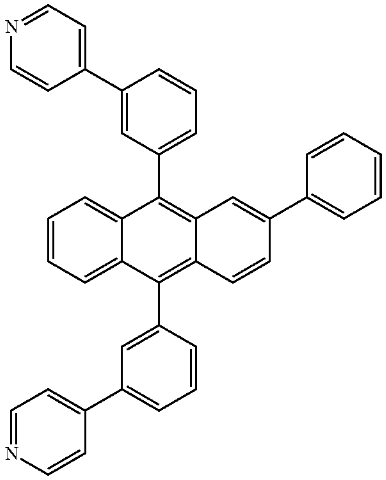
ET4
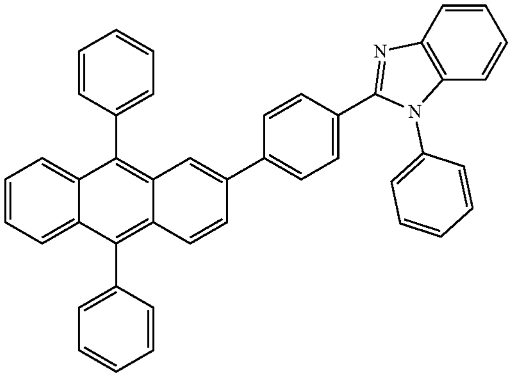
-continued
ET5
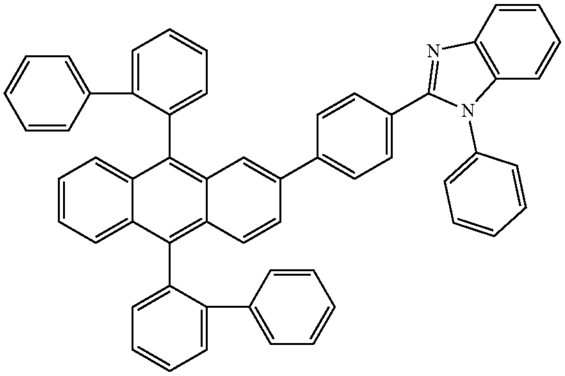
ET6
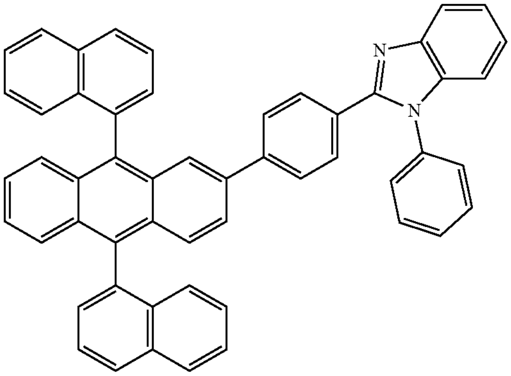
ET7
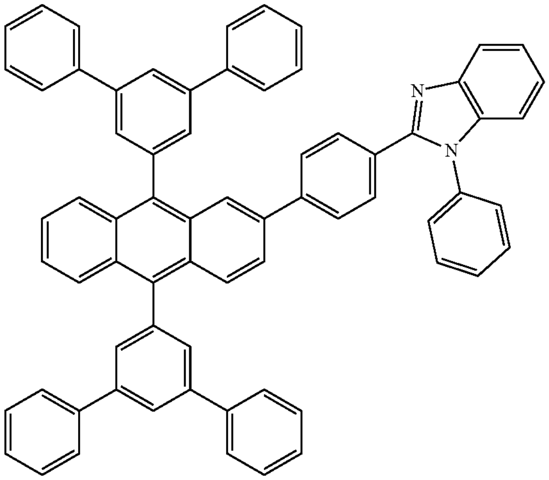

-continued
ET8
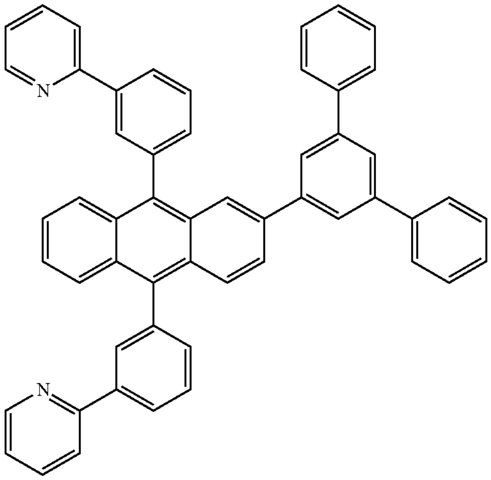
ET9
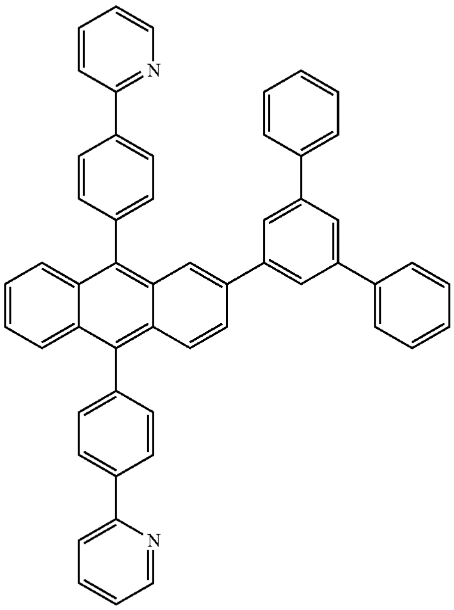
-continued
ET10
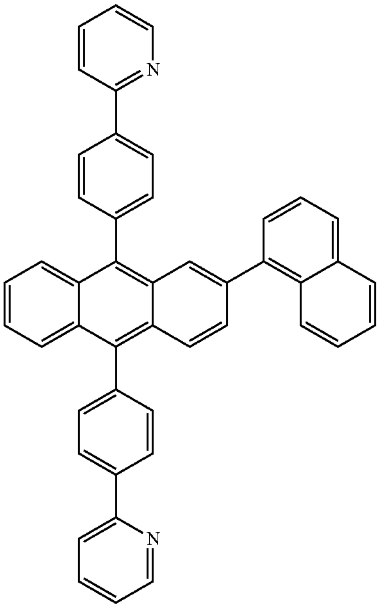
ET11
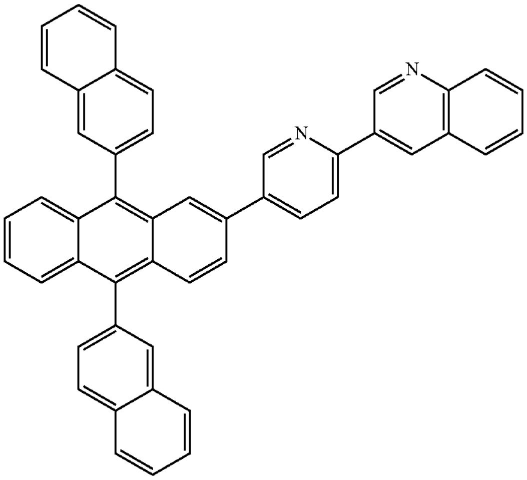
ET12
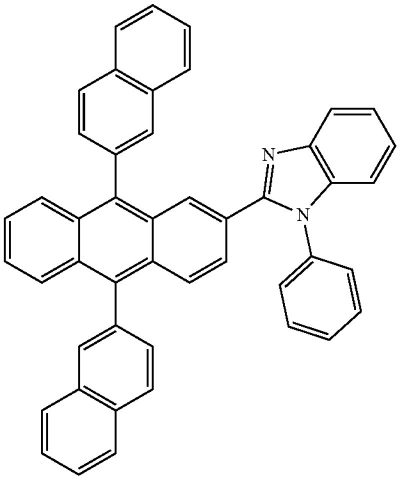

-continued
ET13
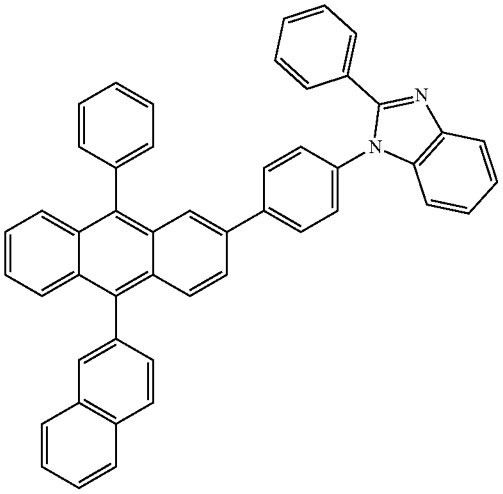
ET14
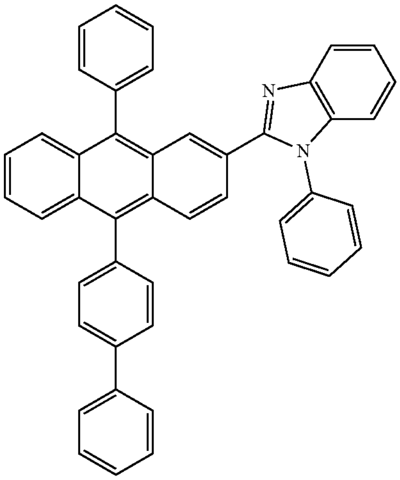
ET15
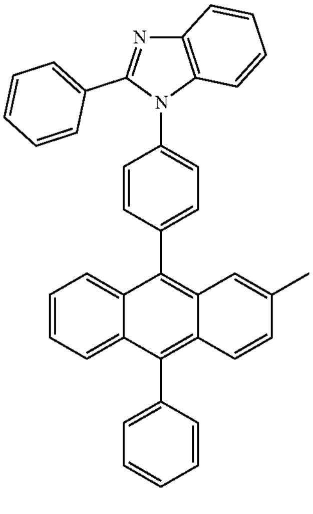
-continued
ET16
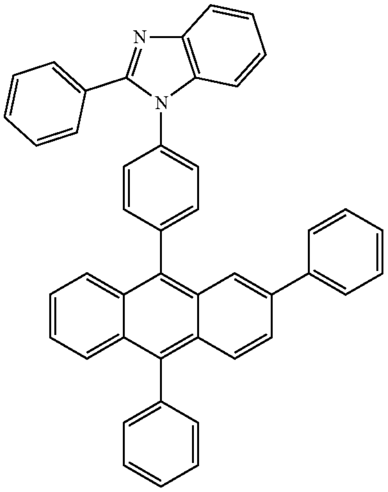
ET17
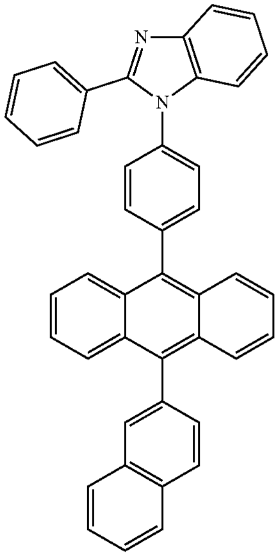
ET18
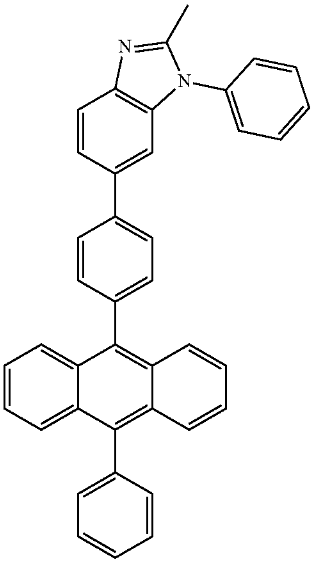

ET19
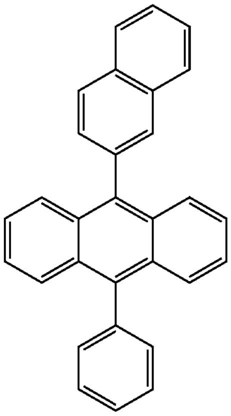
ET20
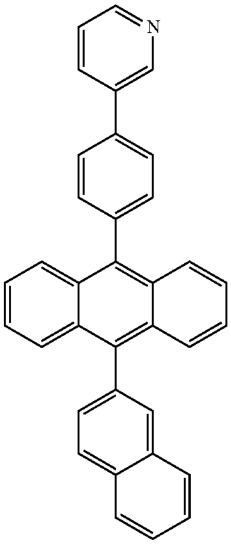
ET21
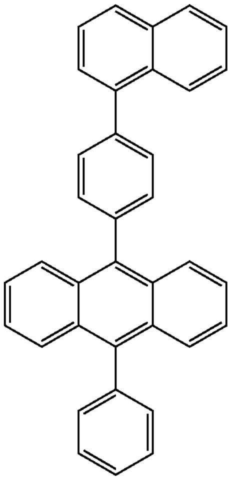
ET22
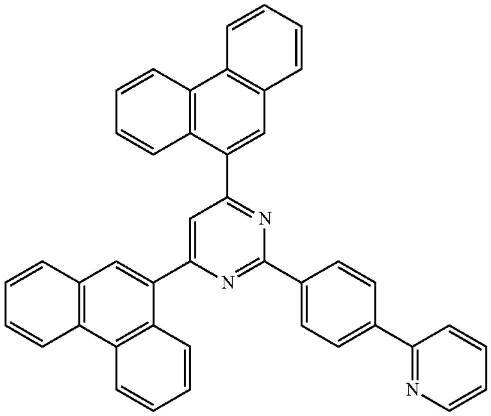
ET23
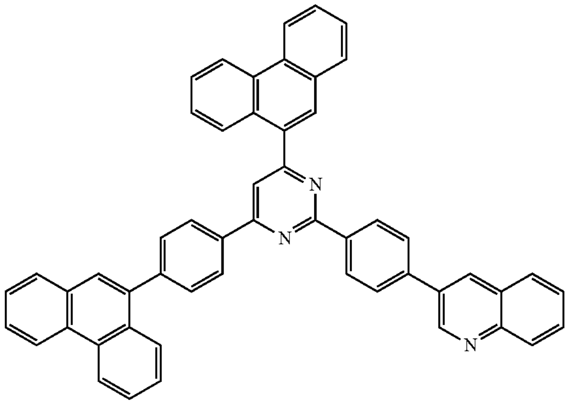
ET24
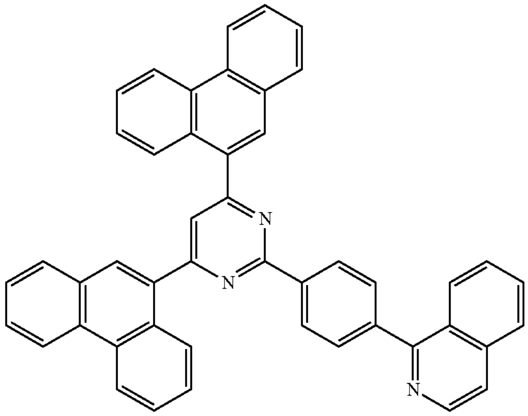

-continued
ET25
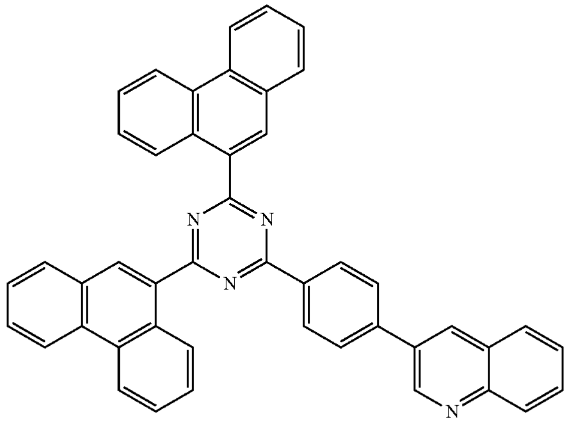
ET26
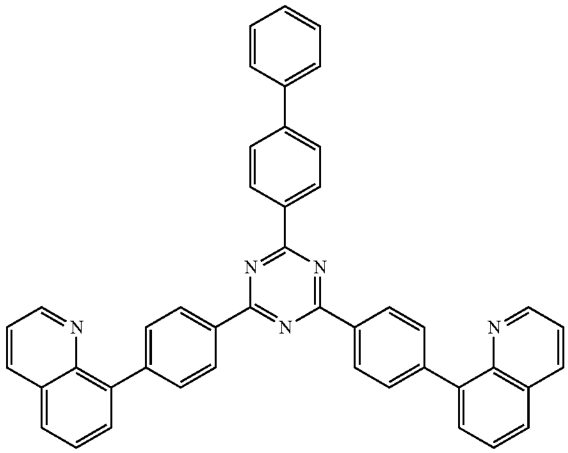
ET27
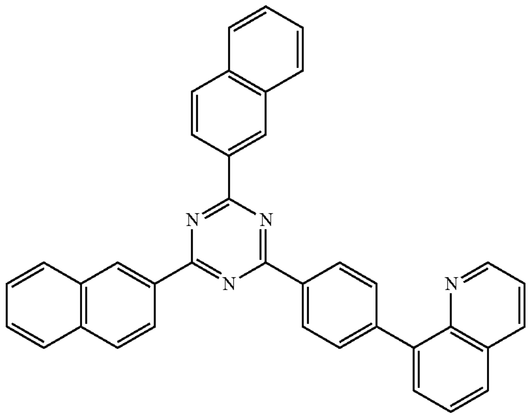
-continued
ET28
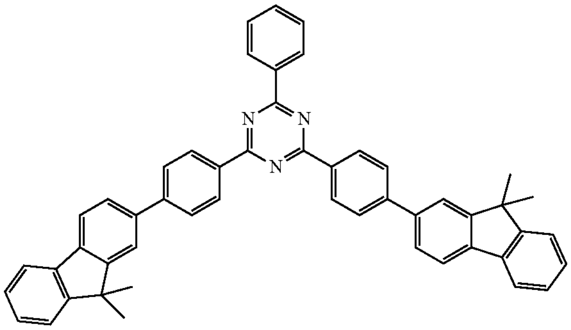
ET29
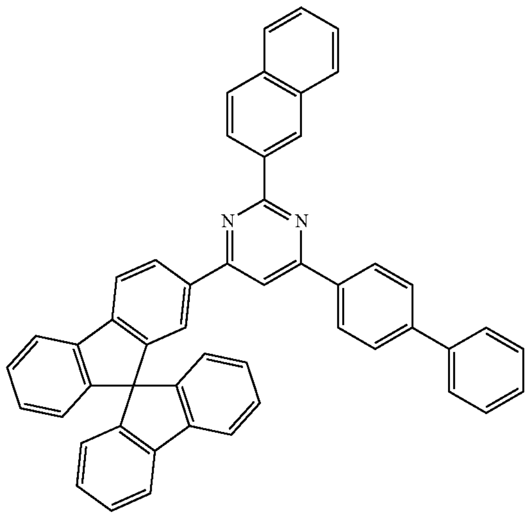
ET30
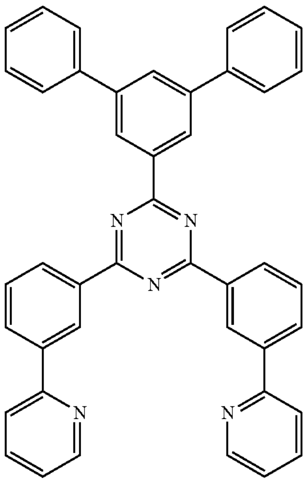

-continued
ET31
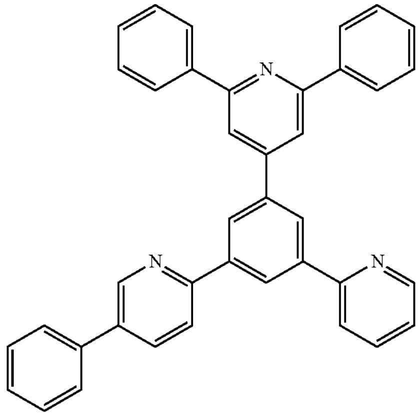
ET32
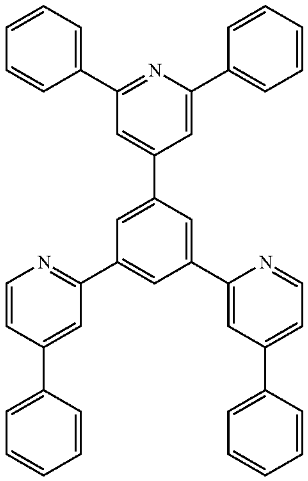
ET33
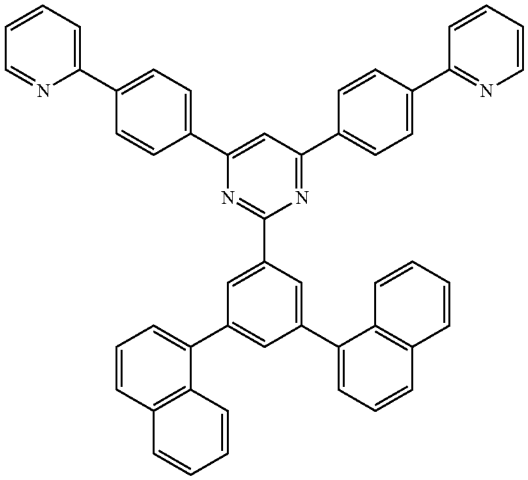
-continued
ET34
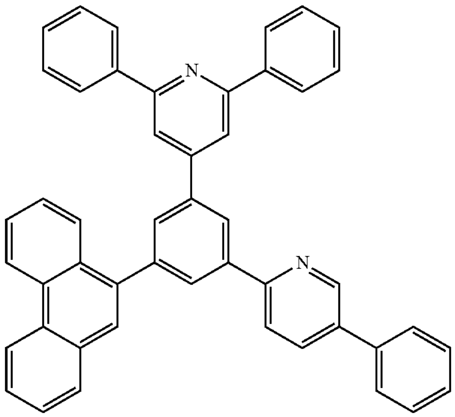
ET35
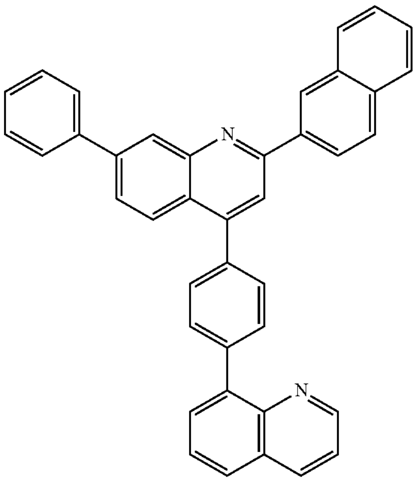
ET36
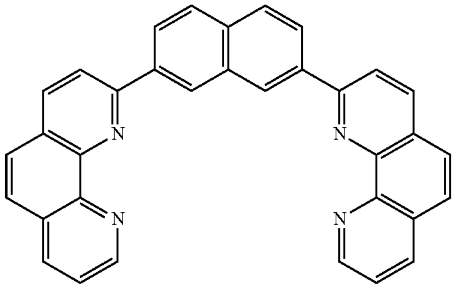
ET37
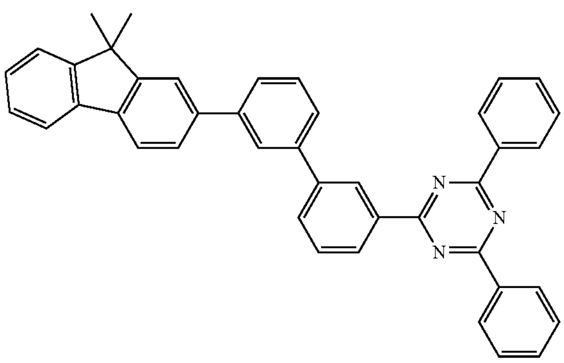

-continued
ET38
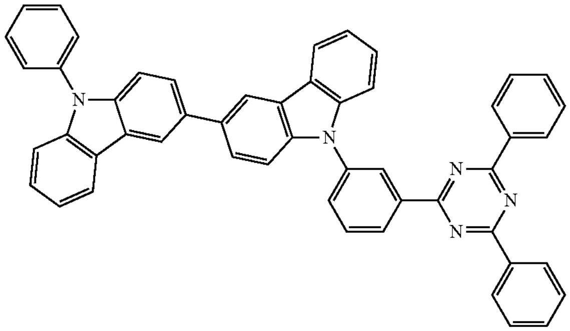
ET39
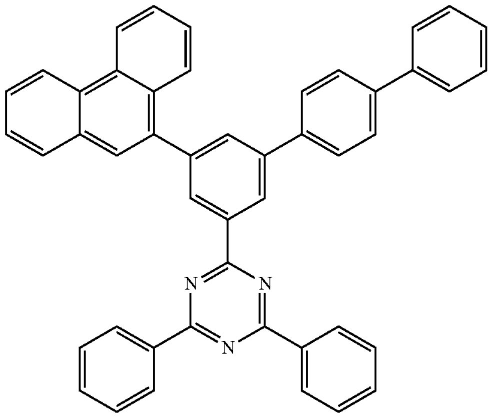
ET40
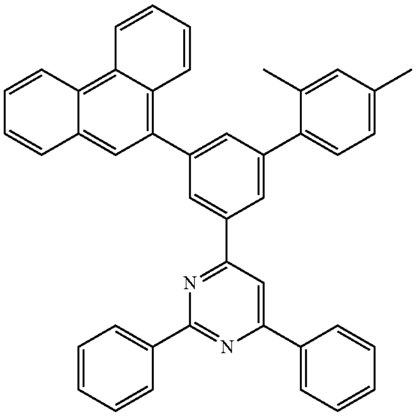
-continued
ET41
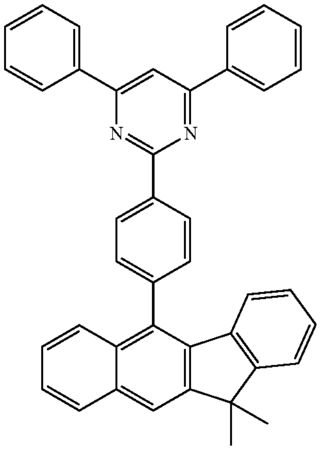
ET42
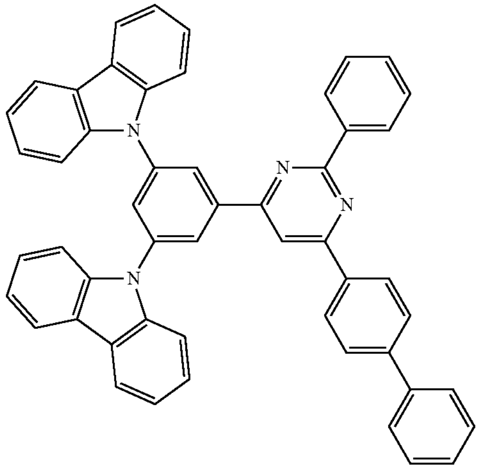
ET43
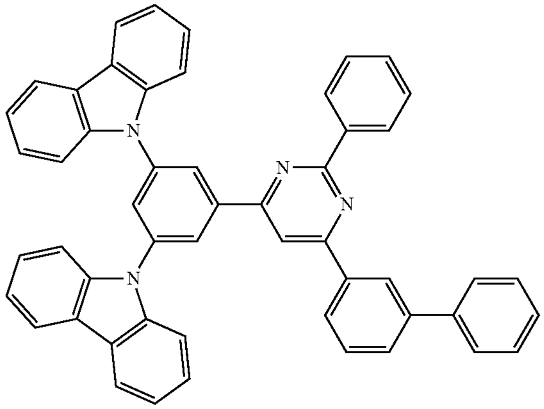

-continued

ET44

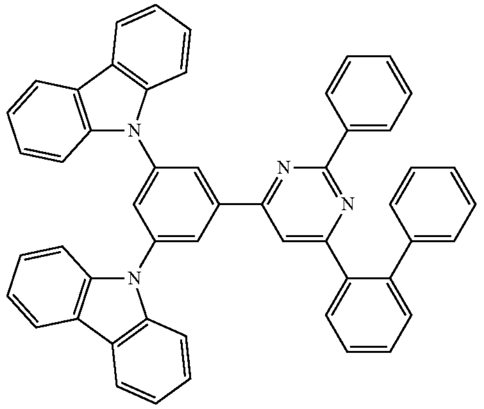

ET45

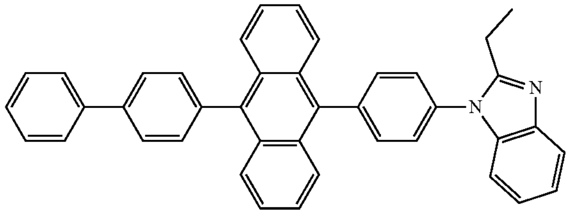

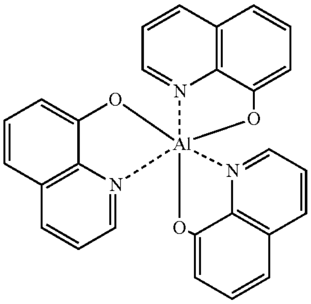

Alq3

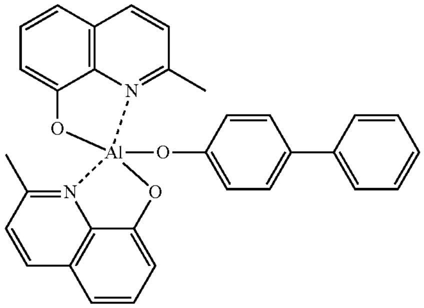

BAlq

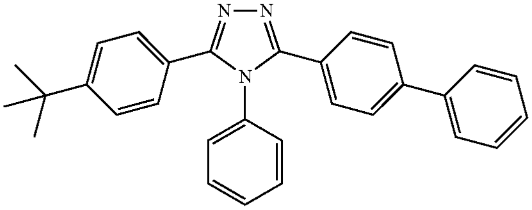

TAZ

-continued

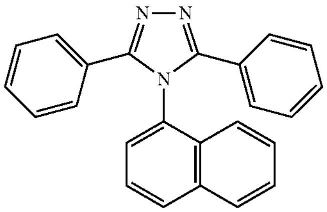

NTAZ .

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or a combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or a combination thereof.

For example, the metal-containing material may include a Li complex. The Li complex may include, for example, Compound ET-D1 (LiQ) or ET-D2:

ET-D1

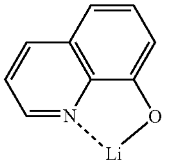

-continued

ET-D2

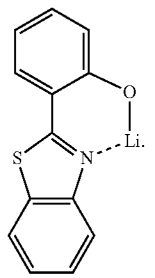

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or a combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or a combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or a combination thereof. In one or more embodiments, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or a combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described above. In one or more embodiments, the electron injection layer may further include an organic material (for example, a compound represented by Formula 601).

In one or more embodiments, the electron injection layer may consist of: i) an alkali metal-containing compound (for example, an alkali metal halide); or ii) a) an alkali metal-containing compound (for example, an alkali metal halide), and b) an alkali metal, an alkaline earth metal, a rare earth metal, or a combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

[Second Electrode 150]

The second electrode 150 is arranged on the photoactive layer 130. The second electrode 150 may be a cathode, which is an electron injection electrode, and as the material for the second electrode 150, a metal, an alloy, an electrically conductive compound, or a combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including a plurality of layers.

[Capping Layer]

A first capping layer (not shown) may be arranged outside the first electrode 110, and/or a second capping layer (not shown) may be arranged outside the second electrode 150.

The first capping layer and/or the second capping layer may prevent impurities, such as water, oxygen, and the like, from entering the organic photodiode 10 or 20, thereby increasing the reliability of the organic photodiode 10 or 20.

The first capping layer and the second capping layer may each include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or a combination thereof. Optionally, the carbocyclic compound, the heterocyclic compound, and the amine group-containing compound may be substituted with a substituent including O, N, S, Se, Si, F, Cl, Br, I, or a combination thereof. In one or more embodiments, at least one of the first capping layer and the second capping layer may each independently include an amine group-containing compound.

For example, at least one of the first capping layer and the second capping layer may each independently include a compound represented by Formula 201, a compound represented by Formula 202, or a combination thereof.

In one or more embodiments, at least one of the first capping layer and the second capping layer may each independently include one of Compounds HT28 to HT33, one of Compounds CP1 to CP6, β-NPB, or a combination thereof:

CP1

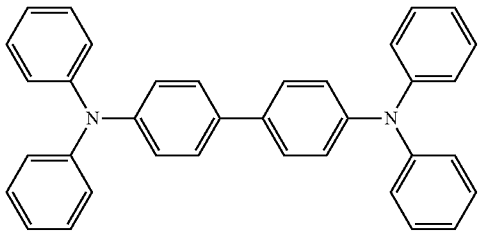

CP2

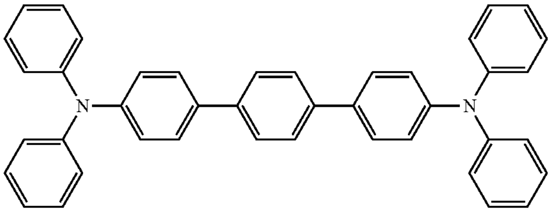

CP3

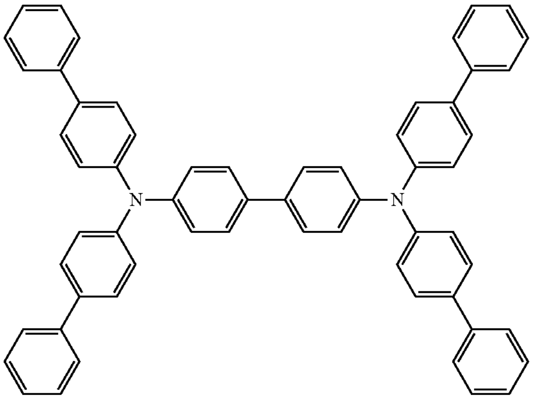

-continued

CP4

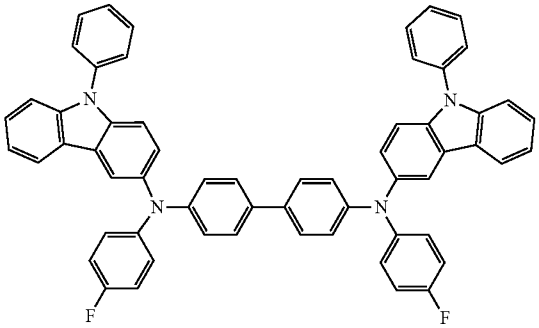

CP5

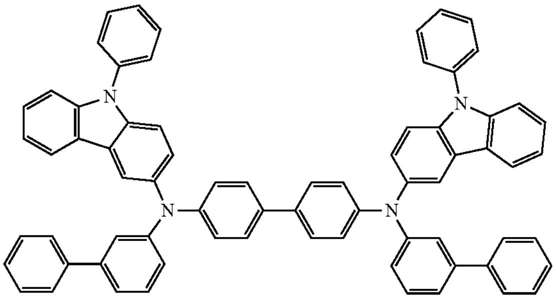

CP6

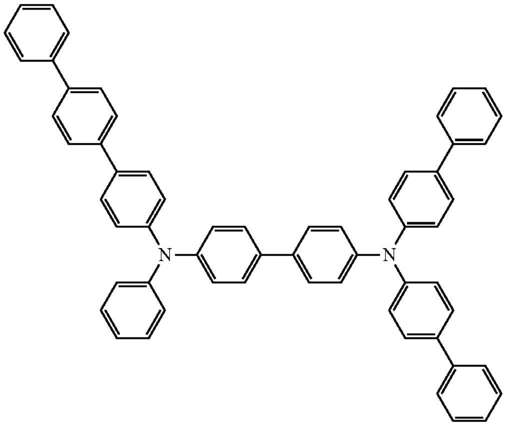

B-NPB

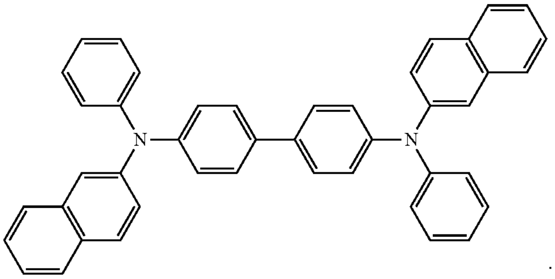

.

[Organic Light-Emitting Device]

Details of the organic light-emitting device of the electronic device are described below. In the disclosure, the organic light-emitting device may include a plurality of pixels, and one pixel may include a plurality of subpixels. The subpixels may each independently emit different colors. In the disclosure, each subpixel may be seen as a single device, and thus, may be called an organic light-emitting device. Because the first electrode, the second electrode, the hole transport region, and the electron transport region of the organic light-emitting device are commonly used with the organic photodiode, details of the optical auxiliary layer and the emission layer of the organic light-emitting device are described below.

[Optical Auxiliary Layer]

An optical auxiliary layer may adjust an optical distance for the microresonance of the organic light-emitting device. The optical auxiliary layer may be arranged between the hole transport region and the emission layer. The optical auxiliary layer may have a thickness proportional to the emission wavelength of the organic light-emitting device. For example, an optical auxiliary layer of a green organic light-emitting device having a wavelength in a range of about 500 nm to about 550 nm may have a thickness in a range of about 250 Å to about 500 Å. For example, an optical auxiliary layer of a red organic light-emitting device having a wavelength in a range of about 600 nm to about 650 nm may have a thickness in a range of about 650 Å to about 900 Å. For example, an optical auxiliary layer of a far-infrared organic light-emitting device having a wavelength in a range of about 800 nm to about 1,000 nm may have a thickness in a range of about 1,300 Å to about 1,800 Å.

Because the optical auxiliary layer is arranged between the hole transport region and the emission layer, the optical auxiliary layer may include a hole transport layer material. For example, the optical auxiliary layer may be formed of the same material as that of the hole transport layer.

[Emission Layer]

The emission layer may be a red emission layer, a green emission layer, a blue emission layer, or a white emission layer. The emission layer may have a structure consisting of a red luminescent material, a green luminescent material, or a blue luminescent material only, or a structure in which these luminescent materials are mixed.

The emission layer may have a thickness in a range of about 300 Å to about 700 Å.

The emission layer may include a host and a dopant. The dopant may include a phosphorescent dopant, a fluorescent dopant, or a combination thereof.

The amount of the dopant in the emission layer may be from about 0.01 part by weight to about 15 parts by weight based on 100 parts by weight of the host.

In one or more embodiments, the emission layer may include a quantum dot.

Meanwhile, the emission layer may include a delayed fluorescence material. The delayed fluorescence material may act as a host or a dopant in the emission layer.

Host

In an embodiment, the host may include a compound represented by Formula 301:

$$[Ar_{301}]_{xb11}\text{-}[(L_{301})_{xb1}\text{-}R_{301}]_{xb21} \quad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be as described for $Q_1$.

For example, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or a combination thereof:

Formula 301-1

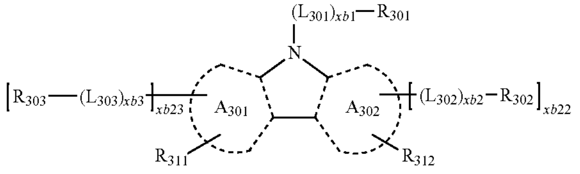

Formula 301-2

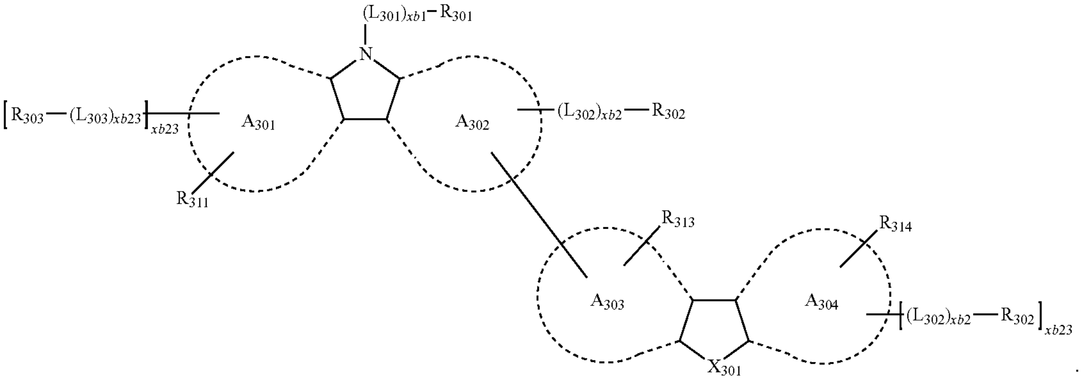

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$) ($R_{305}$), xb22 and xb23 may each independently be 0, 1, or 2, $L_{301}$, xb1, and $R_{301}$ may each be as described herein, $L_{302}$ to $L_{304}$ may each independently be as described for $L_{301}$, xb2 to xb4 may each independently be as described for xb1, and $R_{302}$ to $R_{305}$ and $R_{311}$ to $R_{314}$ may each be as described for $R_{301}$.

In one or more embodiments, the host may include an alkali earth metal complex, a post-transition metal complex, or a combination thereof. For example, the host may include a Be complex (for example, Compound H55), an Mg complex, a Zn complex, or a combination thereof.

In an embodiment, the host may include one of Compounds H1 to H126, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or a combination thereof:

H1

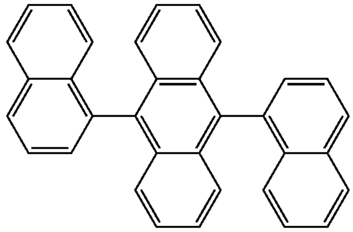

H2

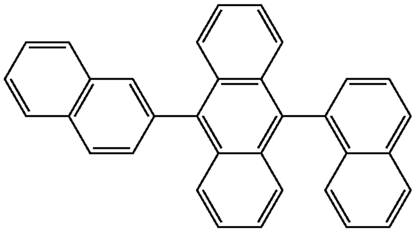

H3

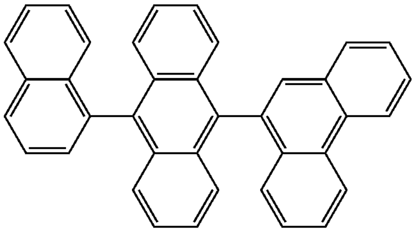

H4

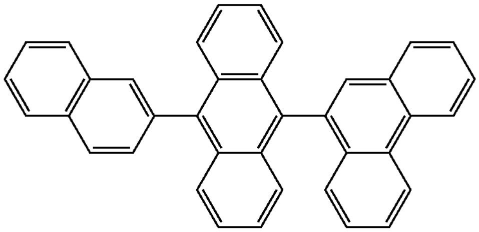

-continued

H5

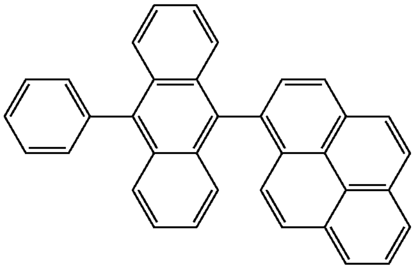

H6

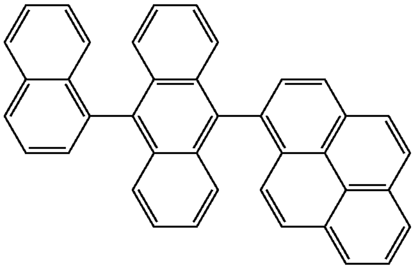

H7

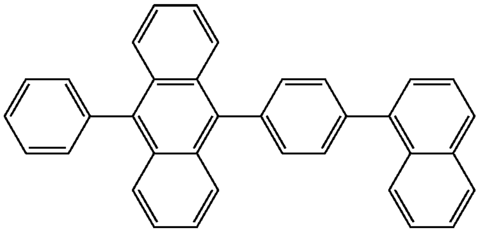

H8

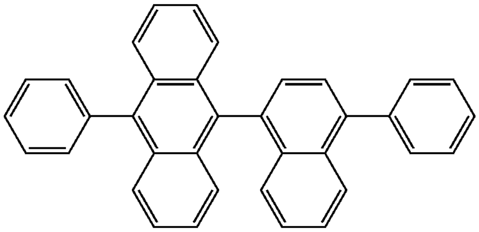

H9

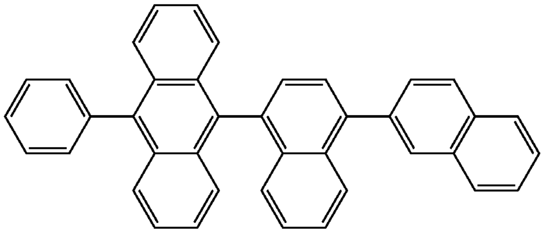

H10

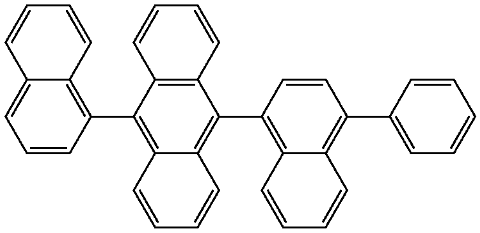

-continued
H11
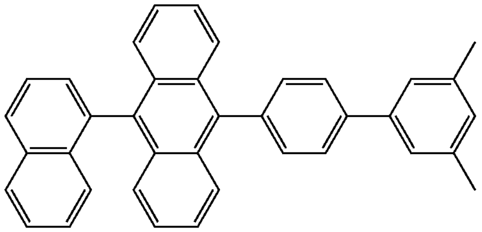
H12
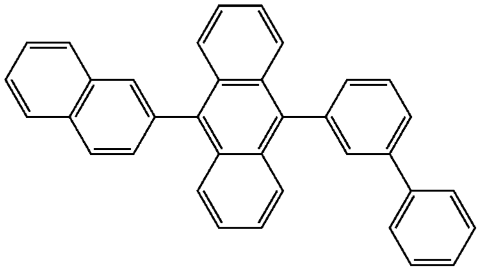
H13
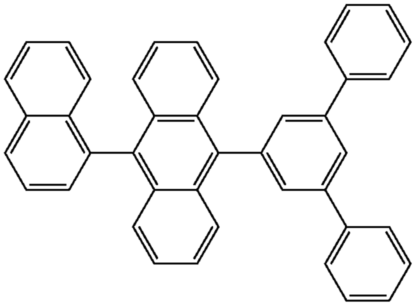
H14
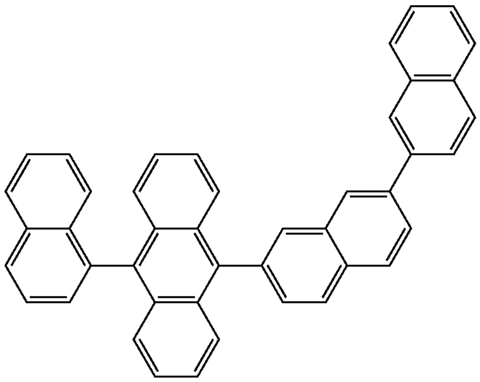
H15
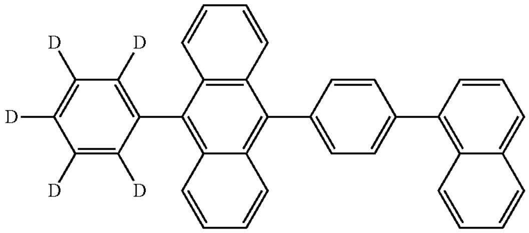
-continued
H16
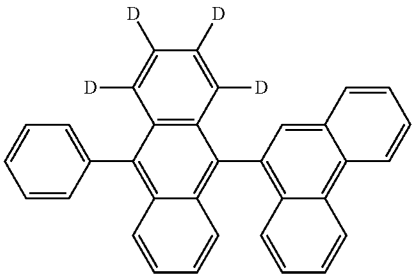
H17
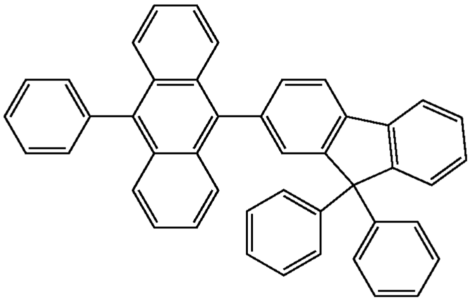
H18
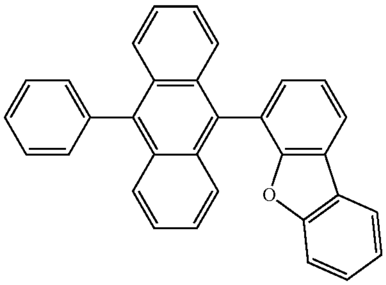
H19
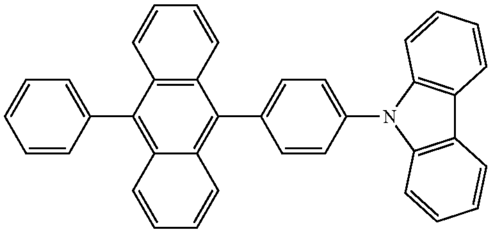
H20
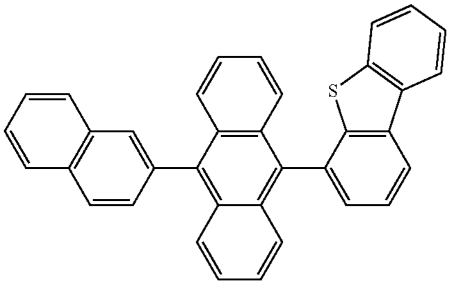

-continued
H21
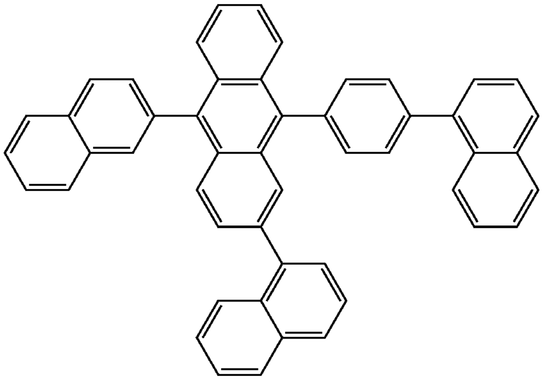
H22
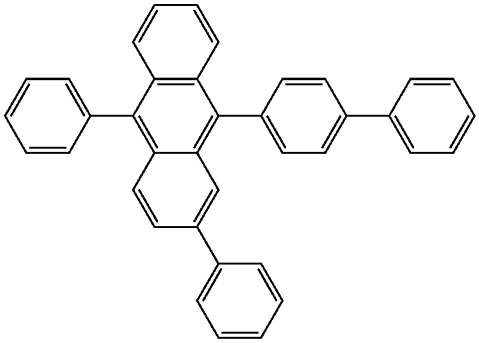
H23
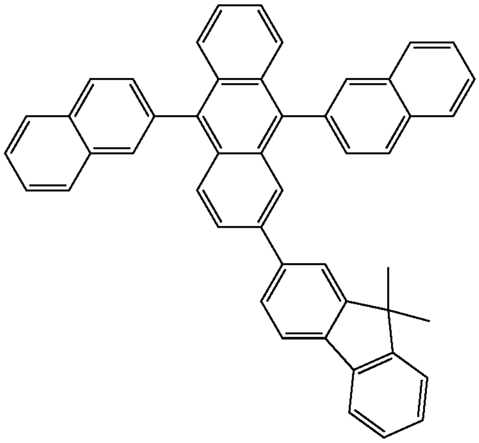
H24
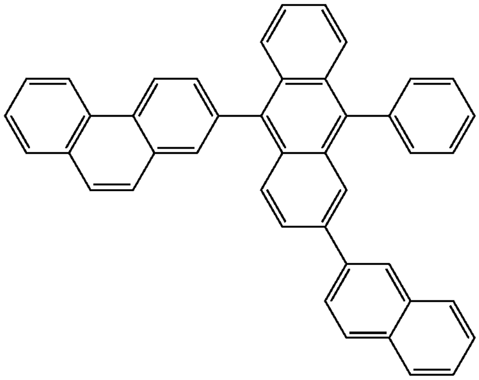
-continued
H25
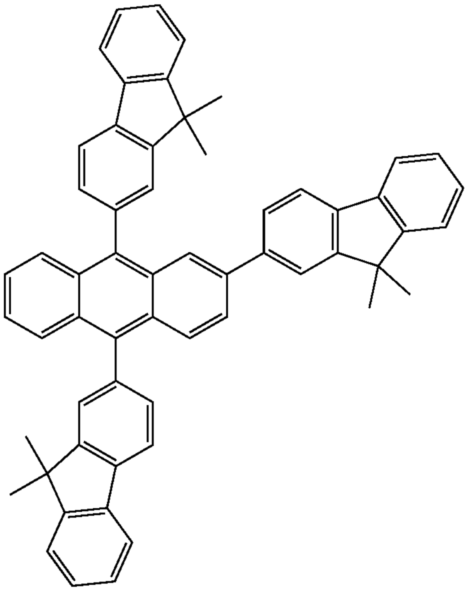
H26
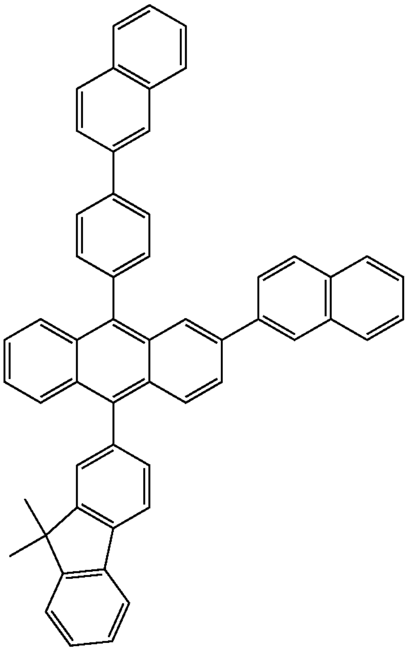

-continued
H27
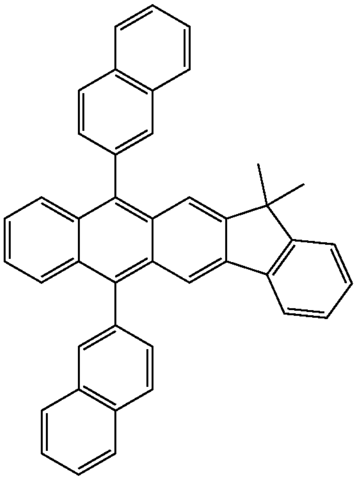
H28
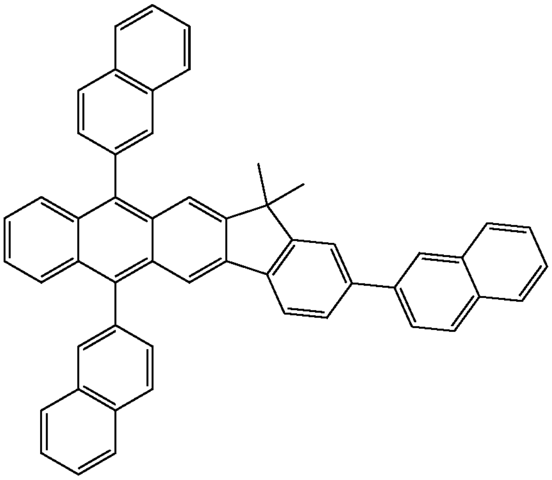
H29
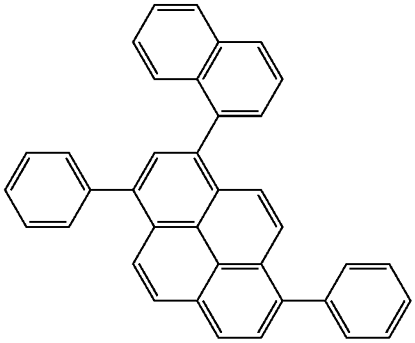
-continued
H30
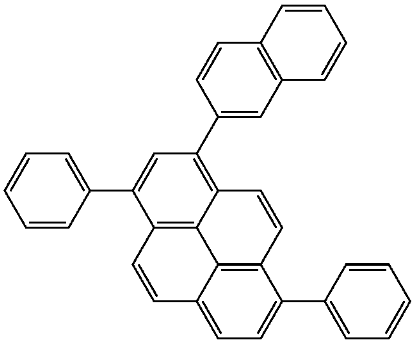
H31
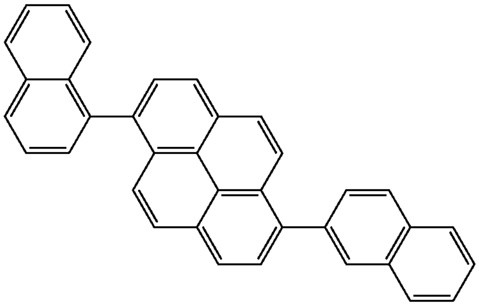
H32
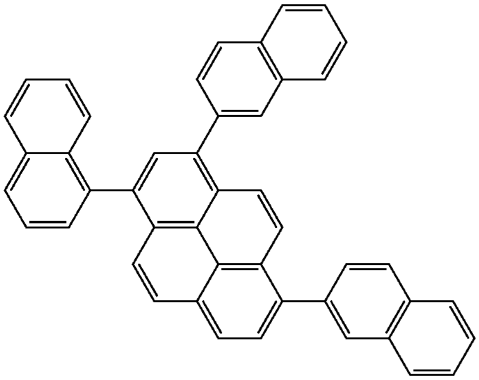
H33
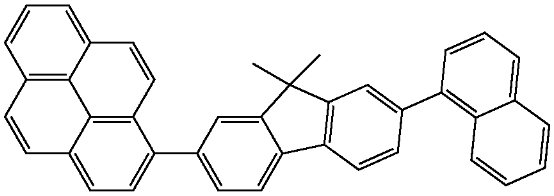
H34
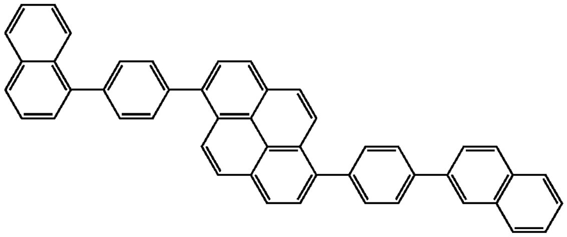

-continued
H35
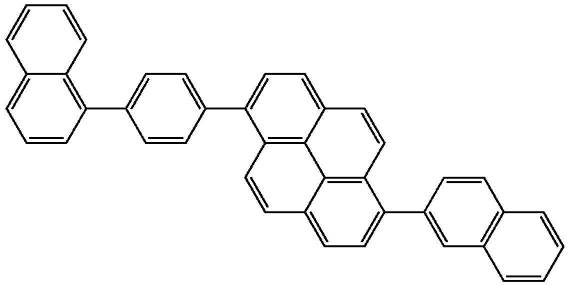
H36
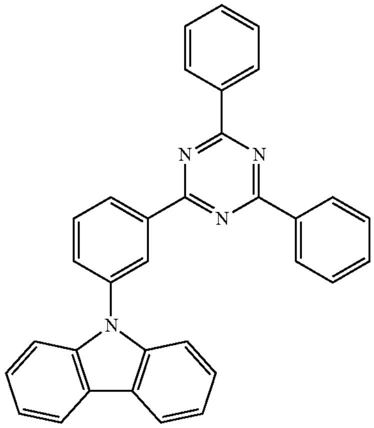
H37
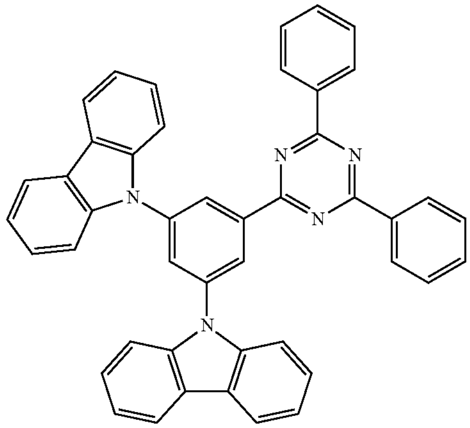
H38
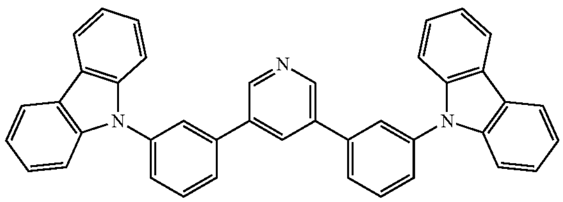
-continued
H39
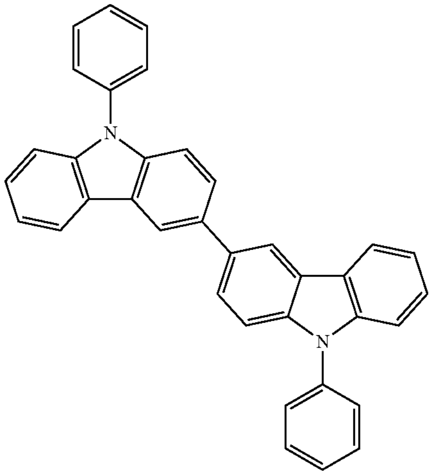
H40
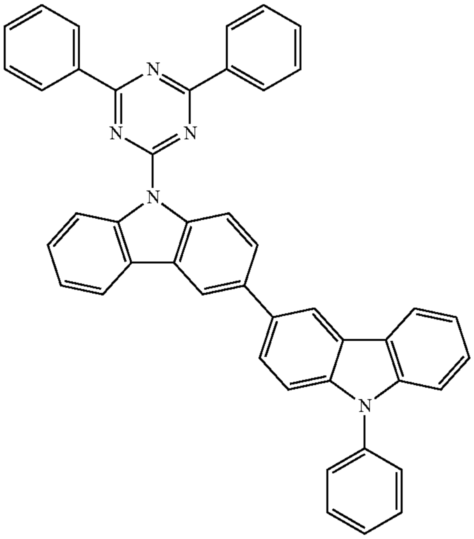
H41
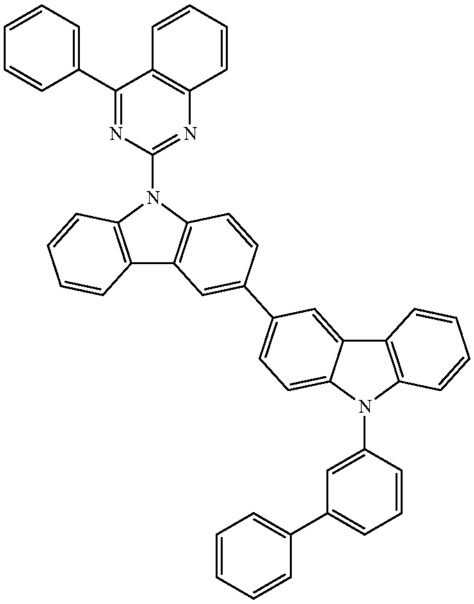

-continued
H42
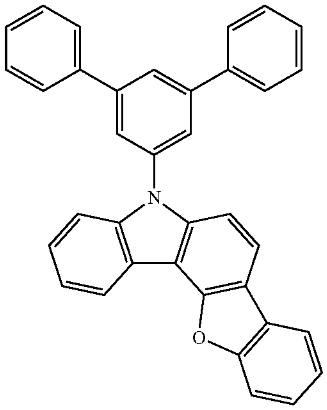
H43
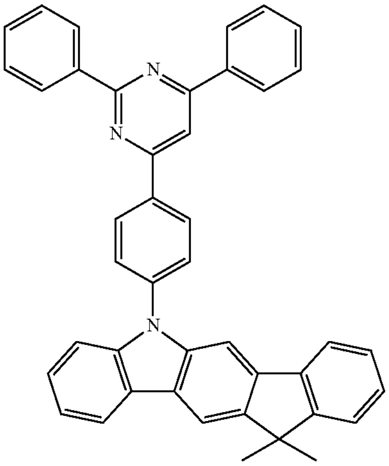
H44
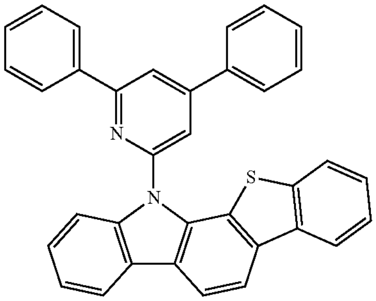
H45
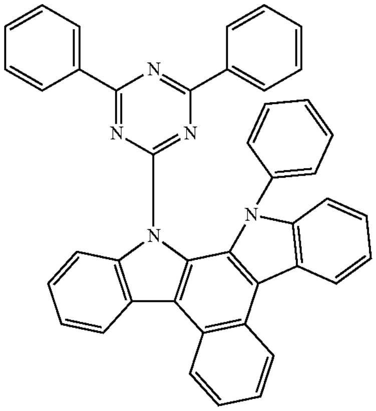
-continued
H46
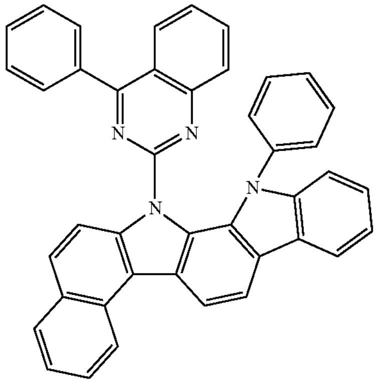
H47
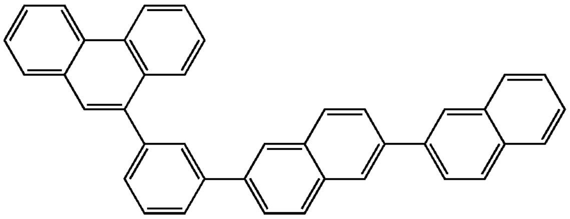
H48
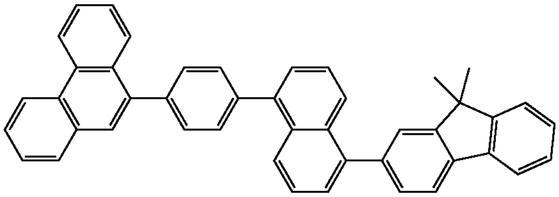
H49
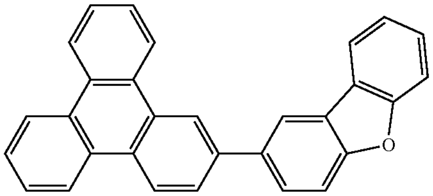
H50
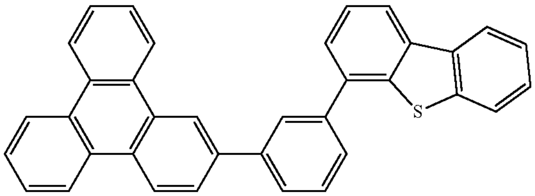
H51
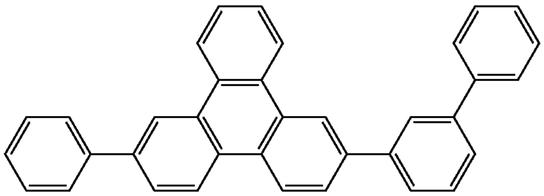

-continued
H52
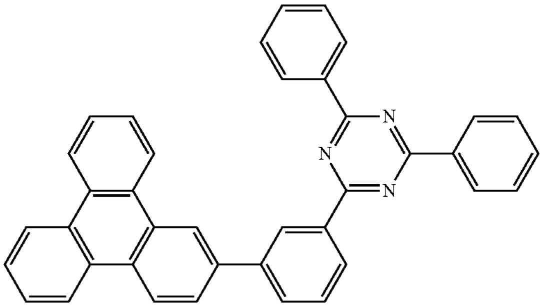
H53
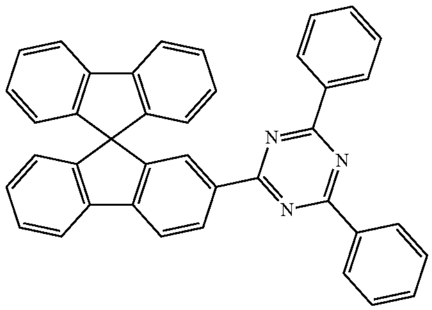
H54
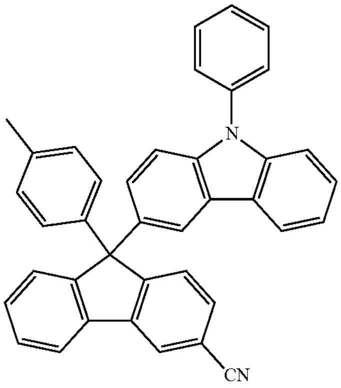
H55
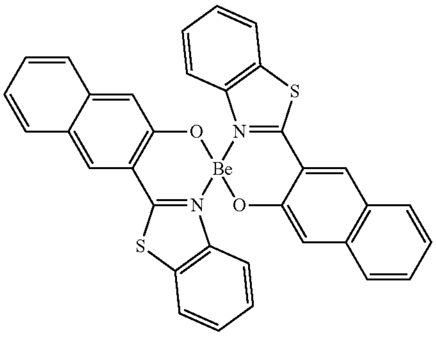
-continued
H56
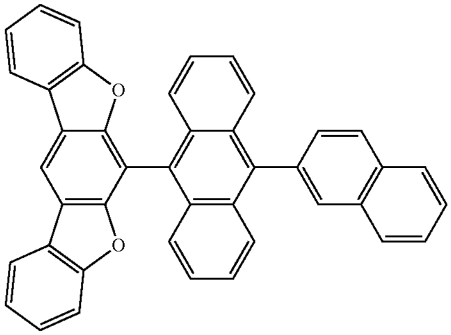
H57
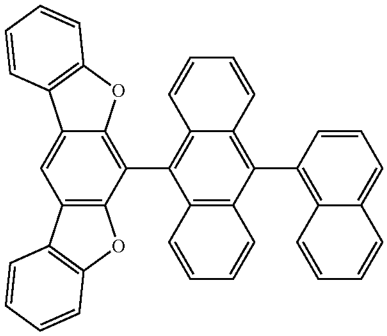
H58
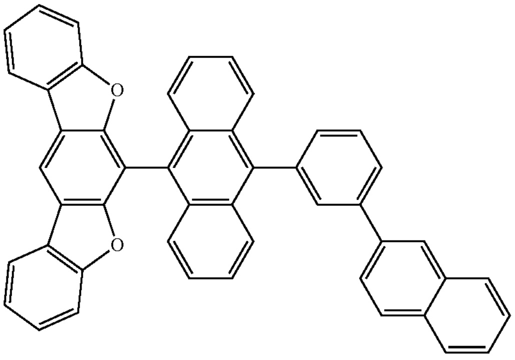
H59
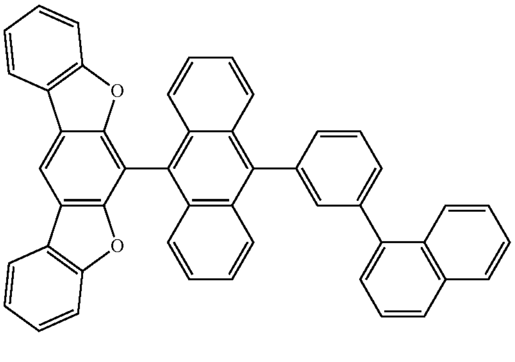

-continued
H60
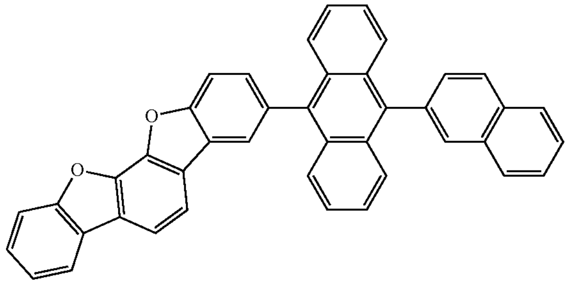
H61
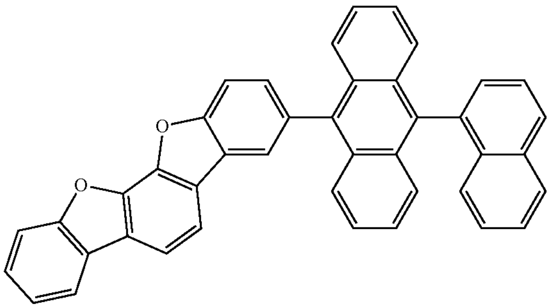
H62
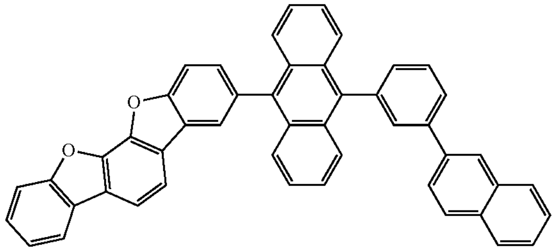
H63
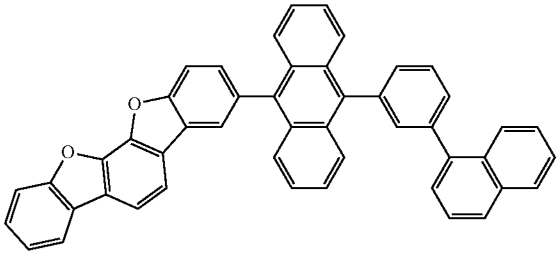
H64
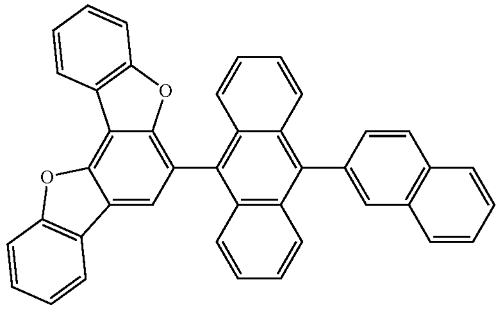
-continued
H65
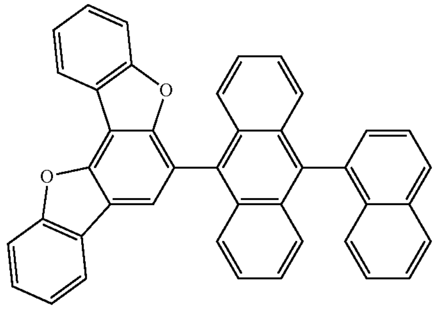
H66
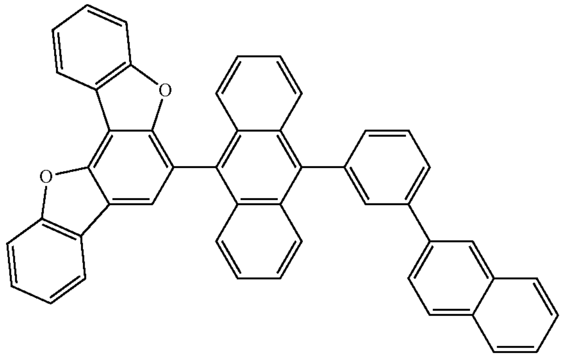
H67
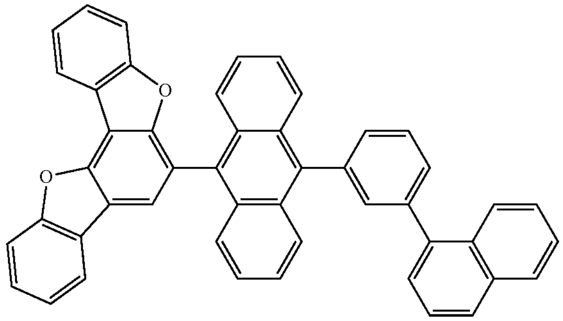
H68
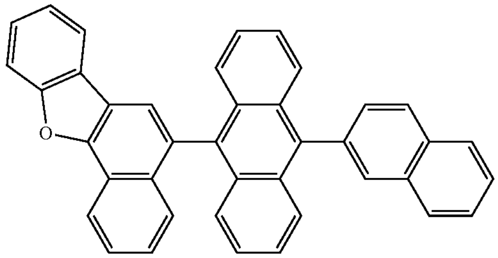
H69
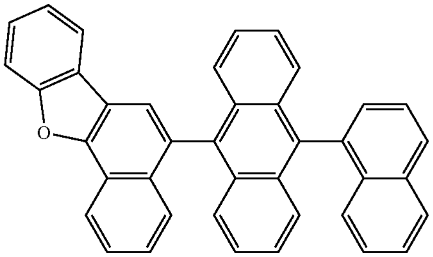

-continued
H70
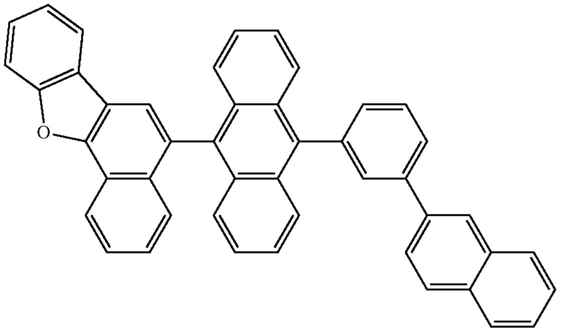
H71
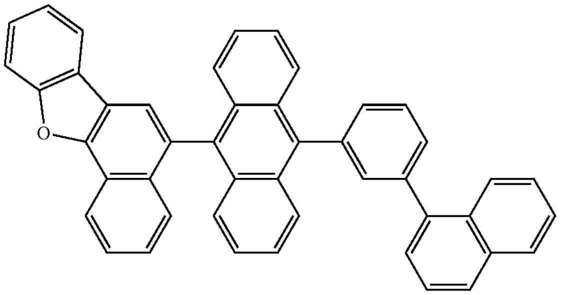
H72
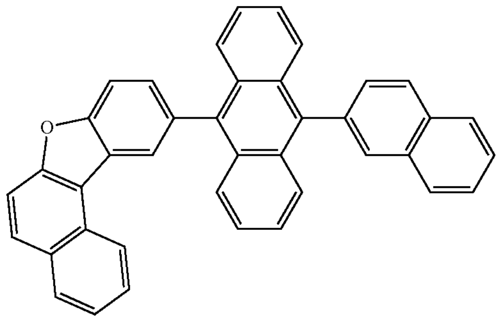
H73
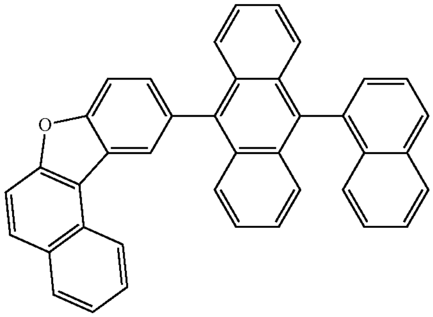
-continued
H74
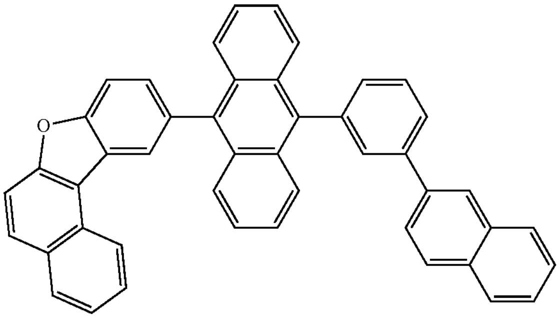
H75
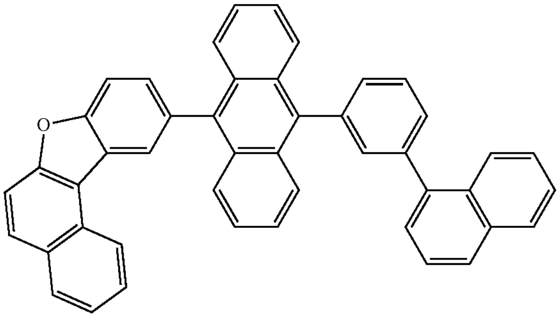
H76
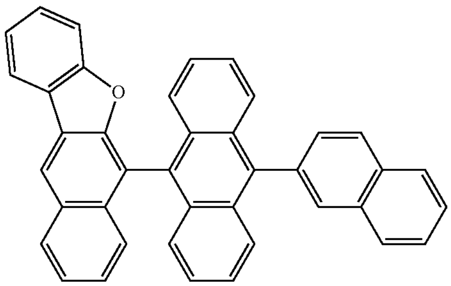
H77
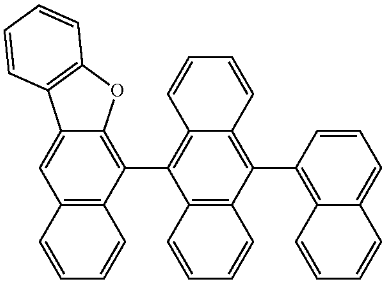
H78
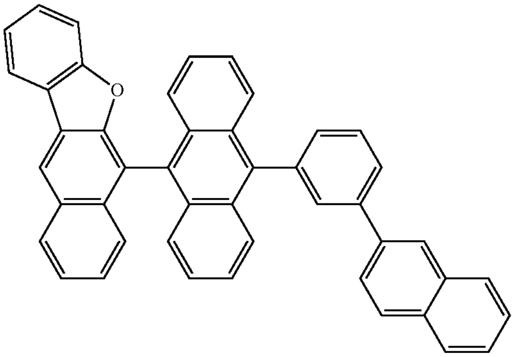

-continued
H79
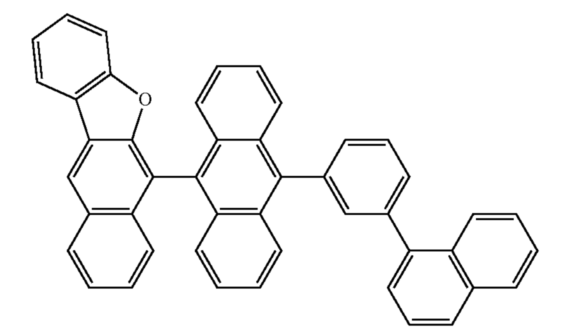
H80
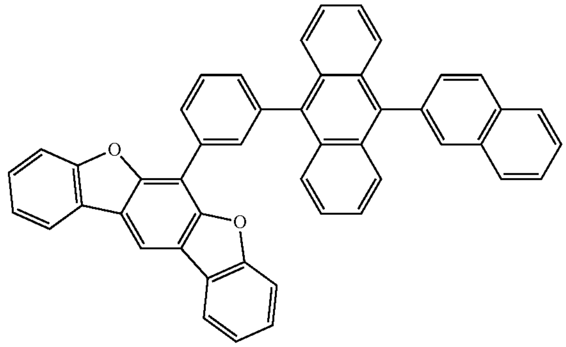
H81
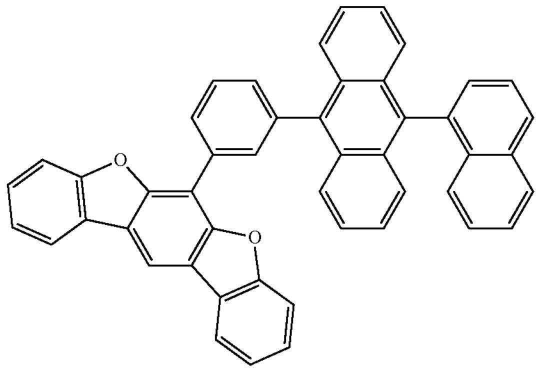
H82
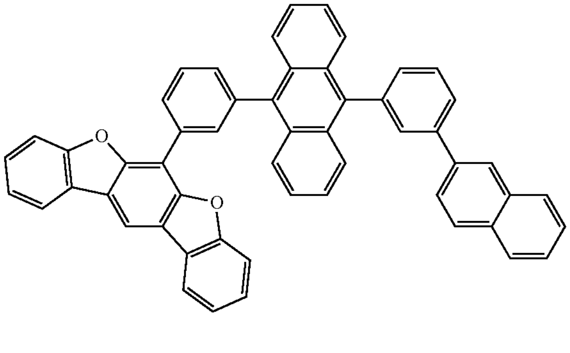
-continued
H83
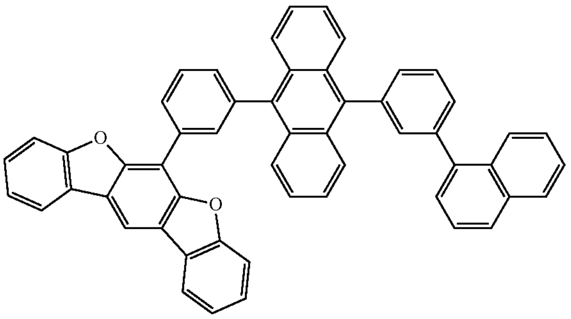
H84
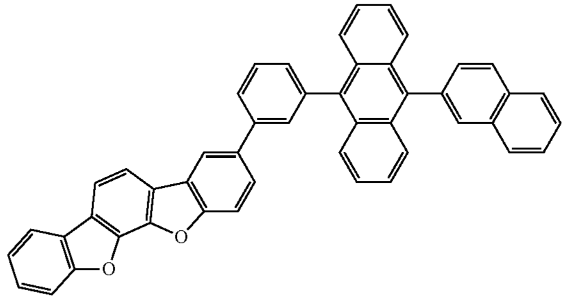
H85
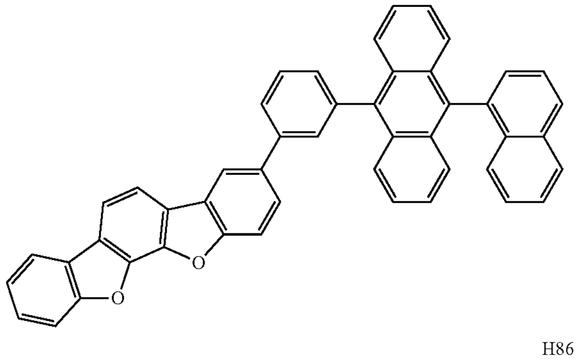
H86
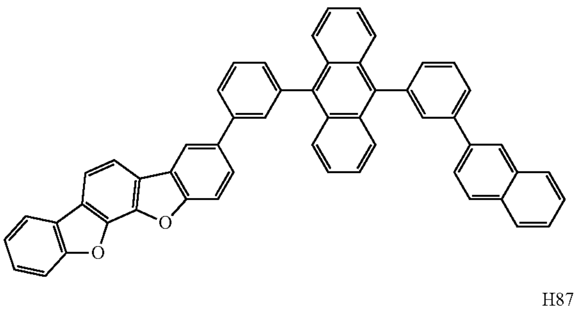
H87
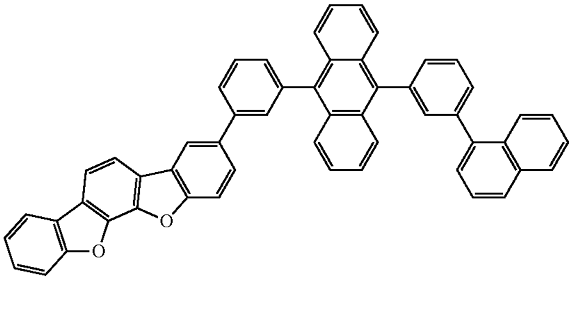

-continued
H88
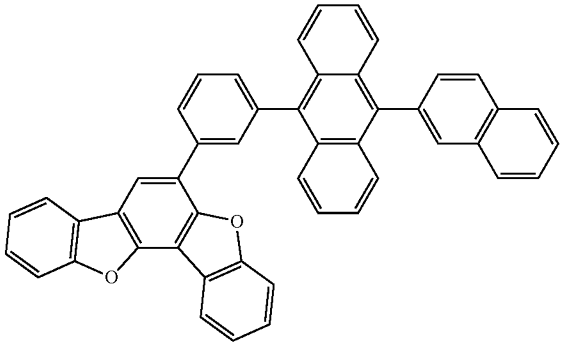
H89
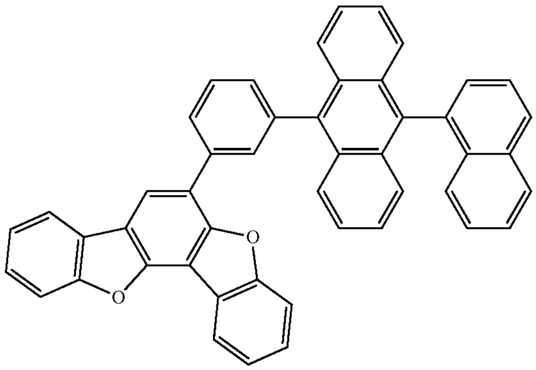
H90
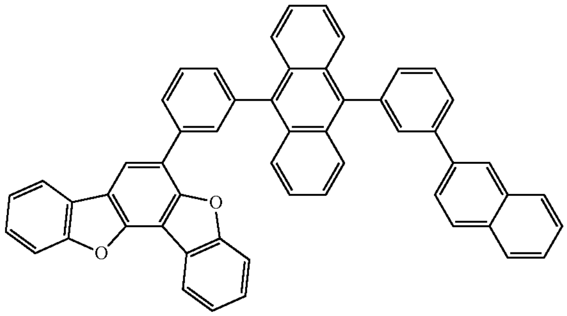
H91
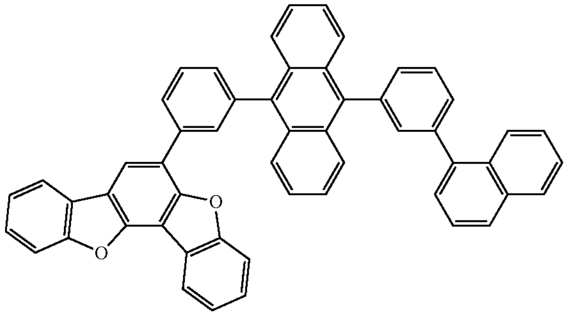
-continued
H92
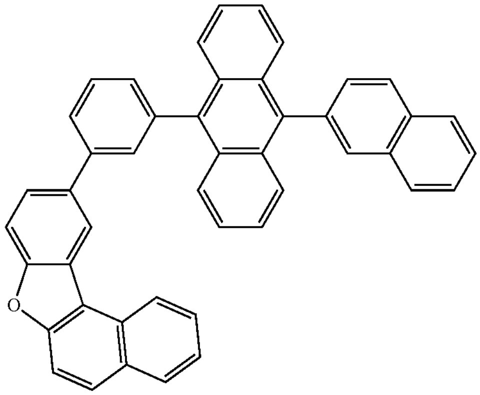
H93
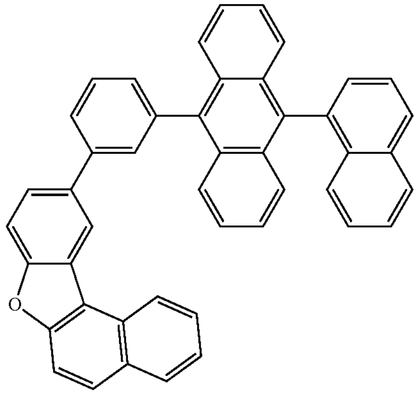
H94
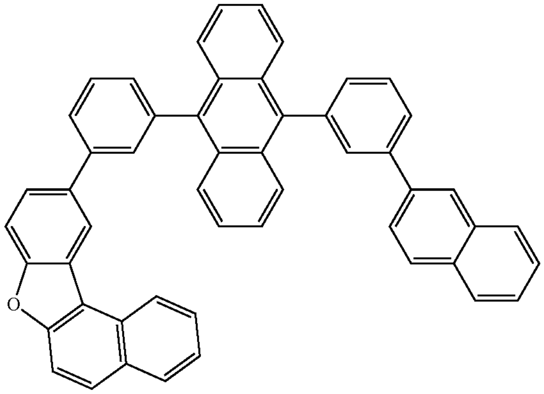
H95
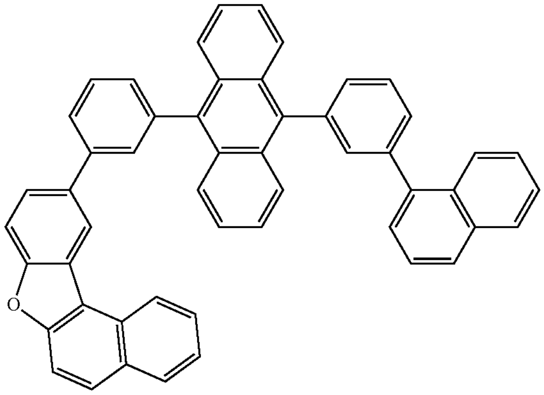

H96
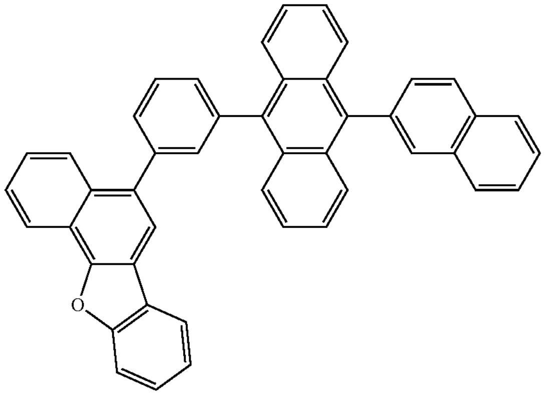
H97
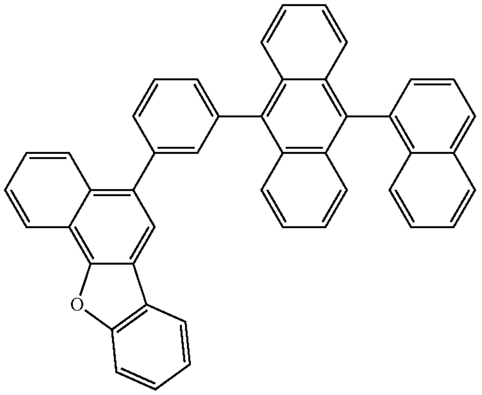
H98
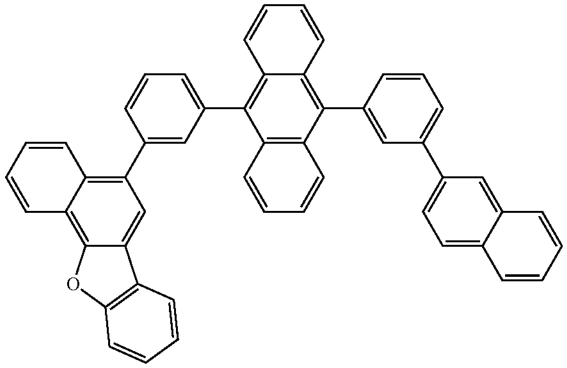
H99
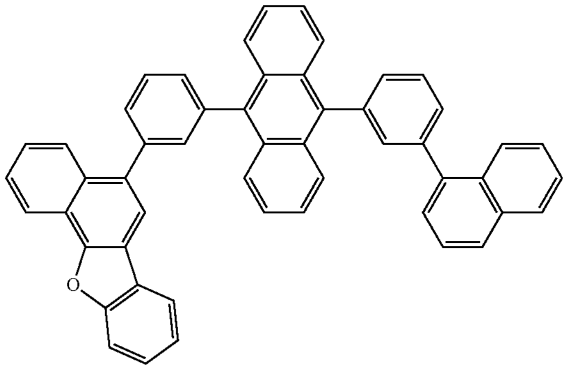
H100
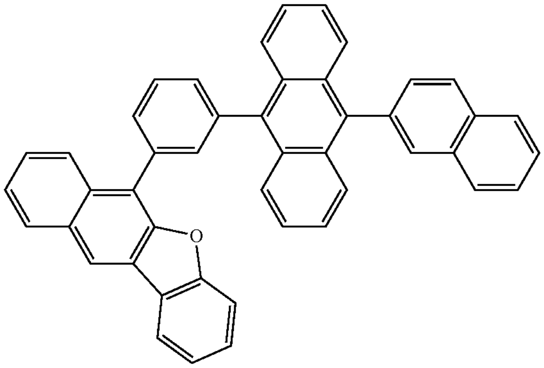
H101
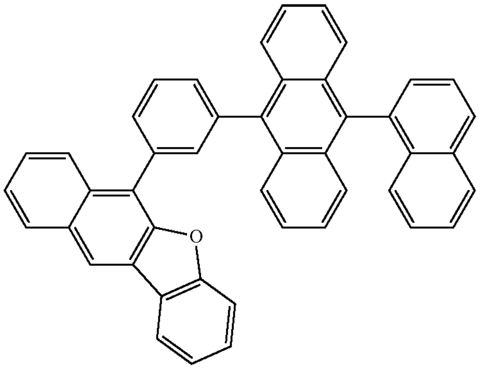
H102
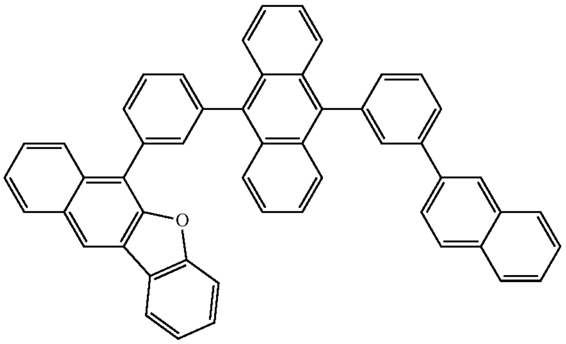
H103
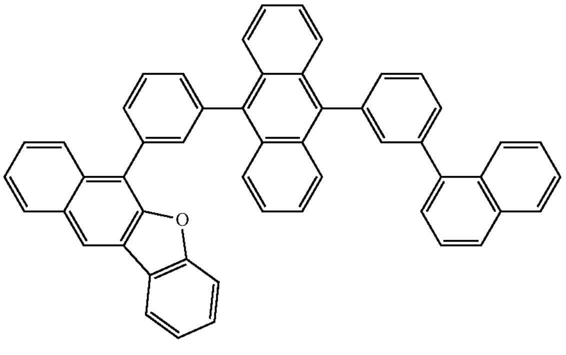

-continued
H104
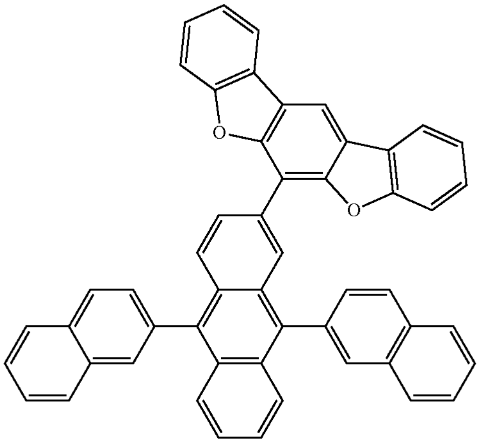
H105
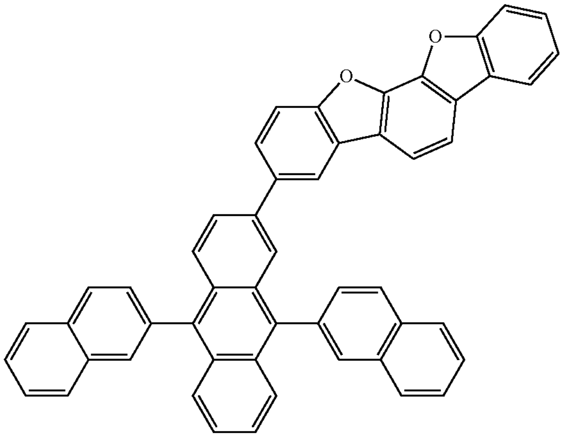
H106
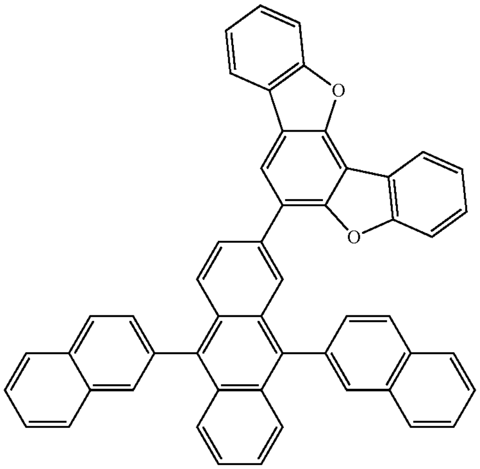
-continued
H107
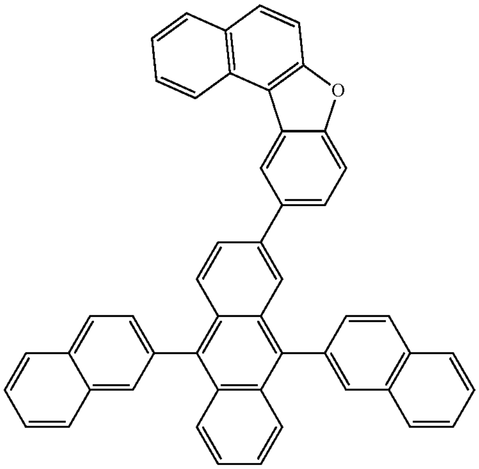
H108
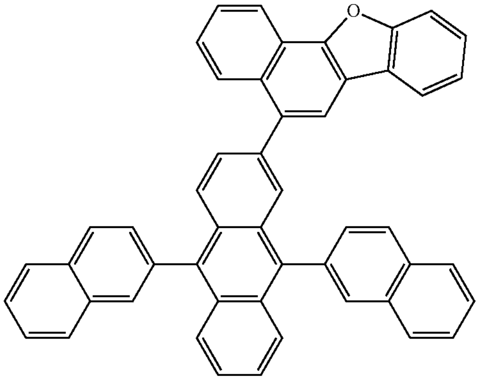
H109
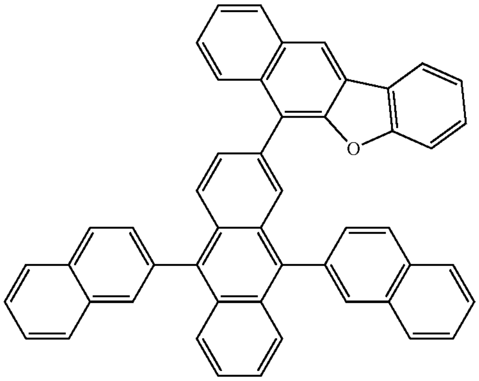
H110
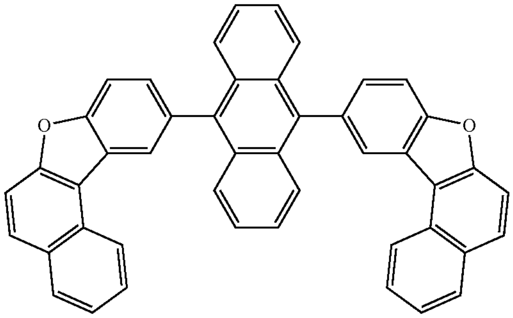

-continued
H111
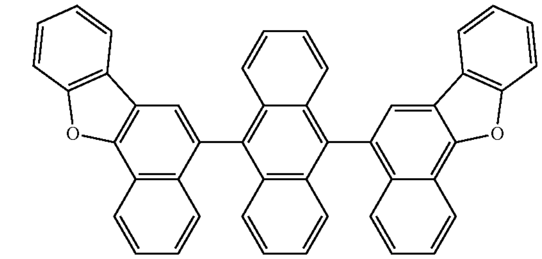
H112
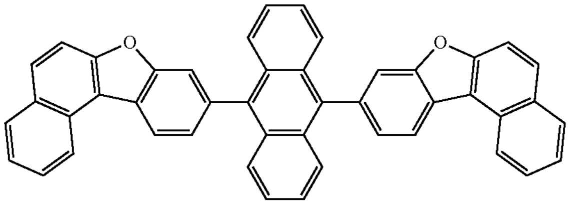
H113
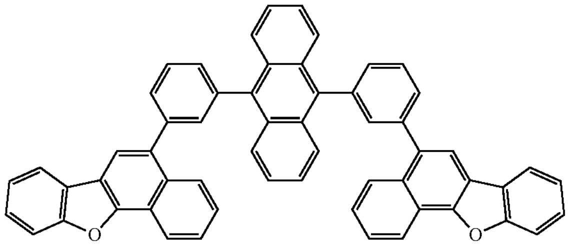
H114
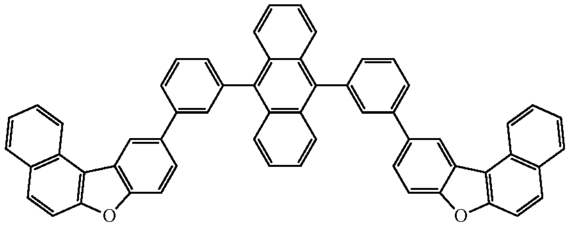
H115
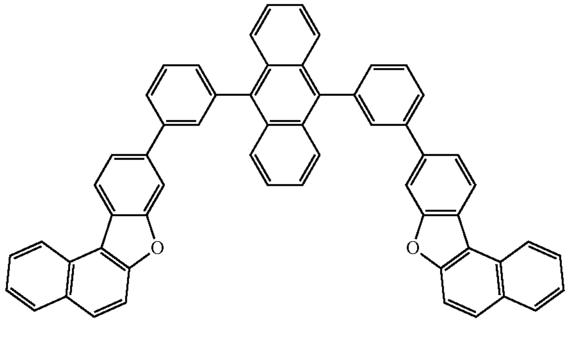
-continued
H116
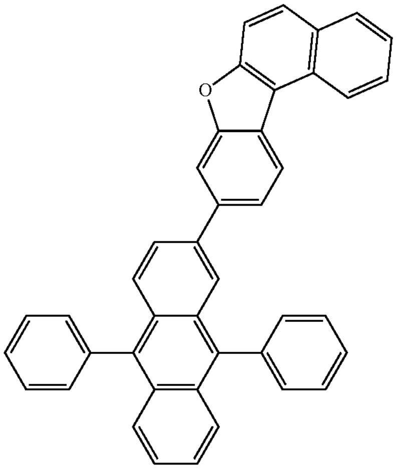
H117
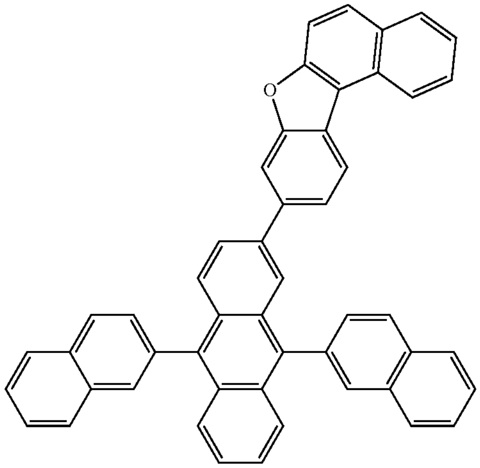
H118
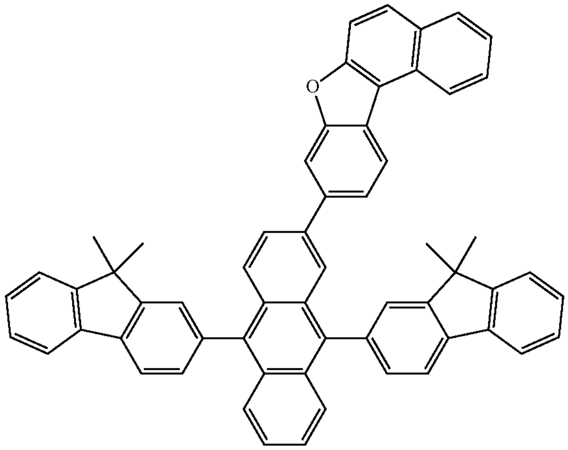

-continued
H119
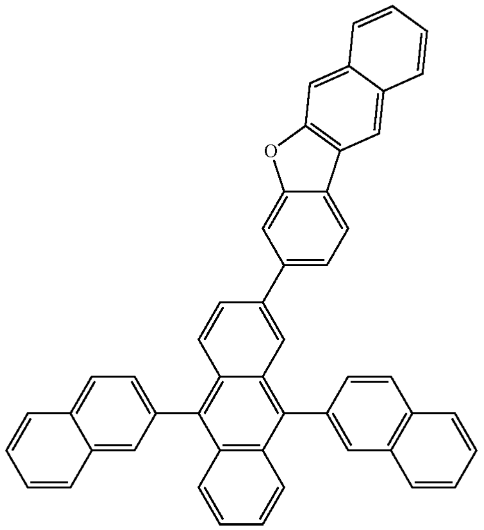
H120
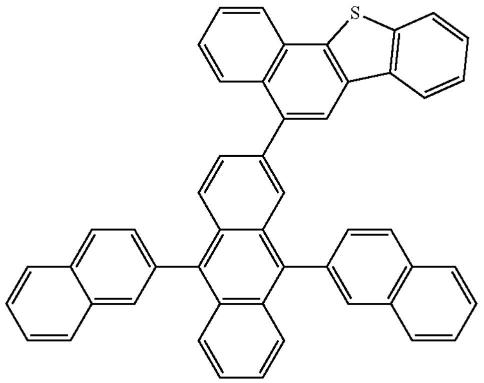
H121
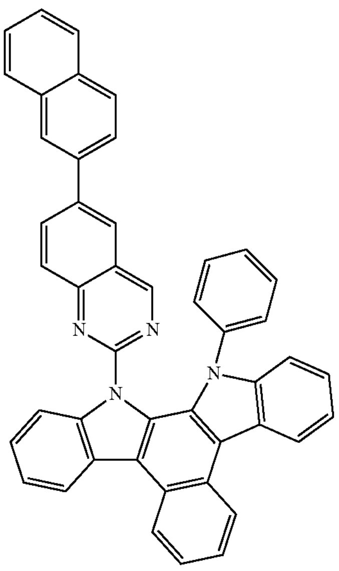
-continued
H122
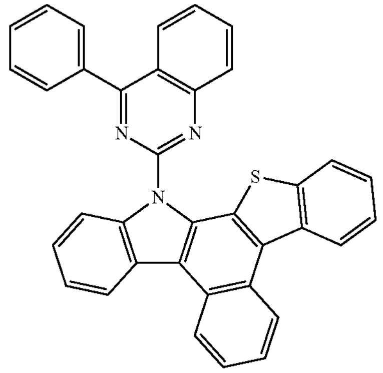
H123
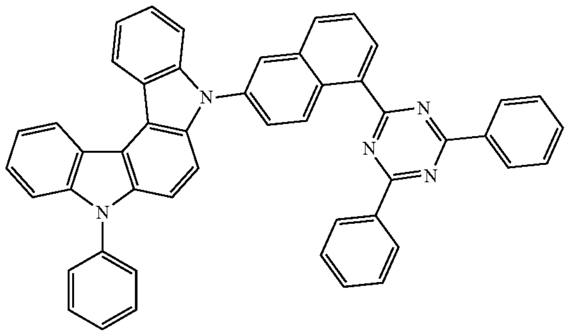
H124
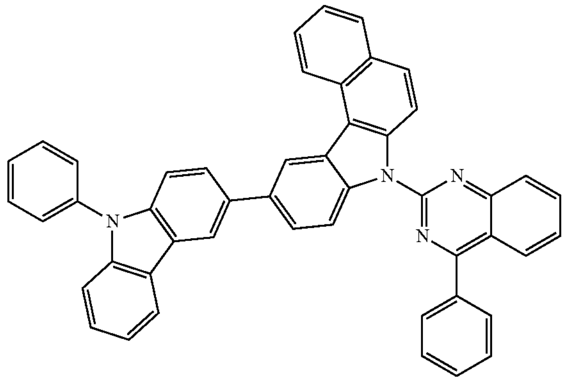
H125
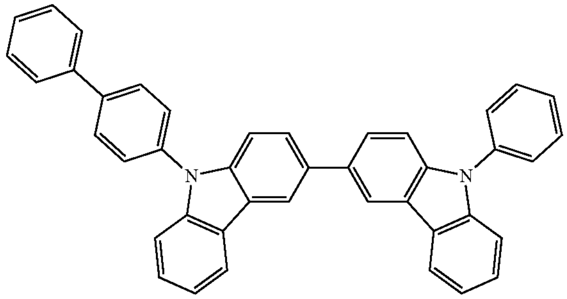

-continued

H126

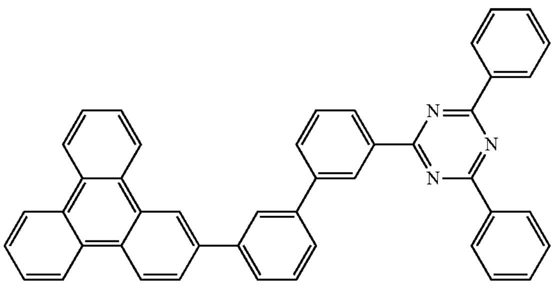

H127

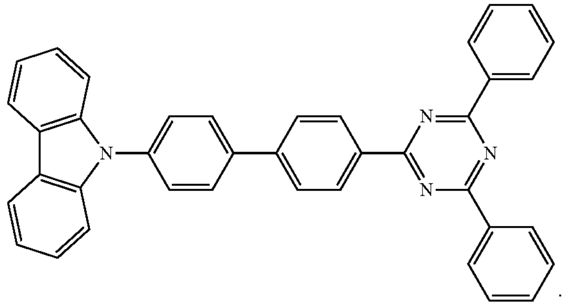

[Phosphorescent Dopant]

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or a combination thereof.

The phosphorescent dopant may be electrically neutral.

For example, the phosphorescent dopant may include an organometallic compound represented by Formula 401:

$M(L_{401})_{xc1}(L_{402})_{xc2}$ Formula 401

Formula 402

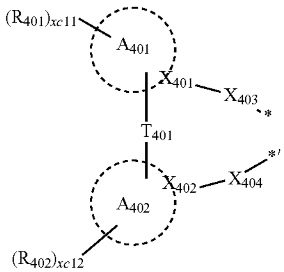

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(═O)—, —N($Q_{411}$)-, —C($Q_{411}$)($Q_{412}$)-, —C($Q_{411}$)═C($Q_{412}$)-, —C($Q_{411}$)═, or ═C($Q_{411}$)═, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be as described for $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be as described for $Q_1$, xc11 and xc12 may each independently be an integer from 0 to 10, and

* and ** in Formula 402 each indicates a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each be as described for $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or a combination thereof.

The phosphorescent dopant may include, for example, one of the following Compounds PD1 to PD40 or a combination thereof, but embodiments of the disclosure are not limited thereto:

PD1

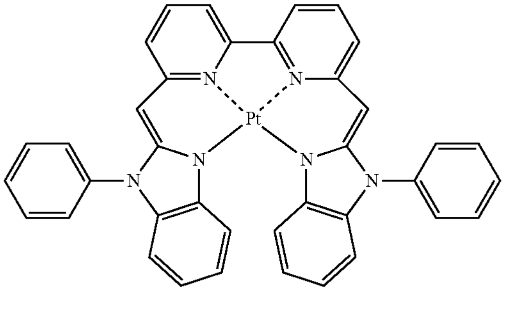

-continued
PD2
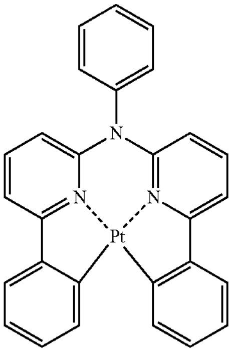
PD3
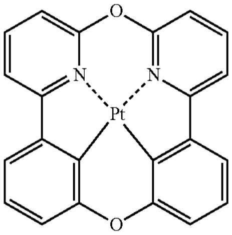
PD4
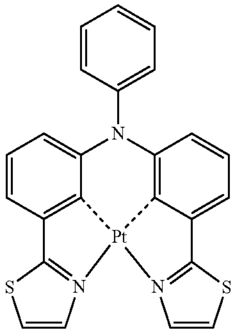
PD5
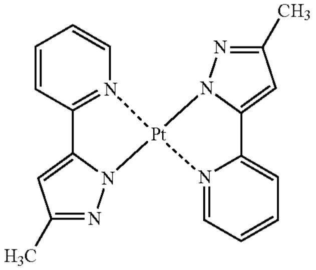
PD6
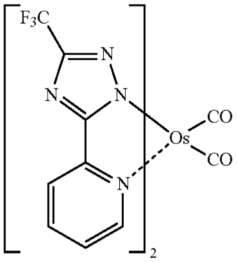
-continued
PD7
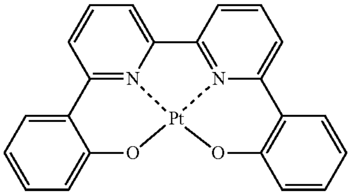
PD8
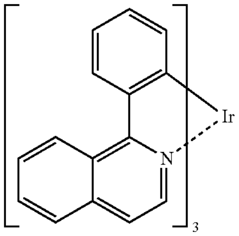
PD9
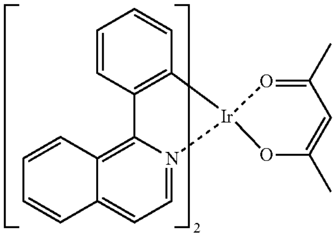
PD10
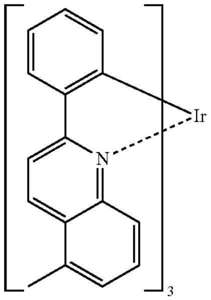
PD11
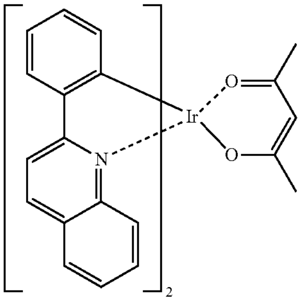

-continued
PD12
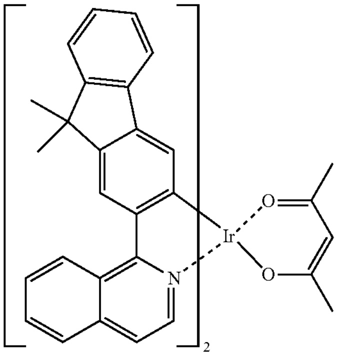
PD13
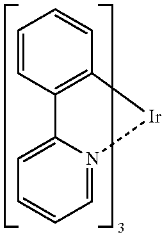
PD14
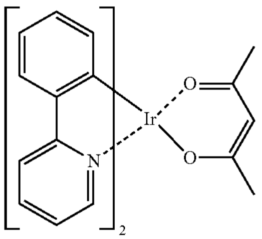
PD15
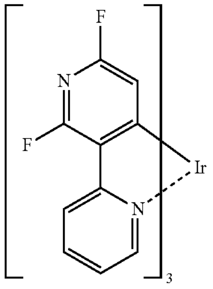
PD16
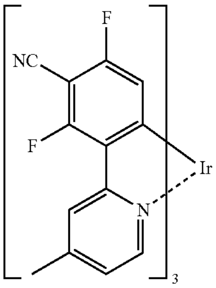
-continued
PD17
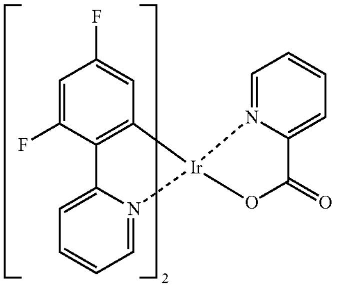
PD18
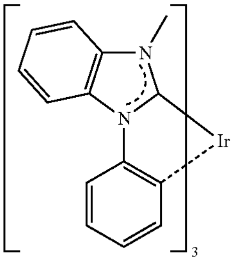
PD19
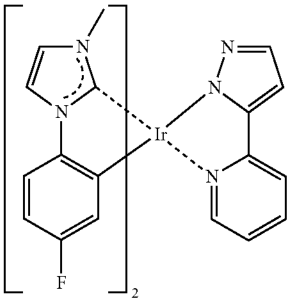
PD20
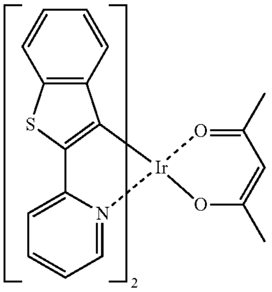
PD21
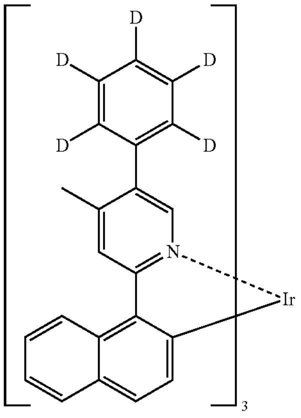

-continued
PD22
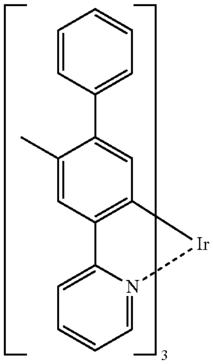
PD23
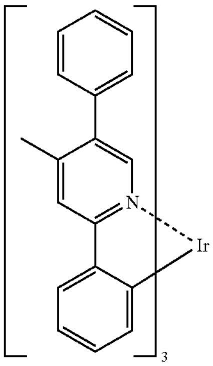
PD24
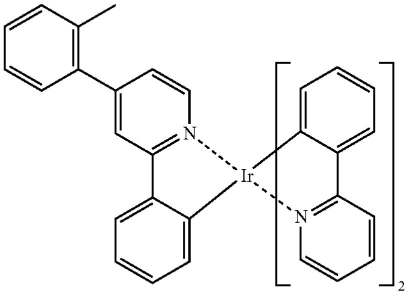
PD25
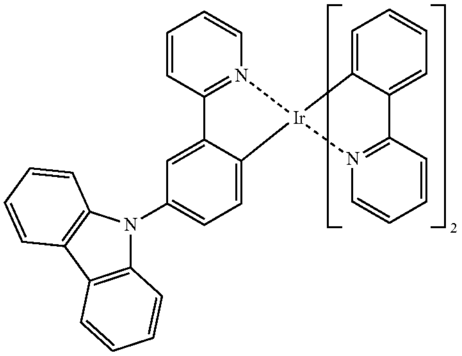
-continued
PD26
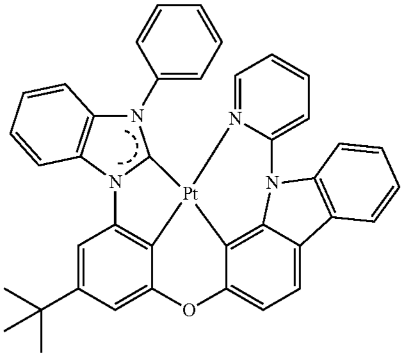
PD27
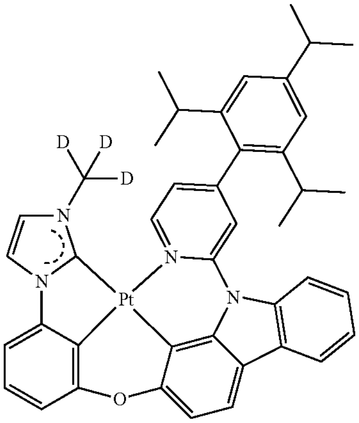
PD28
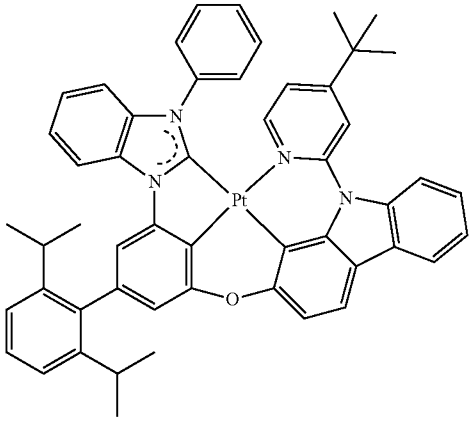
PD29
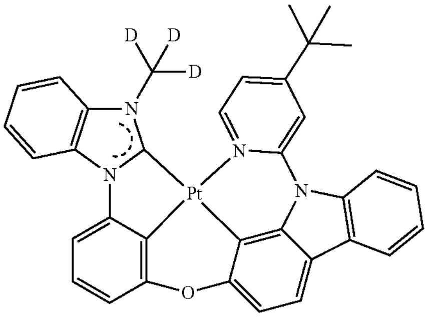

-continued
PD30
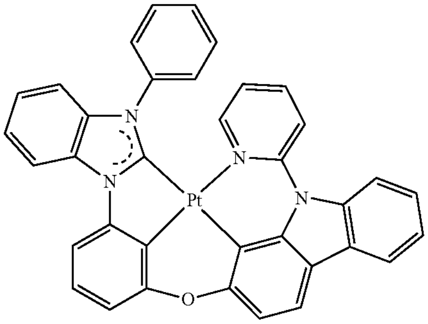
PD31
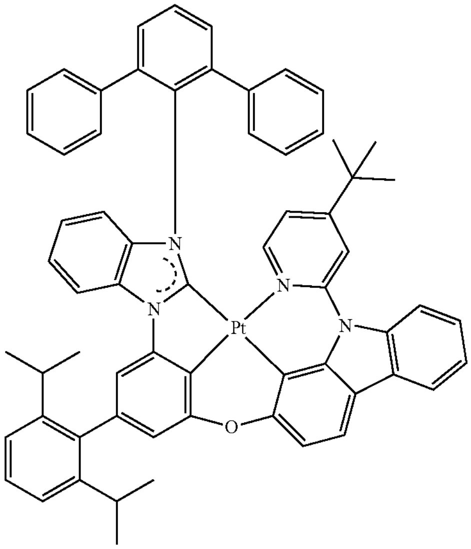
PD32
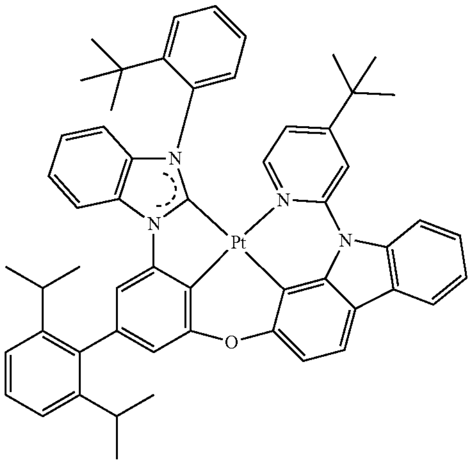
-continued
PD33
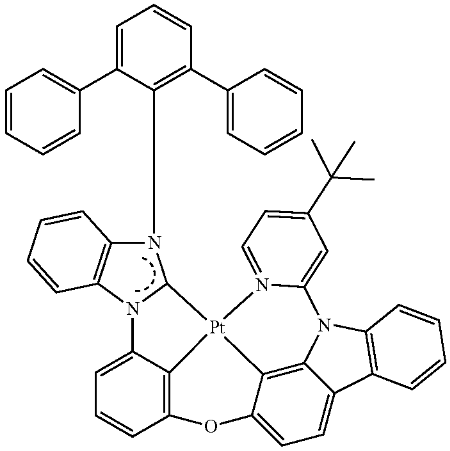
PD34
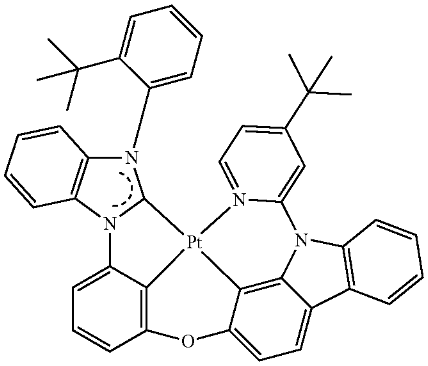
PD35
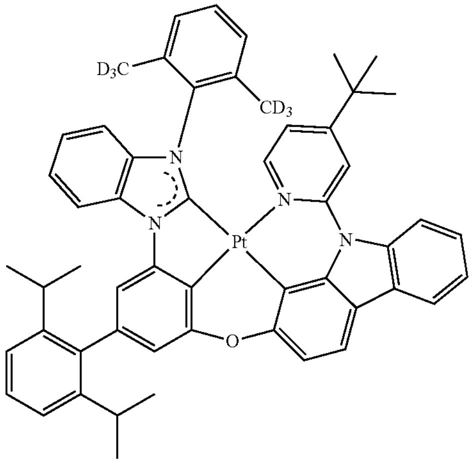

-continued
PD36
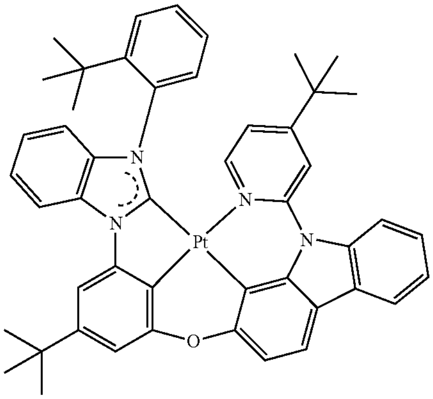
PD37
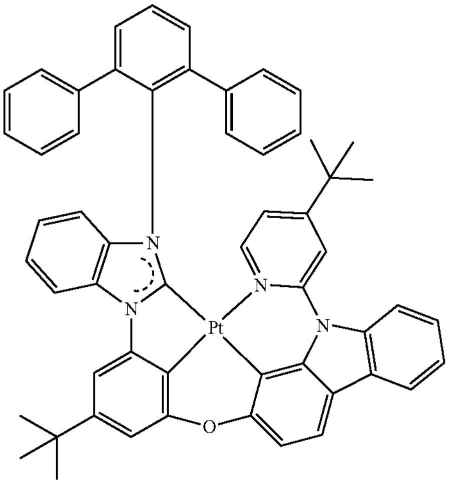
PD38
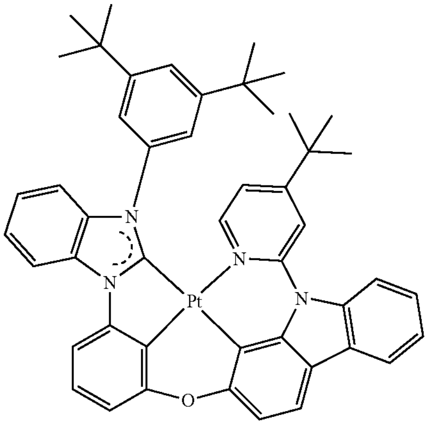
-continued
PD39
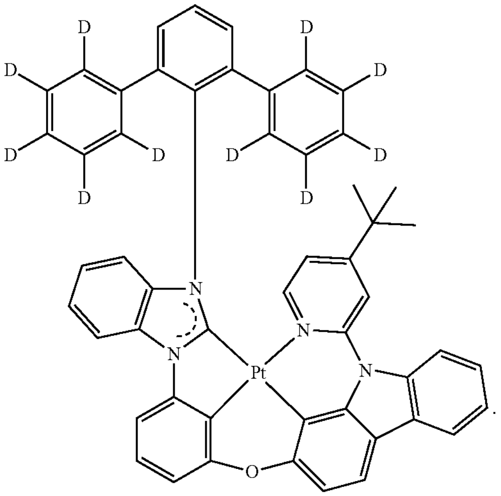
PD40
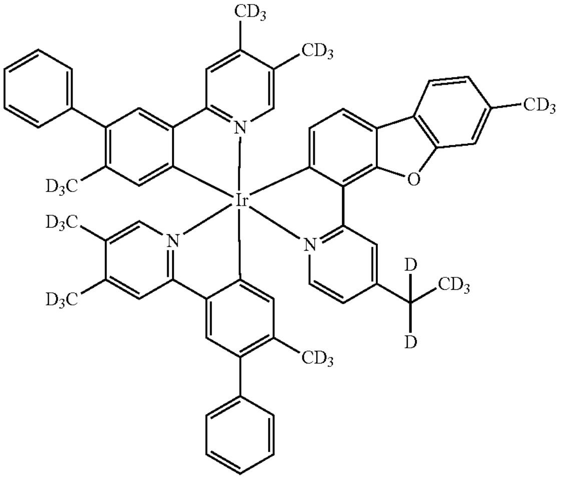
PD41
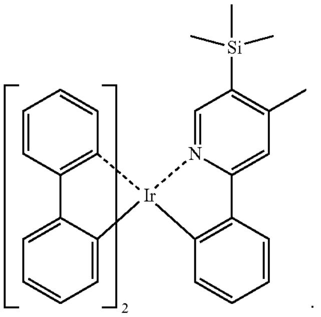
[Fluorescent Dopant]
The fluorescent dopant may include an amine group-containing compound, a styryl group-containing compound, or a combination thereof.
For example, the fluorescent dopant may include a compound represented by Formula 501:

Formula 501

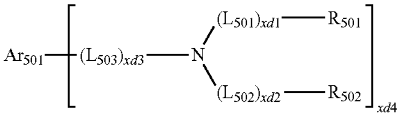

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, the fluorescent dopant may include: one of Compounds FD1 to FD36; DPVBi; DPAVBi; or a combination thereof:

FD1

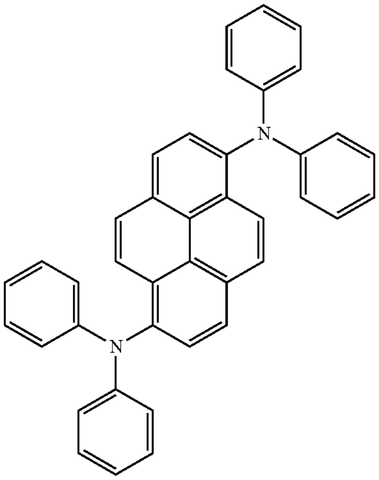

FD2

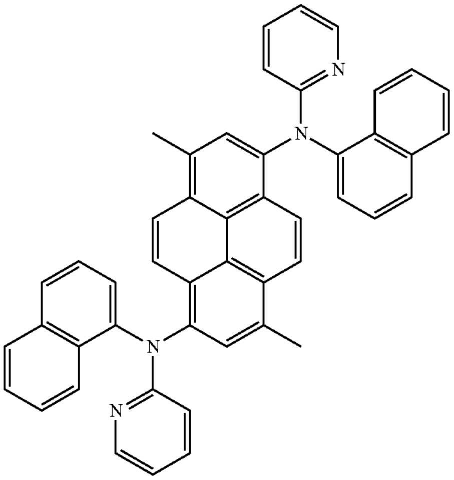

FD3

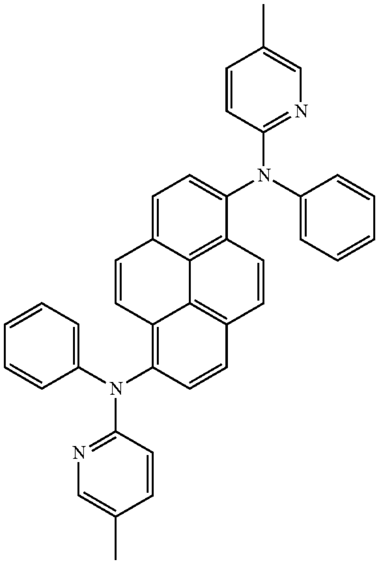

FD4

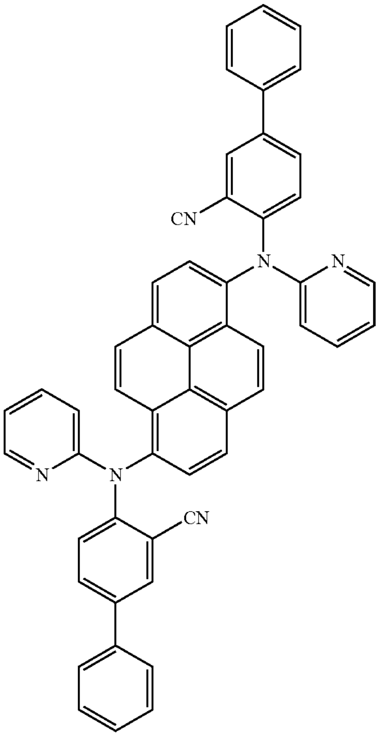

-continued
FD5
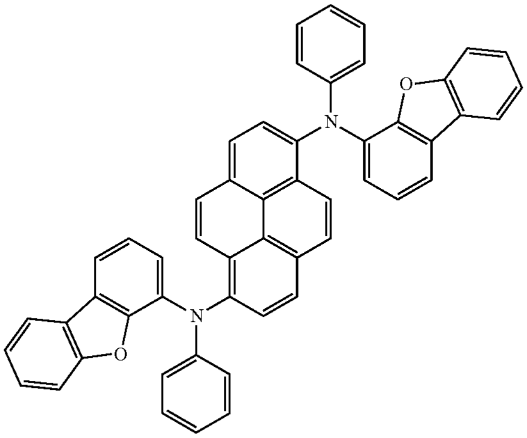
FD6
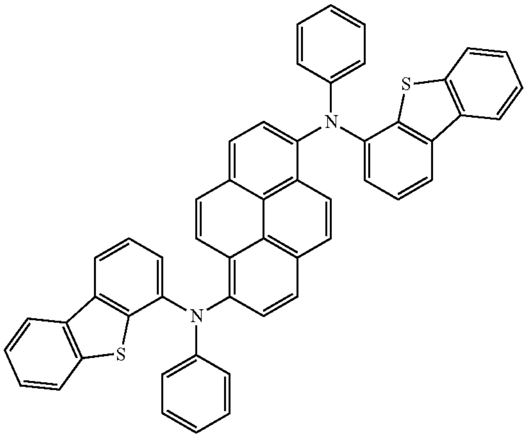
FD7
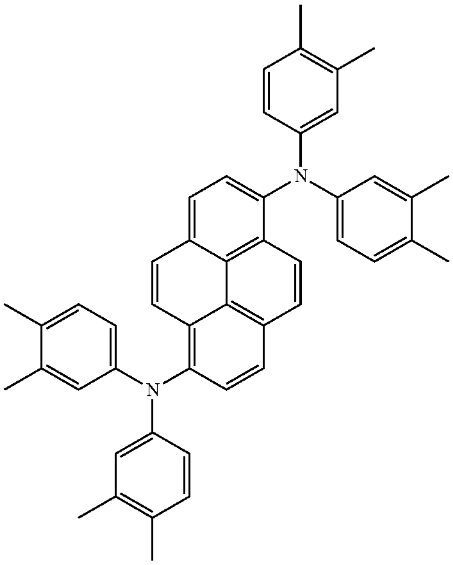
FD8
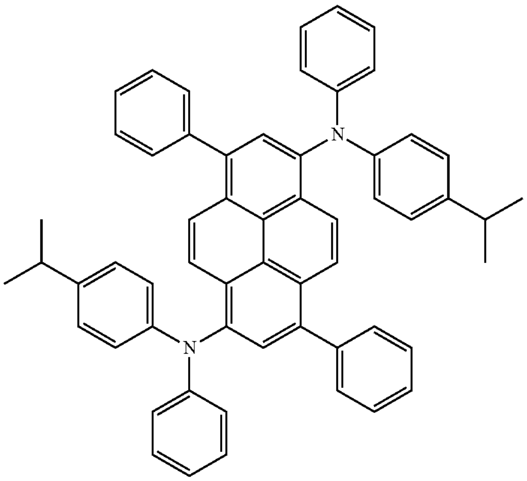
FD9
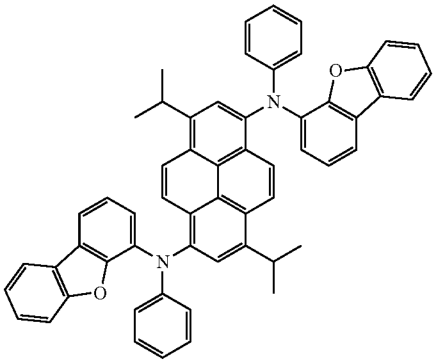
FD10
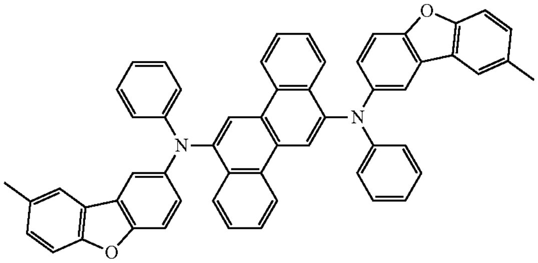

-continued
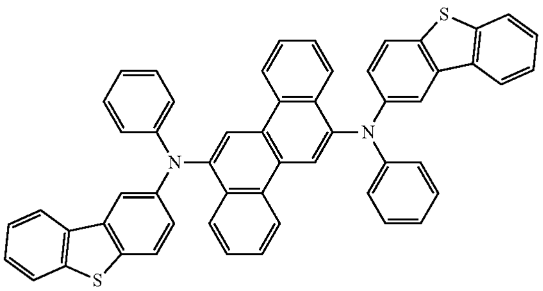
FD11
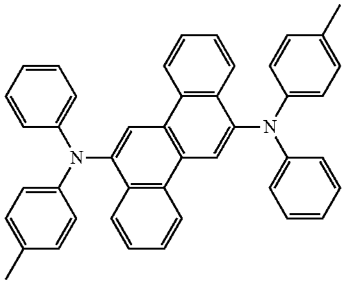
FD12
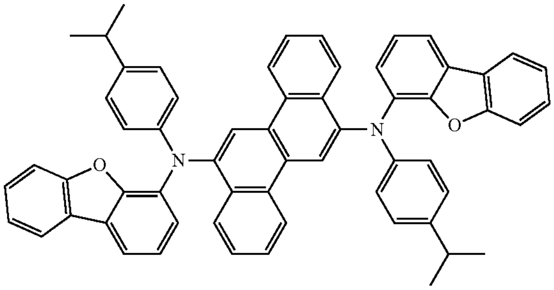
FD13
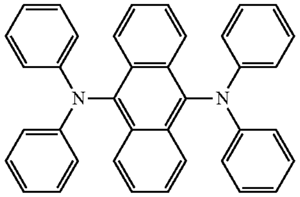
FD14
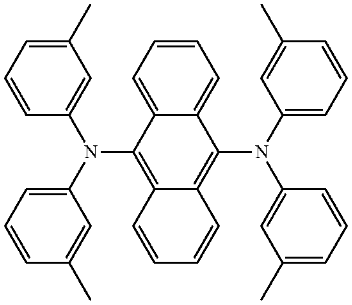
FD15
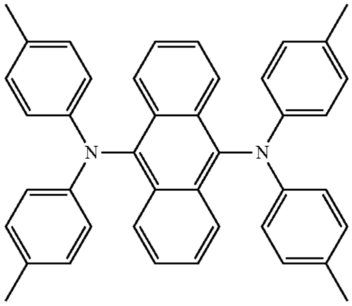
FD16
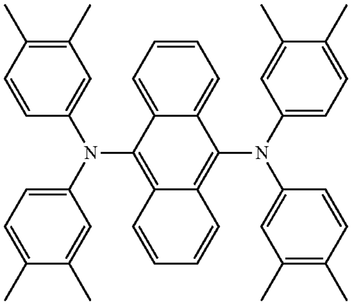
FD17
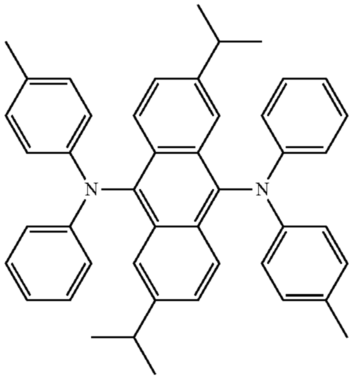
FD18

-continued
FD19
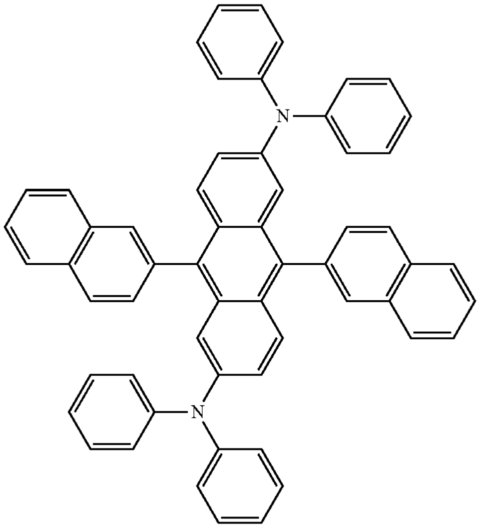
FD20
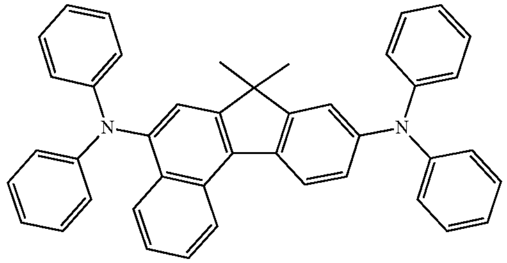
FD21
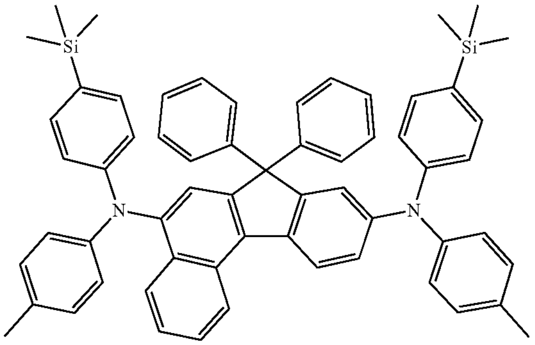
FD22
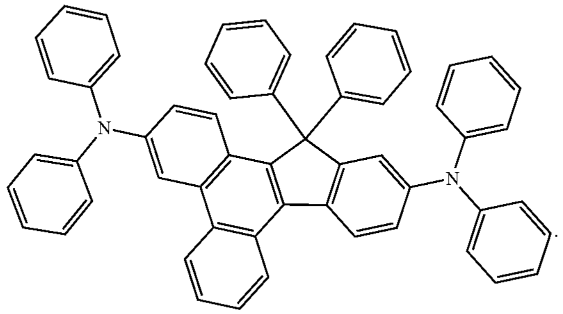
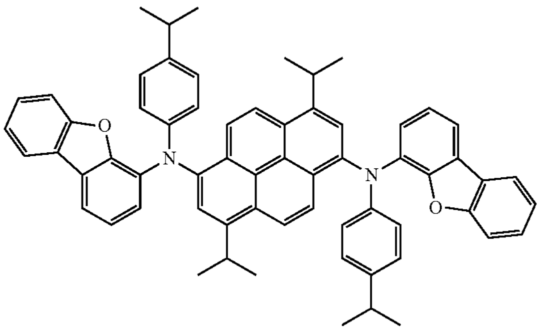
FD23
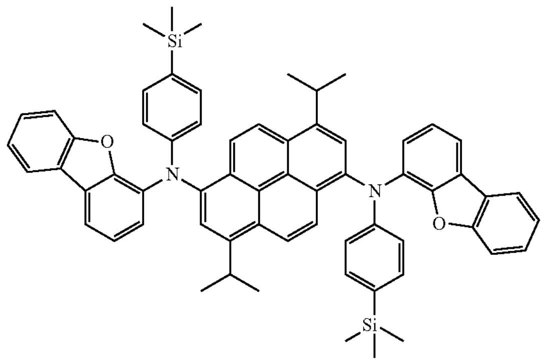
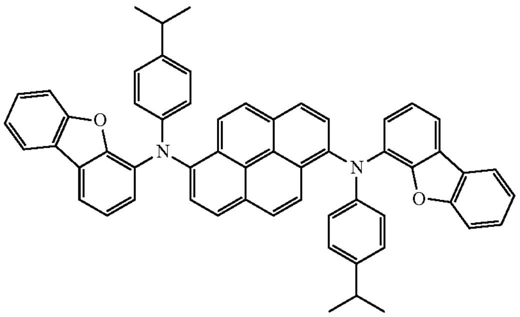
FD25
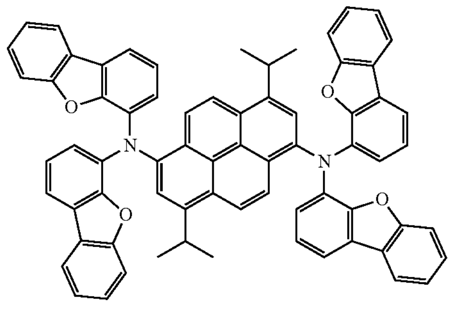

-continued
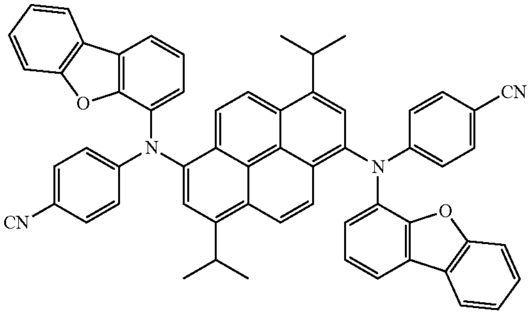
FD28
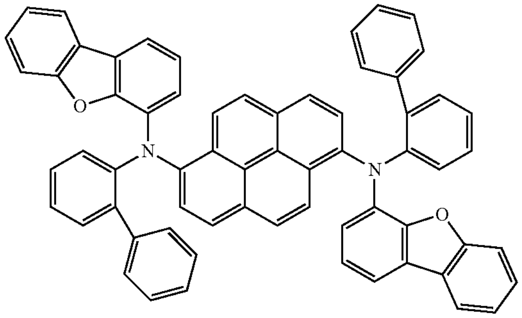
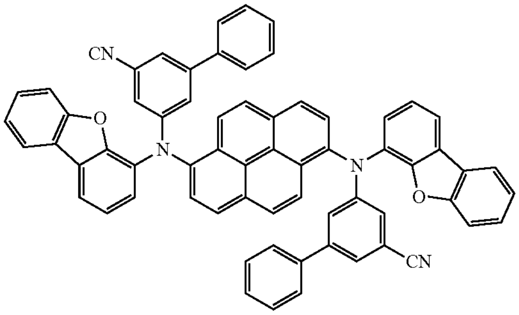
FD30
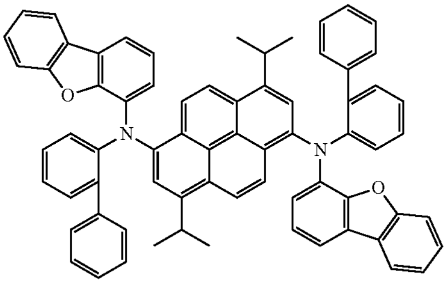
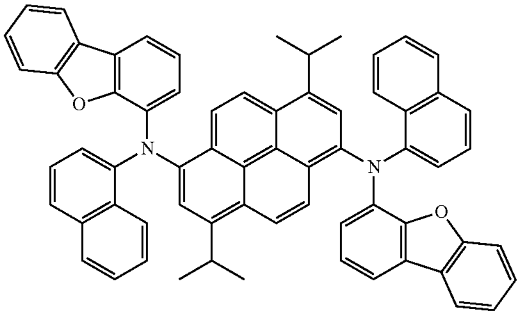
FD31
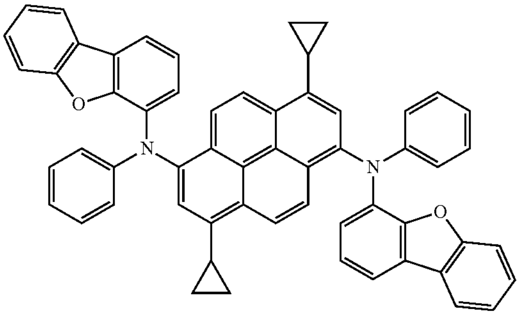
FD33
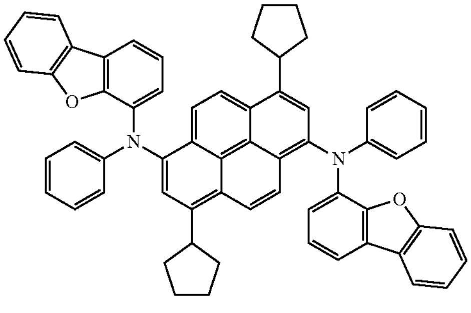
FD34
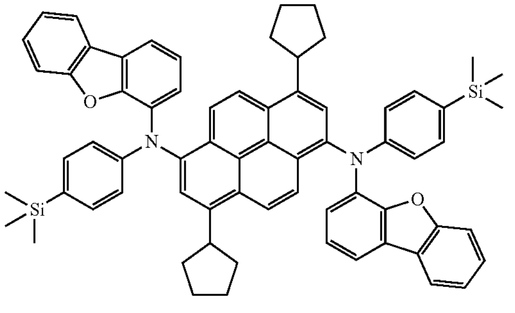
FD35
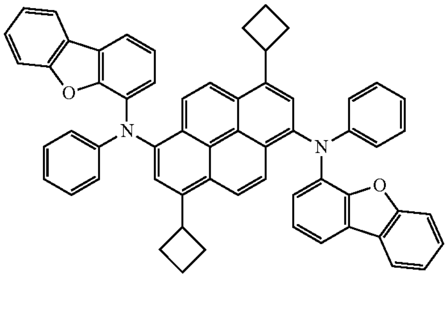
FD36
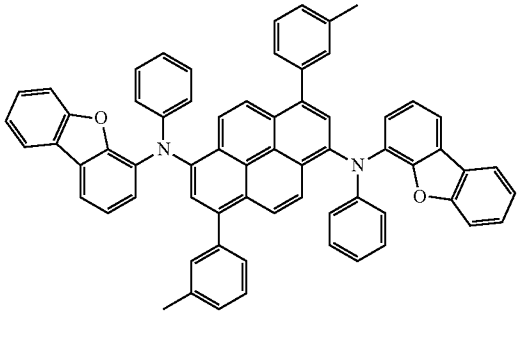

-continued

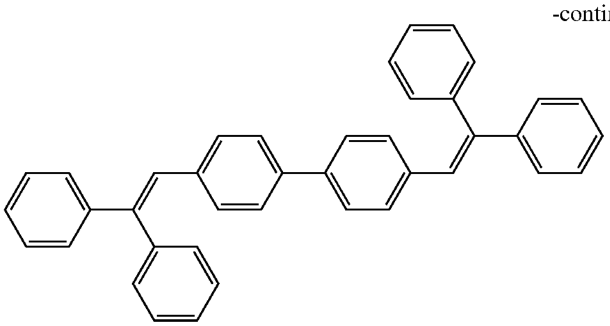

DPVBi

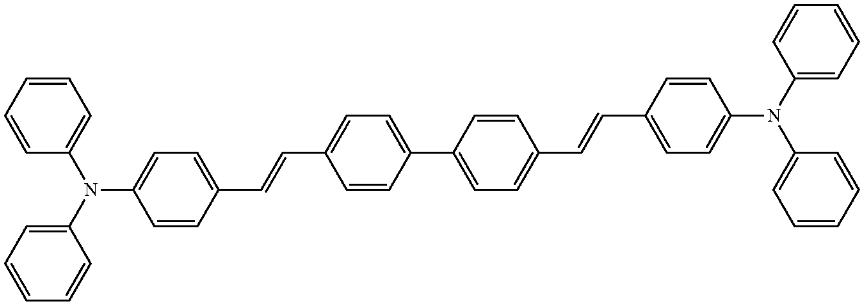

DPAVBi

.

[Delayed Fluorescence Material]

The emission layer may include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the type of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level of the delayed fluorescence material and the singlet energy level of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include i) a material including at least one electron donor (for example, a IT electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following compounds DF1 to DF9:

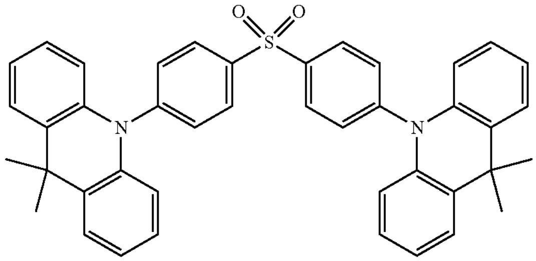

DF1(DMAC-DPS)

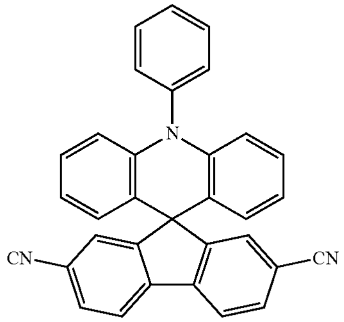

DF(ACRFLCN)

-continued

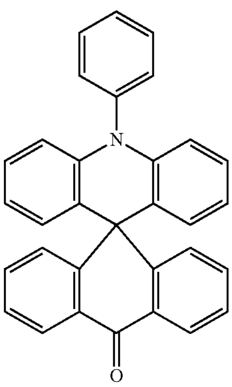

DF3(ACRSA)

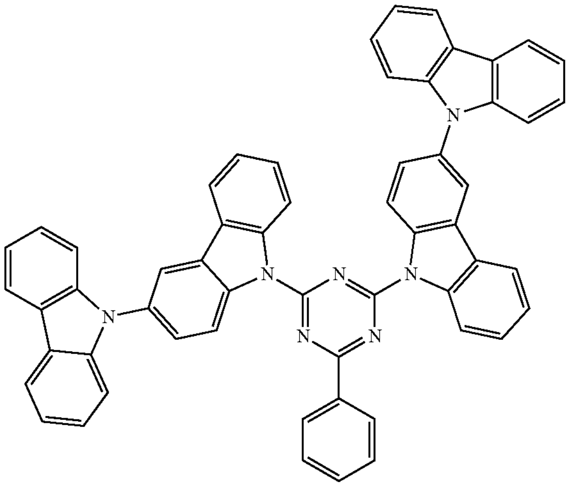

DF4(CC2TA)

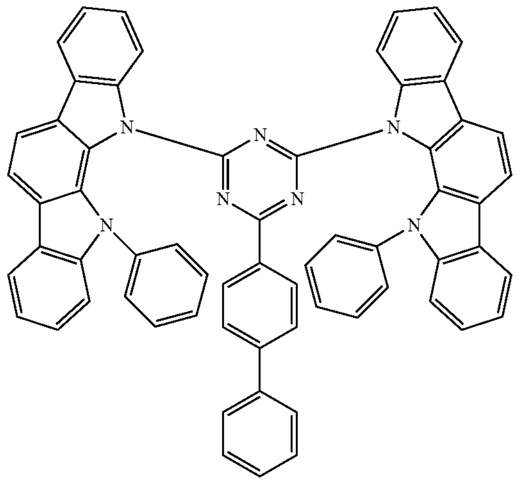

DF5(PIC-TRZ)

-continued

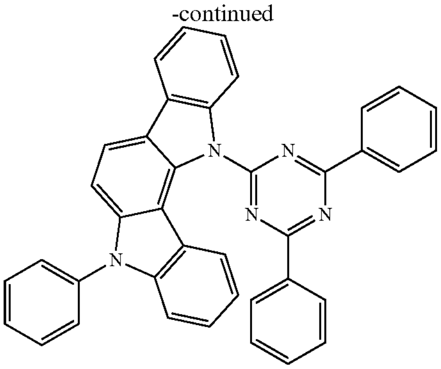

DF6(PIC-TRZ2)

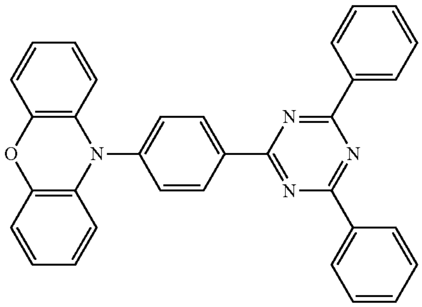

DF7(PXZ-TRZ)

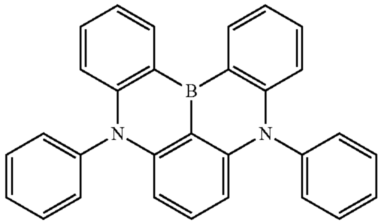

DF8(DABNA-1)

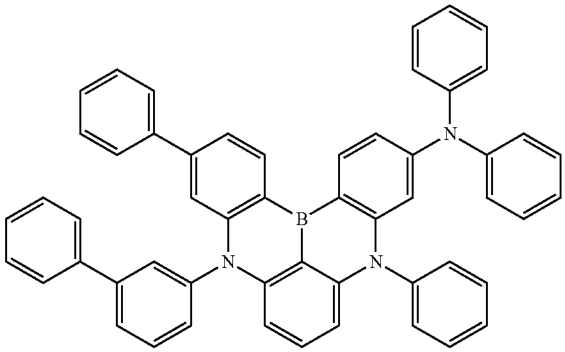.

DF9(DABNA-2)

[Quantum Dot]

The emission layer may include a quantum dot.

The term "quantum dots" as used herein refers to crystals of a semiconductor compound, and may include any material capable of emitting light of various emission wavelengths according to the size of the crystals.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs lower, and is easier than vapor deposition methods, such as metal organic chemical vapor deposition (MOCVD) or molecular beam epitaxy (MBE).

The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or a combination thereof.

Examples of the Group II-VI semiconductor compound are a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or a combination thereof.

Examples of the Group III-V semiconductor compound are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or a combination thereof. Meanwhile, the Group III-V semiconductor compound may further include a Group II element. Examples of the Group III-V semiconductor compound further including a Group II element are InZnP, InGaZnP, InAlZnP, etc.

Examples of the Group III-VI semiconductor compound are: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and a combination thereof.

Examples of the Group I-III-VI semiconductor compound are: a ternary compound, such as AgInS, $AgInS_2$, CuInS, $CuInS_2$, $CuGaO_2$, $AgGaO_2$, or $AgAlO_2$; or a combination thereof.

Examples of the Group IV-VI semiconductor compound are: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or a combination thereof.

The Group IV element or compound may include: a single element, such as Si or Ge; a binary compound, such as SiC or SiGe; or a combination thereof.

Each element included in a multi-element compound such as the binary compound, the ternary compound, and the quaternary compound may be present at a uniform concentration or non-uniform concentration in a particle.

Meanwhile, the quantum dot may have a single structure in which the concentration of each element in the quantum dot is uniform, or a core-shell dual structure. For example, the material included in the core and the material included in the shell may be different from each other.

The shell of the quantum dot may act as a protective layer that prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may be an oxide of metal, metalloid, or non-metal, a semiconductor compound, and a combination thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and a combination thereof. Examples of the semiconductor compound are, as described herein, a Group II-VI semiconductor compound; a Group III-V semiconductor compound; a Group III-VI semiconductor compound; a Group I-III-VI semiconductor compound; a Group IV-VI semiconductor compound; and a combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In addition, since light emitted through the quantum dot is emitted in all directions, the wide viewing angle may be improved.

In addition, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from the quantum dot emission layer. Accordingly, by using quantum dot of different sizes, a light-emitting device that emits light of various wavelengths may be implemented. In one or more embodiments, the size of the quantum dot may be selected to emit red, green and/or blue light. In addition, the size of the quantum dot may be configured to emit white light by combination of light of various colors.

[Electronic Device]

An electronic device including the organic photodiode and the organic light-emitting device may be provided.

The electronic device according to an embodiment including, side by side, an organic photodiode and an organic light-emitting device, may include;

a substrate;

a first electrode on the substrate;

a second electrode facing the first electrode;

an emission layer arranged between the first electrode and the second electrode and in the organic light-emitting device;

a photoactive layer arranged between the first electrode and the second electrode and in the organic photodiode;

a hole transport region commonly arranged between the first electrode and the emission layer and between the first electrode and the photoactive layer;

an electron transport region commonly arranged between the emission layer and the second electrode and between the photoactive layer and the second electrode; and an optical auxiliary electrode arranged between the first electrode and the hole transport region and in the organic photodiode, wherein the optical auxiliary electrode may include a transparent conductive metal oxide.

The organic photodiode may detect light emitted from the organic light-emitting device and reflected from a subject. The organic light-emitting device may include at least one subpixel.

In an embodiment, the organic light-emitting device may include a first subpixel, and the organic photodiode may detect light emitted from the first subpixel of the organic light-emitting device and reflected from a subject.

In an embodiment, the organic light-emitting device may include a plurality of subpixels. The organic light-emitting device may include, for example, two to five subpixels. The organic light-emitting device may include, for example, a first subpixel, a second subpixel, and a third subpixel, and the organic photodiode may detect light emitted from the first subpixel of the organic light-emitting device and reflected from a subject.

In an embodiment, the subpixels of the organic light-emitting device may further include an optical auxiliary layer arranged between the hole transport region and the emission layer. That is, to adjust the optical distance for microresonance, the organic photodiode may use the optical auxiliary electrode on the first electrode, and the organic light-emitting device may use the optical auxiliary layer on the hole transport region. The optical auxiliary layer may consist of an organic material.

In one or more embodiments, at least one of the subpixels may include an optical auxiliary electrode between the first electrode and the hole transport region instead of the optical auxiliary layer.

In an embodiment, an optical auxiliary electrode is arranged in the first subpixel among the organic light-emitting device including the plurality of subpixels, and the optical auxiliary layer may be arranged in some of or all of the subpixels excluding the first subpixel. That is, the first subpixel of the organic photodiode and the organic light-emitting device may use an optical auxiliary electrode, and some or all of the other subpixels of the organic light-emitting device may use an optical auxiliary layer. In this case, the organic photodiode has a thickness identical to that of the optical auxiliary electrode of the first subpixel. In an embodiment, at least one of the subpixels excluding the first subpixel may not include an optical auxiliary layer.

In one or more embodiments, the optical auxiliary electrode may be arranged in every subpixel of the organic light-emitting device. That is, the organic photodiode and the organic light-emitting device may both use the optical auxiliary electrode.

The thickness of the optical auxiliary electrode in the organic light-emitting device may be proportional to the wavelength of light emitted from the subpixel in which the optical auxiliary electrode is included. In an embodiment, at least one of the subpixels excluding the first subpixel may not include an optical auxiliary electrode.

When an optical auxiliary layer on the hole transport region is used in the organic photodiode and the organic light-emitting device of the related art, the higher the resolution, that is, the smaller the size of the device, the harder it may be for the auxiliary layer to be patterned into layers for an organic photodiode and an organic light-emitting device. Therefore, the optical auxiliary layers of the organic photodiode and the neighboring subpixel of the organic light-emitting device may be connected to each other, resulting in a lateral current leakage by the optical auxiliary layer. On the other hand, according to the present embodiment, because the optical auxiliary electrode of the organic photodiode and the optical auxiliary layer of the organic light-emitting device are formed in different layers, there may be more margin for patterning, and the lateral current leakage by the optical auxiliary layer may be reduced.

In addition, by using the optical auxiliary electrode instead of the optical auxiliary layer emission layer consisting of organic materials, the thickness of the organic layer between the first electrode and the second electrode in the organic photodiode may decrease, thereby increasing an extraction field, leading to an increase in external quantum efficiency. Furthermore, when using an organic optical auxiliary layer in the organic photodiode as in the related art, an additional organic deposition chamber is required, but when using the optical auxiliary electrode according to the present embodiment, an additional deposition chamber is not necessary, and thus, the process may be simplified.

In and embodiment, the first subpixel may be adjacent to the organic photodiode.

The organic photodiode may receive light of the same wavelength as that of light emitted by the first subpixel. In this case, the organic photodiode has a resonance distance identical to that of the first subpixel.

The plurality of subpixels may each independently emit light of the same color or different colors. The plurality of subpixels may each independently emit, for example, red light, green light, or blue light. For example, the organic light-emitting device may include three subpixels, and the subpixels may each independently emit red light, green light, or blue light. The plurality of subpixels may emit light of any color other than red light, green light, and blue light. The plurality of subpixels may each independently emit light of different colors that may generate white light when mixed together. In an embodiment, one of the plurality of subpixels may emit far-infrared light, and the other subpixels may emit light of different colors. One of the plurality of subpixels may emit far-infrared light, and the other subpixels may each independently emit light of different colors that may generate white light when mixed together. For example, the organic light-emitting device may include four subpixels, and the subpixels may each independently emit far-infrared light, red light, green light, or blue light.

The thickness of the optical auxiliary layer in each subpixel may be independent of each other. In this case, the thickness of the optical auxiliary layer may be proportional to the wavelength of light emitted from the subpixel in which the optical auxiliary layer is included.

The organic photodiode and the organic light-emitting device may use the first electrode, the second electrode, the hole transport region and electron transport region, and the capping layer as a common layer. In the disclosure, the hole transport region may be referred to as the first common layer, and the electron transport region may be referred to as the second common layer.

In an embodiment, the first electrode of each subpixel of the organic photodiode and the organic light-emitting device and organic light emitting elements may be patterned and electrically separated from each other.

The organic photodiode and the organic light-emitting device may form a pixel, and the electronic device may include a plurality of the pixels.

The electronic device may be applied to all electronic products using a display panel. The electronic device may be applied to a display apparatus having various functions, for example, a fingerprint sensor, a blood pressure sensor, an oxygen saturation measurement, a touch sensor, a light sensor, a proximity sensor, and the like.

Figure 3:
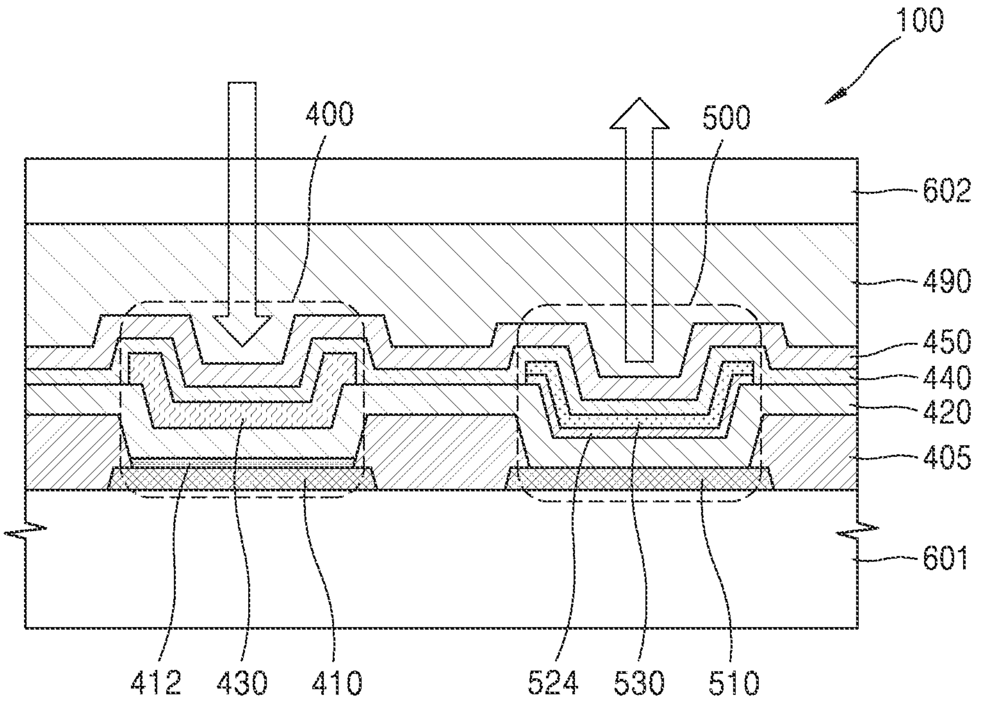
FIG. 3 is a schematic cross-sectional view of an electronic device according to an embodiment.
Figure 4:
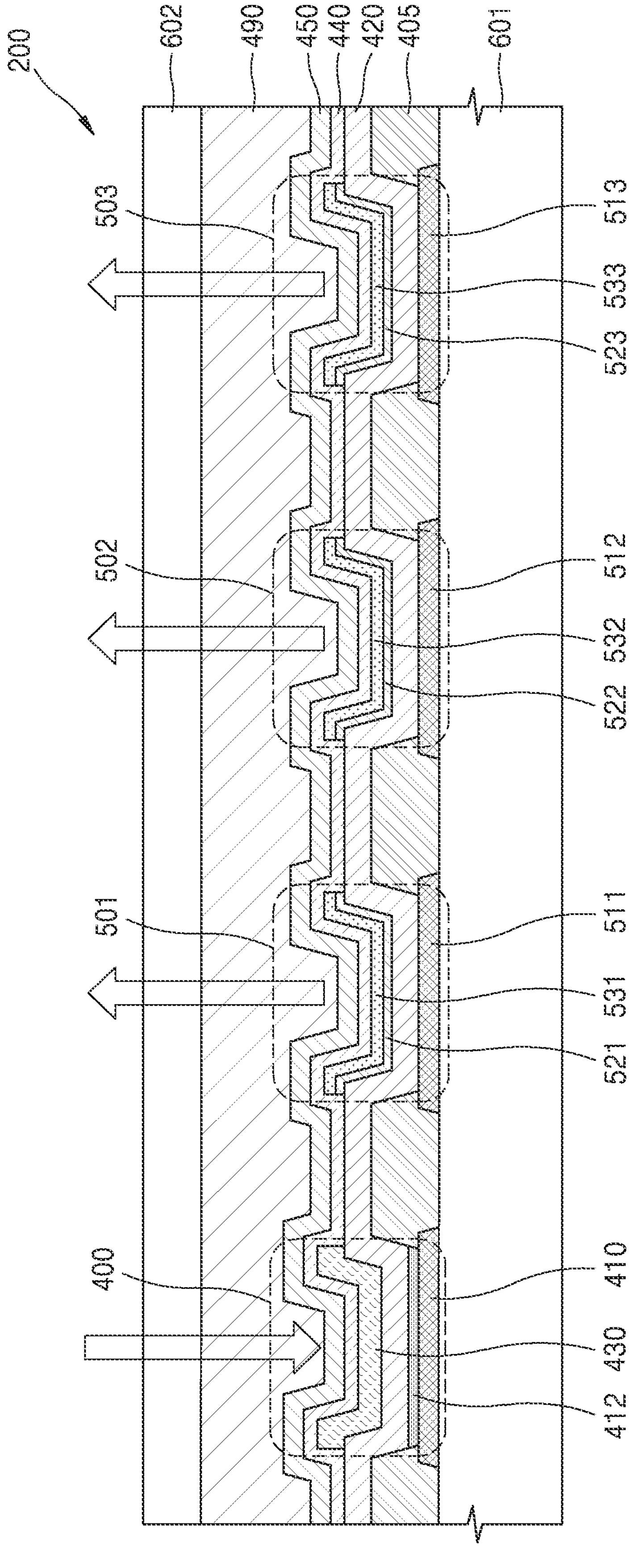
FIG. 4 is a schematic cross-sectional view of an electronic device according to an embodiment.

[Description of FIGS. 3 and 4]

FIG. 3 is a schematic cross-sectional view of an electronic device 100 according to an embodiment.

Referring to FIG. 3, the electronic device 100 includes an organic photodiode 400 and an organic light-emitting device 500 that are arranged between two substrates 601 and 602. The organic photodiode 400 includes a first electrode 410, an optical auxiliary electrode 412, a first common layer 420, a photoactive layer 430, a second common layer 440, and a second electrode 450. The first electrode 410 of the organic photodiode 400 may herein be referred to as "a first photodiode electrode." The organic light-emitting device 500 includes a first electrode 510, a first common layer 420, a first auxiliary layer 524, an emission layer 530, a second common layer 440, and a second electrode 450. The first electrode 510 of the light-emitting device 500 may herein be referred to as "a first subpixel electrode." As shown in FIG. 3, the first common layer 420, the second common layer 440, and the second electrode 450 may be shared between the photodiode 400 and the light-emitting device 500. The first common layer 420, the second common layer 440, and the second electrode 450 may be formed continuously over the first photodiode electrode 410 and the first subpixel electrode 510.

The substrates 601 and 602 may each independently be a flexible substrate, a glass substrate, or a metal substrate. A buffer layer (not shown) and a thin-film transistor (not shown) may be arranged on the substrate 601.

The buffer layer serves to prevent infiltration of impurities through the substrate 601 and provide a flat surface on the substrate 601. The thin-film transistor is arranged on the buffer layer, and may include an activation layer, a gate electrode, a source electrode, and a drain electrode.

In an embodiment, the thin-film transistor may be electrically connected to the organic light-emitting device 500 to drive the same. One of the source electrode and the drain electrode may be electrically connected to the first electrode 510 of the organic light-emitting device 500.

In one or more embodiments, the thin-film transistor may be electrically connected to the organic photodiode 400. One of the second electrode and the drain electrode may be electrically connected to the first electrode 410 of the organic photodiode 400.

In an embodiment, the first electrode 410 may be an anode, and the second electrode 450 may be a cathode. That is, by applying a reverse bias between the first electrode 410 and the second electrode 450 to drive the organic photodiode 400, the electronic device 100 may detect light incident on the organic photodiode 400, generate charges, and extract a current.

In an embodiment, the first electrode 510 may be an anode, and the second electrode 450 may be a cathode. That is, in the organic light-emitting device 500, holes injected to the first electrode 510 and electrons injected to the second electrode 450 recombine in the emission layer 530 to form excitons, and the excitons may transition from an excited state to a ground state, thereby generating light.

The first electrodes 410 and 510 are separated from each other and patterned, and are electrically separated, and thus, the organic photodiode 400 and the organic light-emitting device 500 may form independent subpixels. Descriptions of the first electrodes 410 and 510 be as described for the anode 110 provided herein.

A pixel defining layer 405 may be formed at edges of the first electrodes 410 and 510. The pixel defining layer 405 defines a pixel region, and may electrically separate the first electrodes 410 and 510 from each other. The pixel define layer 405 may include, for example, known various organic insulating material (for example, silicone-based materials, and the like), inorganic insulating materials, or organic/inorganic composite insulating materials. The pixel define layer 405 may be a transmissive film that transmits visible light, or a blocking film that blocks visible light.

The optical auxiliary electrode 412 is a layer for adjusting the optical distance for microresonance of the organic photodiode 400. The optical auxiliary electrode 412 may be as previously described herein.

The first common layer 420 and the second common layer 440 may be arranged as common layers over both the organic photodiode 400 and the organic light-emitting device 500. The first common layer 420 may include, for example, a hole injection layer, a hole transport layer, an electron blocking layer, or a combination thereof. The second common layer 440 may include, for example, a buffer layer, a hole blocking layer, an electron transport layer, an electron injection layer, or a combination thereof. The first common layer 420 and the second common layer 440 may each be defined as described herein.

As such, since the electronic device 100 uses common layers over the organic photodiode 400 and the organic light-emitting device 500, the two devices may be arranged in-pixel in the electronic device 100. In this regard, a manufacturing process of the electronic device 100 may be also simplified.

In the organic light-emitting device 500, the optical auxiliary layer 524 is arranged on the first common layer 420. The optical auxiliary layer 524 may adjust the optical distance for the microresonance of the organic light-emitting device 500. The optical auxiliary layer 524 may be as previously described herein.

In the organic photodiode 400, the photoactive layer 430 is arranged on the first common layer 420. In the organic light-emitting device 500, the emission layer 530 is formed on the optical auxiliary layer 524. The emission layer 530 may be formed by using one or more known light-emitting materials. For example, as the light-emitting material, an organic material, an inorganic material, or a quantum dot may be used. The photoactive layer 430 may be understood by referring to the descriptions provided herein, and the emission layer 530 may be understood by referring to the descriptions below.

The second common layer 440 and the second electrode 450 may be formed as common layers on the photoactive layer 430 and the emission layer 530 throughout the organic photodiode 400 and the organic light-emitting device 500. The second electrode 450 may be as described for the cathode 150 provided herein.

A capping layer (not shown) may be arranged on the second electrode 450. A material that can be used for the capping layer may include an organic material and/or inorganic material as described above. The capping layer may serve not only to protect the organic photodiode 400 and the organic light-emitting device 500, but also to help light generated from the organic light-emitting device 500 emitted efficiently. A description of the capping layer (not shown) may refer to that of the capping layer provided in the specification.

An encapsulation portion 490 may be arranged on the capping layer. The encapsulation portion 490 may be arranged on the organic photodiode 400 and the organic light-emitting device 500, and thus may serve to protect the organic photodiode 400 and the organic light-emitting device 500 from moisture or oxygen. The encapsulation portion 490 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

The electronic apparatus 100 may be, for example, a display apparatus. Since the electronic device 100 includes both the organic photodiode 400 and the organic light-emitting device 500, the electronic apparatus 100 may be a display apparatus that exhibits a function of light detection.

FIG. 4 is a schematic cross-sectional view of an electronic device 200 according to an embodiment.

Referring to FIG. 4, the electronic device 200 includes the organic photodiode 400 and the organic light-emitting devices 501, 502, and 503 that are arranged between the two substrates 601 and 602. The electronic device 200 of FIG. 4 is different from the electronic device 100 including one organic light-emitting device in that the electronic device 200 includes a plurality of organic light-emitting devices. The organic light-emitting devices 501, 502, and 503 may each be used to implement full color. Components illustrated in FIG. 3 may be understood by referring to the descriptions of the electronic device 100.

The organic photodiode 400 includes a first electrode 410, an optical auxiliary electrode 412, a first common layer 420, a first auxiliary layer 427, a photoactive layer 430, a second common layer 440, and a second electrode 450.

The first organic light-emitting device 501 includes a first electrode 511, the first common layer 420, a first auxiliary layer 521, a first emission layer 531, the second common layer 440, and the second electrode 450.

The second organic light-emitting device 502 includes a first electrode 512, the first common layer 420, a second auxiliary layer 522, a second emission layer 532, the second common layer 440, and the second electrode 450.

The third organic light-emitting device 503 includes a first electrode 513, the first common layer 420, a third auxiliary layer 523, a third emission layer 533, the second common layer 440, and the second electrode 450.

The organic photodiode 400 may be electrically connected to the thin-film transistor to drive the organic photodiode 400. The first electrode 410 of the organic photodiode 400 may be electrically connected to one of a source electrode and a drain electrode of the thin-film transistor.

Each of the organic light-emitting devices 501, 502, and 503 may be electrically connected to different thin-film transistors to drive the organic light-emitting devices 501, 502, and 503. Each of the first electrodes 511, 512, and 513 in the organic light-emitting devices 501, 502, and 503 may be electrically connected to one of a source electrode and a drain electrode of different thin-film transistors.

In an embodiment, the first electrodes 511, 512, and 513 may each be an anode, and the second electrode 450 may be a cathode. That is, in the organic light-emitting devices 501, 502, and 503, holes injected to the first electrodes 511, 512, and 513 and electrons injected to the second electrode 450 may recombine in the emission layers 531, 532, and 533 to form excitons, and the excitons may transition from an excited state to a ground state, thereby generating light.

Descriptions of the first electrodes 410, 511, 512, and 513 may be understood by referring to the descriptions of the anode 110.

The optical auxiliary electrode 412 is a layer for adjusting the optical distance for microresonance of the organic photodiode 400. The optical auxiliary electrode 412 may be as previously described herein.

The pixel defining layer 405 is formed at the edge of the first electrodes 410, 511, 512, and 513. The pixel defining layer 405 defines a pixel region, and may electrically separate the first electrodes 410, 511, 512, and 513 from each other. The pixel define layer 405 may include, for example, known various organic insulating material (for example, silicone-based materials, and the like), inorganic insulating materials, or organic/inorganic composite insulating materials. The pixel define layer 405 may be a transmissive film that transmits visible light, or a blocking film that blocks visible light.

The first common layer 420 and the second common layer 440 may be arranged as common layers over the organic photodiode 400 and the first organic light-emitting device 501, the second organic light-emitting device 502, and the third organic light-emitting device 503. The first common layer 420 may include, for example, a hole injection layer, a hole transport layer, an electron blocking layer, or a combination thereof. The second common layer 440 may include, for example, a buffer layer, a hole blocking layer, an electron transport layer, an electron injection layer, or a combination thereof.

On the first common layer 420, the optical auxiliary layers 521 and 522 are formed to correspond to the organic light-emitting devices 501 and 502, respectively. The optical auxiliary layers 521 and 522 may be understood by referring to the descriptions of the optical auxiliary layer.

On the first common layer 420, the photoactive layer 430 is formed to correspond to the organic photodiode 400.

On the first common layer 420, the emission layers 531, 532, and 533 are formed to correspond to the organic light-emitting devices 501, 502, and 503, respectively.

The first emission layer 531 may emit first-color light, the second emission layer 532 may emit second-color light, and the third emission layer 533 may emit third-color light.

A maximum emission wavelength of the first color light, a maximum emission wavelength of the second color light, and a maximum emission wavelength of the third color light may be identical to or different from each other. For example, each of the maximum emission wavelength of the first-color light and the maximum emission wavelength of the second-color light may be longer than the maximum emission wavelength of the third-color light.

In an embodiment, the first color light may be red light, the second color light may be green light, and the third color light may be blue light, but embodiments of the disclosure are not limited thereto. Therefore, the electronic device 100 may emit full color light. The first color light, the second color light, and the third color light are not limited to red light, green light, and blue light, respectively, and may be a combination of light of different colors, as long as mixed light thereof is white light.

The first emission layer 531, the second emission layer 532, and the third emission layer 533 may each be formed by using various luminescent materials known in the art. For example, as the light-emitting material, an organic material, an inorganic material, or a quantum dot may be used.

The organic photodiode 400, the first organic light-emitting device 501, the second organic light-emitting device 502, and the third organic light-emitting device 503 may all form a pixel, and may each be a sub-pixel constituting the pixel.

In an embodiment, the pixel may include at least one organic photodiode 400.

The second common layer 440 and the second electrode 450 may be sequentially formed over the photoactive layer 430 and the emission layers 531, 532, and 533.

A capping layer (not shown) may be arranged on the second electrode 450.

An encapsulation portion 490 may be arranged on the capping layer. The encapsulation portion 490 may be arranged on the organic photodiode 400 and the organic light-emitting devices 501, 502, and 503, and thus may serve to protect the organic photodiode 400 and the organic light-emitting devices 501, 502, and 503 from moisture or oxygen. The encapsulation portion 490 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

The electronic device 200 may be a display apparatus. Since the electronic device 200 includes the organic photodiode 400 and the first organic light-emitting device 501, the second organic light-emitting device 502, and the third organic light-emitting device 503, the electronic device 200 may be a full-color display apparatus that exhibits a function of light detection.

Figure 5:
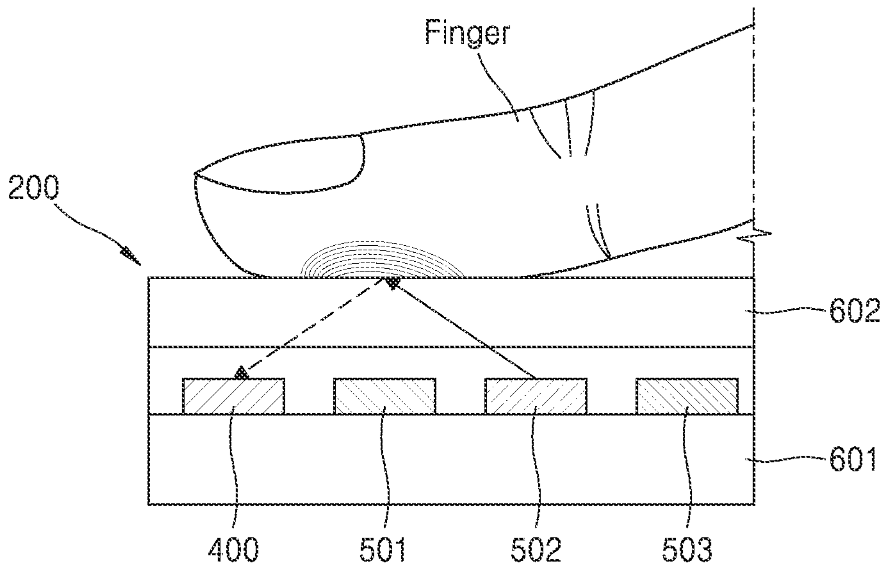
FIG. 5 is a view of an electronic device according to an embodiment.
Figure 6:
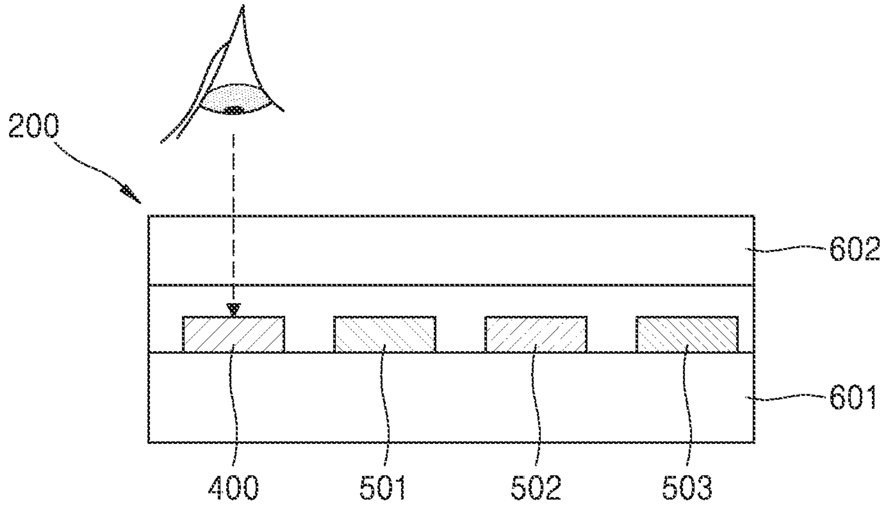
FIG. 6 is a view of an electronic device according to an embodiment.

[Descriptions of FIGS. 5 and 6]

FIG. 5 is a view of the electronic device 200 according to an embodiment.

The electronic device 200 of FIG. 5 includes the organic photodiode 400 and the organic light-emitting devices 501, 502, and 503 that are arranged between the two substrates 601 and 602.

For example, red light, green light, and blue light may be emitted from the organic light-emitting devices 501, 502, and 503, respectively.

The electronic device 200 according to an embodiment may have a function of detecting prints of an object, e.g., a finger that is in contact with the electronic device. For example, as illustrated in FIG. 5, at least a part of reflective light reflected from the fingerprint of a user among light emitted from the organic light-emitting device 502 may be incident on the organic photodiode 400, and accordingly, the organic photodiode 400 may detect the reflected light. Since ridges of the fingerprint pattern are in close contact to the substrate 602, the organic photodiode 400 may be able to selectively acquire a fingerprint pattern of a user, for example, image information of the ridges. FIG. 5 shows an example of acquiring information of an object that is in contact with the electronic device 200 by using light emitted from the organic light-emitting device 502, but information may be acquired in the same manner by using light emitted from the organic light-emitting device 501 and/or 503.

FIG. 6 is a view of the electronic device 200 according to an embodiment.

As shown in FIG. 6, the electronic device 200 according to an embodiment may be able to detect an object that is not in contact with the electronic device 200.

[Manufacturing Method]

The layers included in the hole transport region, the activation layer, and the layers included in the electron transport region may be formed in certain regions by using one or more suitable methods selected from vacuum deposition, spin coating, casting, Langmuir-Blodgett (LB) deposition, ink-jet printing, laser-printing, and laser-induced thermal imaging (LITI).

When the layers of the hole transport region, the activation layer, and the layers of the electron transport region are formed by vacuum deposition, deposition conditions may be selected from within a deposition temperature of about 100° C. to about 500° C., a vacuum degree of about $10^{-8}$ torr to about $10^{-3}$ torr, and a deposition rate of about 0.01 Å/sec to about 100 Å/sec, in consideration of the material and structure of a layer to be formed.

Definition of Terms

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "π electron-deficient nitrogen-containing $C_1$-$C_{60}$ cyclic group" as used herein refers to a heterocyclic group that has one to sixty carbon atoms and includes *—N═*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, etc.) according to the structure of a formula for which the corresponding term is used. In an embodiment, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and specific examples are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and specific examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein indicates —$OA_{102}$ (wherein $A_{102}$ is a $C_6$-$C_{60}$ aryl group), and the term "$C_6$-$C_{60}$ arylthio group" as used herein indicates —$SA_{103}$ (wherein $A_{103}$ is a $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom are O, S, N, P, Si, B, Ge, Se, and a combination thereof.

The term "third-row transition metal" used herein includes hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

The expression "* and *'" as used herein, unless defined otherwise, each refer to a binding site to a neighboring atom in a corresponding formula or moiety.

Hereinafter, the manufacture of electronic devices according to embodiments of the disclosure and evaluation results thereof will be described with reference to examples.

Example 1

A display element including, side by side, an organic photodiode and a green organic light-emitting device was manufactured.

An IZO optical auxiliary electrode having a thickness of 300 Å was formed in an organic photodiode region on an anode substrate of ITO 100 Å/Ag 1,000 Å/ITO 100 Å, the substrate having an anode pattern formed thereon, by sputtering. The substrate on which the optical auxiliary electrode is formed was cleaned with alcohol and pure water each for 10 minutes, and then cleaned by exposure to ultraviolet rays and ozone for 10 minutes.

HAT-CN was vacuum-deposited on the substrate on which the optical auxiliary electrode is formed to form a hole injection layer having a thickness of 100 Å, and HT3 was vacuum-deposited on the hole injection layer to form a hole transport layer having a thickness of 1,200 Å.

Compound OC1 was deposited on the hole transport layer of the organic light-emitting device region to form an optical auxiliary layer having a thickness of 350 Å.

SubPc was deposited on the hole transport layer of the organic photodiode region to form a layer having a thickness of 80 Å, and $C_{60}$ was deposited on the layer at a thickness of 340 Å, thereby forming a photoactive layer having a thickness of 420 Å.

Compounds H36, H39, and PD41 were co-deposited on the hole transport layer of the organic light-emitting device region at a weight ratio of 45:45:10 to form a green emission layer having a thickness of 380 Å.

Then, BAlq was vacuum-deposited on the photoactive layer and the emission layer to form a hole blocking layer having a thickness of 50 Å, and ET1 was vacuum-deposited on the hole blocking layer to form an electron transport layer having a thickness of 310 Å.

15 Å of Liq was formed on the electron transport layer to form an electron injection layer, and 85 Å of MgAg was deposited on the electron injection layer to form a cathode. Compound OC1 was deposited on the cathode to form a capping layer having a thickness of 850 Å, thereby completing the manufacture of an electronic device including, side by side, an organic photodiode and a green organic light-emitting device.

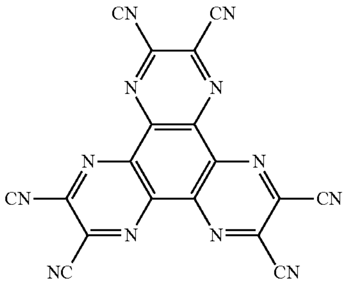

HAT-CN

HT3

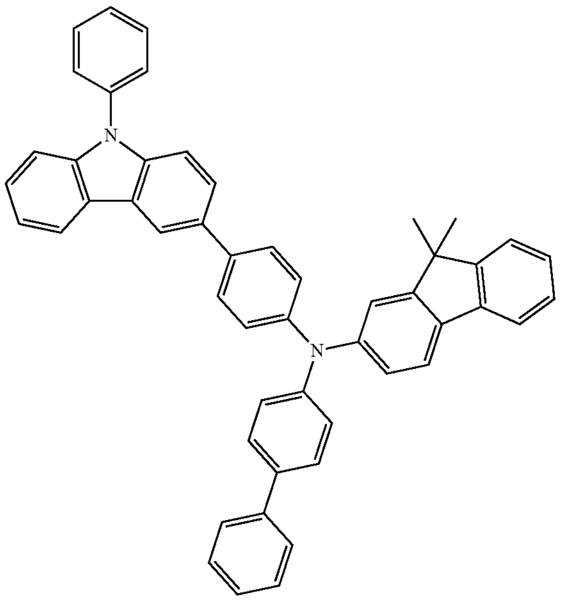

-continued

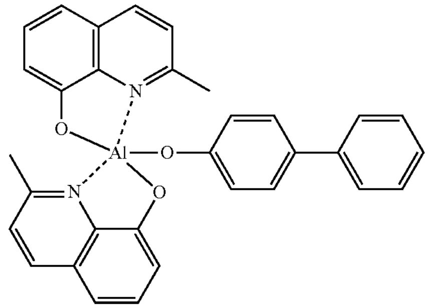

BAlq

ET1

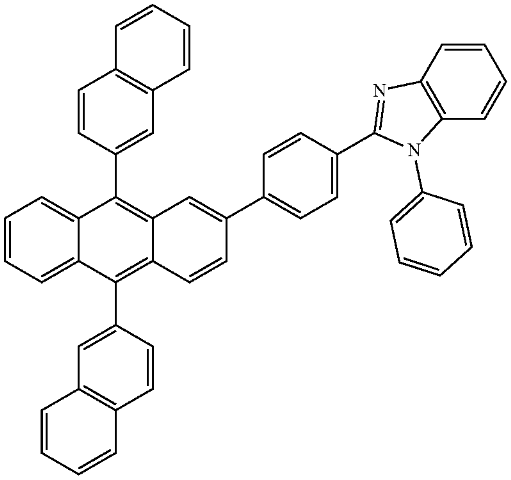

OC1

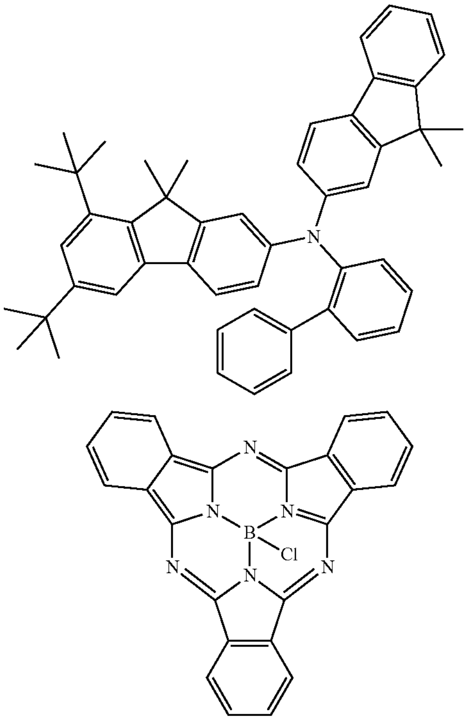

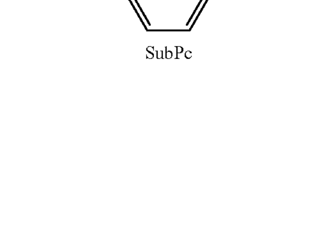

SubPc

-continued

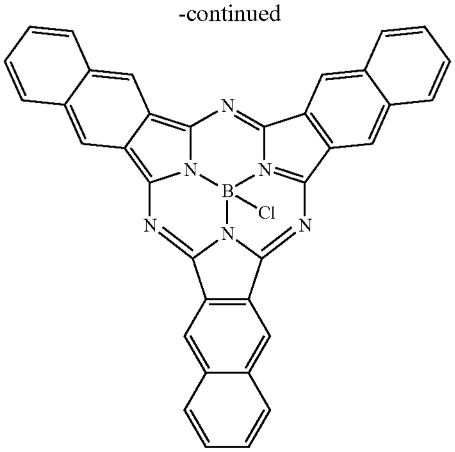

SubPc

H36

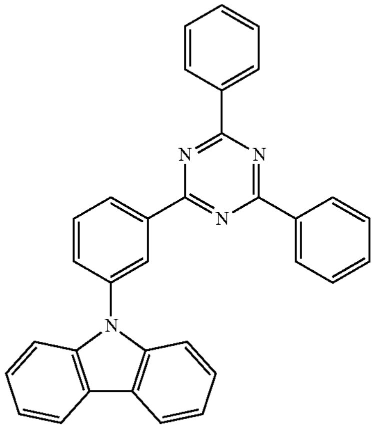

H39

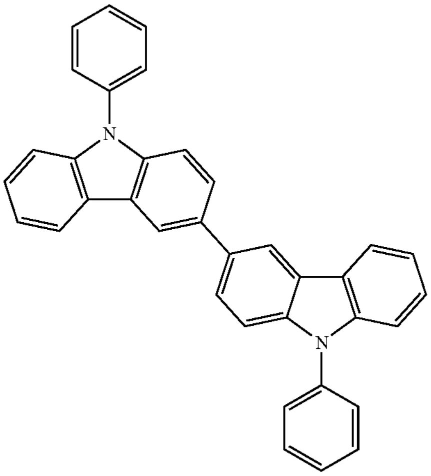

-continued

PD41

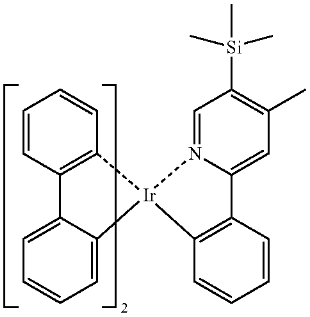

H127

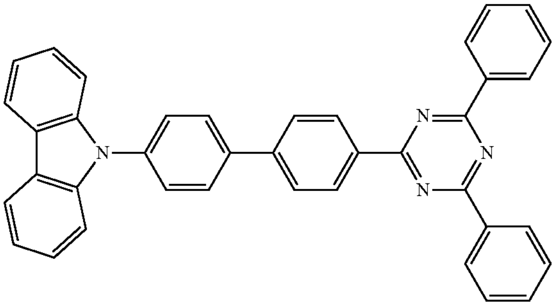

PD11

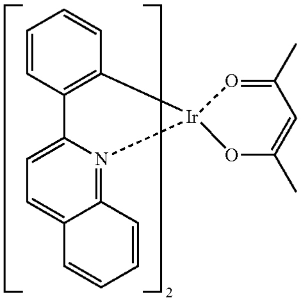

Example 2

A device was manufactured in the same manner as in Example 1 except that an optical auxiliary electrode was formed at a thickness of 300 Å in each of the organic photodiode region and the organic light-emitting device region, and an optical auxiliary layer was not formed on the hole transport layer of the organic light-emitting device region.

Example 3

A device was manufactured in the same manner as in Example 1 except that an optical auxiliary electrode of the organic photodiode having a thickness of 750 Å was formed, an optical auxiliary layer in the organic light-emitting device region having a thickness of 750 Å was formed, an emission layer in the organic light-emitting device region was formed as a red emission layer having a thickness of 420 Å by co-depositing Compounds H127 and PD11 at a weight ratio of 100:2, and SubNc was used instead of SubPc in the photoactive layer in the organic photodiode region.

Example 4

A device was manufactured in the same manner as in Example 3 except that an optical auxiliary electrode was formed at a thickness of 750 Å in each of the organic photodiode region and the organic light-emitting device region, and an optical auxiliary layer was not formed on the hole transport layer of the organic light-emitting device region.

Comparative Example 1

A device was manufactured in the same manner as in Example 1 except that an optical auxiliary electrode was not formed in the organic photodiode region, and an optical auxiliary layer having a thickness of 350 Å was formed in each of the organic photodiode region and the organic light-emitting device region.

Comparative Example 2

A device was manufactured in the same manner as in Example 3 except that an optical auxiliary electrode was not formed in the organic photodiode region, and an optical auxiliary layer having a thickness of 750 Å was formed in each of the organic photodiode region and the organic light-emitting device region.

Evaluation Example

The EQE, dark current density, and lateral current leakage of the devices manufactured according to Examples 1 to 4 and Comparative Examples 1 and 2 were measured by using an external quantum efficiency measurement device (K3100, MacScience, Korea) and a current meter (Keithley, Tektronix, U.S.A.), and the results thereof are shown in Table 1.

TABLE 1

| | Examples | EQE (%) | $J_{dark}$ (mA/cm$^2$) | Lateral current leakage (mA) | Number of organic chamber |
|---|---|---|---|---|---|
| Example 1 | OPD: optical auxiliary electrode green OLED: optical auxiliary layer | 24 | 1.5E−6 | 1.5E−8 | 7 |
| Example 2 | OPD, green OLED: optical auxiliary electrode | 22 | 2.4E−6 | 1.8E−8 | 6 |
| Example 3 | OPD: optical auxiliary electrode | 16 | 1.3E−6 | 1.0E−8 | 7 |
| Example 4 | OPD, red OLED: optical auxiliary electrode | 18 | 2.1E−6 | 1.8E−8 | 6 |
| Comparative Example 1 | OPD, green OLED: optical auxiliary layer | 18 | 5.5E−6 | 2.5E−8 | 7 |
| Comparative Example 2 | OPD, red OLED: optical auxiliary layer | 13 | 4.8E−6 | 2.2E−8 | 7 |

Referring to Table 1, the EQE of Examples 1 and 2 were found to be higher than that of Comparative Example 1, the lateral current leakage of Examples 1 and 2 was found to be lower than that of Comparative Example 1, and the dark current density of Example 1 was found to be lower those of Comparative Examples 1 and 2. These values would make Examples 1 and 2 more desirable than Comparative Examples 1 and 2.

In addition, the EQE of Examples 3 and 4 were found to be higher than that of Comparative Example 2, the lateral current leakage of Examples 3 and 4 was found to be lower than that of Comparative Example 2, and the current densities of Examples 3 and 4 were found to be lower than that of Comparative Example 2. These values would make Examples 3 and 4 more desirable than Comparative Example 2.

In the electronic device according to the one or more embodiments, because the optical auxiliary electrode is additionally formed on the anode instead of using an organic optical auxiliary layer to adjust the optical distance for microresonance in the organic photodiode, formation of the organic optical auxiliary layer at a high resolution may be easy, the EQE may be improved due to the decrease in the thickness of the organic layer, and the lateral current leakage through the organic optical auxiliary layer between the neighboring organic photodiode and organic light-emitting device may be decreased.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising an organic photodiode and an organic light-emitting device comprising a first subpixel, the electronic device comprising:

a substrate;

a first photodiode electrode configured to operate as an organic photodiode electrode on the substrate;

a first subpixel electrode on the substrate spaced apart from the first photodiode electrode;

a second electrode covering the first photodiode electrode and the first subpixel electrode;

an emission layer between the first subpixel electrode and the second electrode and in the organic light-emitting device;

a photoactive layer between the first photodiode electrode and the second electrode and in the organic photodiode;

a first common layer arranged between the first subpixel electrode and the emission layer and between the first photodiode electrode and the photoactive layer;

a second common layer between the emission layer and the second electrode and between the photoactive layer and the second electrode; and a first optical auxiliary electrode arranged between the first photodiode electrode and the first common layer and in the organic photodiode, wherein the first optical auxiliary electrode comprises a transparent conductive metal oxide.

2. The electronic device of claim 1, wherein the first subpixel of the organic light-emitting device further comprises a first optical auxiliary layer between the first common layer and the emission layer.

3. The electronic device of claim 2, wherein the organic light-emitting device further comprises at least one additional subpixel, and the additional subpixel comprises an additional optical auxiliary layer arranged between the first common layer and the emission layer.

4. The electronic device of claim 3, wherein thicknesses of the first optical auxiliary layer and the additional optical auxiliary layer are proportional to wavelengths of light emitted by a subpixel comprising the first optical auxiliary layer and a subpixel comprising the additional optical auxiliary layer, respectively.

5. The electronic device of claim 4, wherein the additional subpixel comprises a second subpixel, a third subpixel, and a fourth subpixel, and the second subpixel, the third subpixel, and the fourth subpixel each independently emits green light, red light, or blue light.

6. The electronic device of claim 2, wherein the first optical auxiliary layer comprises a hole transporting material.

7. The electronic device of claim 1, wherein the first subpixel of the organic light-emitting device further comprises a second optical auxiliary electrode arranged between the first subpixel electrode and the first common layer.

8. The electronic device of claim 7, wherein the organic light-emitting device further comprises at least one additional subpixel, and the additional subpixel comprises an additional optical auxiliary layer arranged between the first common layer and the emission layer.

9. The electronic device of claim 8, wherein the additional subpixel comprises a second subpixel and a third subpixel, and the second subpixel and the third subpixel each independently emits green light, red light, or blue light.

10. The electronic device of claim 8, wherein thicknesses of the second optical auxiliary layer and the additional optical auxiliary electrode are proportional to wavelengths of light emitted by a subpixel comprising the second optical auxiliary electrode and a subpixel comprising the additional optical auxiliary electrode, respectively, and the first optical auxiliary electrode has a thickness identical to a thickness of the second optical auxiliary electrode.

11. The electronic device of claim 7, wherein the first optical auxiliary electrode has a thickness identical to a thickness of the second optical auxiliary electrode.

12. The electronic device of claim 1, wherein the organic photodiode receives light of same wavelength as a wavelength of light emitted by the first subpixel.

13. The electronic device of claim 1, wherein the first subpixel emits green light, red light, or near-infrared light.

14. The electronic device of claim 1, wherein the optical auxiliary electrode comprises indium tin oxide (ITO), indium zinc oxide (IZO), aluminum zinc oxide (AZO), $In_2O_3$, indium gallium zinc oxide (IGZO), indium tin zinc oxide (ITZO), zinc tin oxide (ZTO), fluorine doped tin oxide (FTO), gallium tin oxide (GTO), gallium doped zinc oxide (GZO), ZnO, TiO, tungsten oxide, molybdenum oxide, or a combination thereof.

15. The electronic device of claim 1, wherein the first optical auxiliary electrode has a thickness in a range of about 250 Å to about 2,000 Å.

16. The electronic device of claim 1, wherein the photoactive layer has a thickness in a range of about 150 Å to about 1,000 Å.

17. The electronic device of claim 1, wherein the emission layer has a thickness in a range of about 300 Å to about 700 Å.

18. The electronic device of claim 1, wherein the organic photodiode has a resonance distance identical to a resonance of the first subpixel.

19. An electronic apparatus comprising an electronic device that includes:

a first photodiode electrode configured to operate as an organic photodiode electrode and a first subpixel electrode on a substrate spaced apart from each other;

a second electrode covering the first photodiode electrode and the first subpixel electrode;

an emission layer between the first subpixel electrode and the second electrode;

a photoactive layer between the first photodiode electrode and the second electrode and in the organic photodiode;

a first common layer arranged between the first subpixel electrode and the emission layer and between the first photodiode electrode and the photoactive layer;

a second common layer between the emission layer and the second electrode and between the photoactive layer and the second electrode; and a first optical auxiliary electrode arranged between the first photodiode electrode and the first common layer and in the organic photodiode, wherein the first optical auxiliary electrode comprises a transparent conductive metal oxide.

20. The electronic apparatus of claim 19, further comprising a thin-film transistor, wherein the thin-film transistor comprises a source electrode and a drain electrode, and the first subpixel electrode of the light-emitting device is electrically connected to at least one of the source electrode and the drain electrode of the thin-film transistor.

* * * * *